United States Patent
Tonami

(10) Patent No.: US 7,123,560 B2
(45) Date of Patent: Oct. 17, 2006

(54) APPARATUS FOR ENABLING PLL TO LOCK ON TO A CORRECT FREQUENCY AND PHASE DURING THE REPRODUCTION OF A CONTINUOUS-WAVE-CORRESPONDING SIGNAL AND REPETITION OF A SPECIFIC PATTERN

(75) Inventor: Junichiro Tonami, Yokohama (JP)

(73) Assignee: Victor Company of Japan, Ltd., Yokohama (JP)

(*) Notice: Subject to any disclaimer, the term of this patent is extended or adjusted under 35 U.S.C. 154(b) by 539 days.

(21) Appl. No.: 10/634,892

(22) Filed: Aug. 6, 2003

(65) Prior Publication Data

US 2004/0027948 A1 Feb. 12, 2004

(30) Foreign Application Priority Data

Aug. 12, 2002 (JP) ............................. 2002-234336

(51) Int. Cl.
*G11B 7/00* (2006.01)
(52) U.S. Cl. ............................. 369/47.35; 369/59.21
(58) Field of Classification Search ............ 369/47.35, 369/59.21
See application file for complete search history.

(56) References Cited

U.S. PATENT DOCUMENTS 6,445,662 B1 * 9/2002 Tonami ................... 369/59.21
6,833,875 B1 * 12/2004 Yang et al. ................ 348/665

* cited by examiner

Primary Examiner—Gautam R. Patel
(74) Attorney, Agent, or Firm—Louis Woo

(57) ABSTRACT

In a PLL circuit, a phase error of a reproduced signal is extracted in either a way based on a zero-cross timing or a way based on a self-running timing. A decision is made as to whether the reproduced signal is in a continuous-wave interval where an inversion period of the reproduced signal remains constant or in a random-wave interval where the inversion period of the reproduced signal varies at random. When the reproduced signal is in a continuous-wave interval, a phase error is extracted on the self-running-timing basis. When the reproduced signal is in a random-wave interval, a phase error is extracted on the zero-cross-timing basis. A continuous-wave interval may be replaced by a specified-pattern repetition interval where the inversion period of the reproduced signal changes in accordance with a repetition of a specified pattern.

7 Claims, 34 Drawing Sheets

FIG. 2

HEADER FIELD LAYER

| HEADER 1 FIELD | | | | | HEADER 2 FIELD | | | | |
|---|---|---|---|---|---|---|---|---|---|
| VFO1 | AM | PID1 | ID1 | PA1 | VFO2 | AM | PID2 | ID2 | PA2 |
| 36 | 3 | 4 | 2 | 1 | 8 | 3 | 4 | 2 | 1 |

| HEADER 3 FIELD | | | | | HEADER 4 FIELD | | | | |
|---|---|---|---|---|---|---|---|---|---|
| VFO1 | AM | PID3 | ID3 | PA1 | VFO2 | AM | PID4 | ID4 | PA2 |
| 36 | 3 | 4 | 2 | 1 | 8 | 3 | 4 | 2 | 1 |

S1: PHASE ERROR EXTRACTION BASED ON ZERO-CROSS TIMING

S2: PHASE ERROR EXTRACTION BASED ON SELF-RUNNING TIMING

S10 : PHASE ERROR EXTRACTION BASED ON ZERO-CROSS TIMING

S20 : PHASE ERROR EXTRACTION BASED ON SELF-RUNNING TIMING

APPARATUS FOR ENABLING PLL TO LOCK ON TO A CORRECT FREQUENCY AND PHASE DURING THE REPRODUCTION OF A CONTINUOUS-WAVE-CORRESPONDING SIGNAL AND REPETITION OF A SPECIFIC PATTERN

BACKGROUND OF THE INVENTION

1. Field of the Invention

This invention generally relates to a signal reproducing apparatus and a computer program which can be used therein. This invention particularly relates to an apparatus for reproducing a signal from a recording medium such as an optical disc, and also a computer program which can be used in the reproducing apparatus.

2. Description of the Related Art

In typical cases, a high-density recording medium such as an optical disc stores address information and user data. It is known to previously record a constant-period signal on a position of an optical disc which precedes the recorded positions of address information and user data. The constant-period signal is reproduced as a continuous wave like a carrier. An apparatus for reproducing information from such an optical disc utilizes a reproduced continuous-wave signal to stabilize an information recovery process. A VFO interval prescribed by the DVD-RAM standards is an example of an interval occupied by a constant-period signal corresponding to a continuous wave. The continuous-wave-corresponding signal has a period equal to, for example, 4T where T denotes a bit period.

A typical information reproducing apparatus contains a PLL (phase locked loop) circuit for recovering a timing signal from a reproduced signal. The PLL circuit generates zero-cross information from the reproduced signal, and generates a phase error signal on the basis of the zero-cross information. The PLL circuit locks up in response to the phase error signal. Various factors cause asymmetry in the waveform of the reproduced signal. The waveform asymmetry tends to cause the PLL circuit to generate a wrong phase error signal in response to a reproduced continuous-wave signal. The wrong phase error signal makes it difficult for the PLL circuit to lock on a correct frequency and a correct phase during the reproduction of address information and user data which follow the continuous-wave-corresponding signal.

Also, it is known to previously record repetition of a specified pattern on a position of an optical disc which precedes the recorded positions of address information and user data. The repetition of the specified pattern is used instead of the continuous-wave-corresponding signal.

SUMMARY OF THE INVENTION

It is a first object of this invention to provide a reproducing apparatus which enables a PLL circuit to quickly lock on a correct frequency and a correct phase during the reproduction of a continuous-wave-corresponding signal.

It is a second object of this invention to provide a computer program which can be used in such a reproducing apparatus.

It is a third object of this invention to provide a reproducing apparatus which enables a PLL circuit to reliably lock on a correct frequency and a correct phase during the reproduction of repetition of a specified pattern.

It is a fourth object of this invention to provide a computer program which can be used in such a reproducing apparatus.

A first aspect of this invention provides a reproducing apparatus comprising first means for reproducing a signal representative of digital information from a recording medium; second means for sampling the signal reproduced by the first means in response to a clock signal to generate a sampling-resultant signal; third means for subjecting the sampling-resultant signal to a re-sampling process and an interpolation process responsive to timing information to generate a re-sampling-resultant signal; fourth means for deciding whether the re-sampling-resultant signal is in a continuous-wave interval where an inversion period of the re-sampling-resultant signal remains constant or in a random-wave interval where the inversion period of the re-sampling-resultant signal varies at random; fifth means for extracting a first value of the re-sampling-resultant signal at a time point corresponding to every zero-cross timing, for controlling a polarity of the extracted first value in response to whether the re-sampling-resultant signal is rising or falling in value to generate a polarity-control-resultant value, and for generating a first phase error in response to the polarity-control-resultant value; sixth means for repetitively extracting a second value of the re-sampling-resultant signal at a constant period corresponding to a normal inversion period occurring during the continuous-wave interval, for alternately changing a polarity of the extracted second value between positive and negative to generate a polarity-change-resultant value, and for generating a second phase error in response to the polarity-change-resultant value; seventh means for selecting the first phase error generated by the fifth means when the fourth means decides that the re-sampling-resultant signal is in a random-wave interval, and for selecting the second phase error generated by the sixth means when the fourth means decides that the re-sampling-resultant signal is in a continuous-wave interval; a loop filter for integrating the phase error selected by the seventh means to generate a phase-error integration result; and eighth means for generating the timing information in response to the phase-error integration result generated by the loop filter.

A second aspect of this invention provides a reproducing apparatus comprising first means for reproducing a signal representative of digital information from a recording medium; second means for sampling the signal reproduced by the first means in response to a clock signal to generate a sampling-resultant signal; third means for deciding whether the sampling-resultant signal is in a continuous-wave interval where an inversion period of the sampling-resultant signal remains constant or in a random-wave interval where the inversion period of the sampling-resultant signal varies at random; fourth means for extracting a first value of the sampling-resultant signal at a time point corresponding to every zero-cross timing, for controlling a polarity of the extracted first value in response to whether the sampling-resultant signal is rising or falling in value to generate a polarity-control-resultant value, and for generating a first phase error in response to the polarity-control-resultant value; fifth means for repetitively extracting a second value of the sampling-resultant signal at a constant period corresponding to a normal inversion period occurring during the continuous-wave interval, for alternately changing a polarity of the extracted second value between positive and negative to generate a polarity-change-resultant value, and for generating a second phase error in response to the polarity-change-resultant value; sixth means for selecting the first phase error generated by the fourth means when the third means decides that the sampling-resultant signal is in a random-wave interval, and for selecting the second phase error generated by the fifth means when the third means decides that the sampling-resultant signal is in a continuous-wave interval; and seventh means for generating the clock signal in response to the phase error selected by the sixth means.

A third aspect of this invention is based on the first aspect thereof, and provides a reproducing apparatus wherein the fourth means comprises means for deciding whether or not a latest inversion period Y of the re-sampling-resultant signal satisfies one of relations as follows:

$$X-1 \leq Y \leq X+1$$

$$X-2 \leq Y \leq X$$

$$X \leq Y \leq X+2$$

where X denotes the normal inversion period occurring in the continuous-wave interval; means for deciding whether or not the latest inversion period Y consecutively satisfies one of the relations a prescribed number of times; and means for deciding that the re-sampling-resultant signal is in a continuous-wave interval when the latest inversion period Y consecutively satisfies one of the relations the prescribed number of times.

A fourth aspect of this invention is based on the first aspect thereof, and provides a reproducing apparatus wherein the fourth means comprises means for detecting a latest period Z for which the re-sampling-resultant signal either rises or falls; means for deciding whether or not the latest period Z satisfies one of relations as follows:

$$2X-1 \leq Z \leq 2X+1$$

$$2X-2 \leq Z \leq 2X$$

$$2X \leq Z \leq 2X+2$$

where X denotes the normal inversion period occurring in the continuous-wave interval; means for deciding whether or not the latest period Z consecutively satisfies one of the relations a prescribed number of times; and means for deciding that the re-sampling-resultant signal is in a continuous-wave interval when the latest period Z consecutively satisfies one of the relations the prescribed number of times.

A fifth aspect of this invention is based on the first aspect thereof, and provides a reproducing apparatus wherein the fourth means comprises means for deciding whether or not a latest inversion period of the re-sampling-resultant signal exceeds a preset period; and means for controlling the seventh means to select the first phase error when it is decided that the latest inversion period of the re-sampling-resultant signal exceeds the preset period.

A sixth aspect of this invention provides a reproducing apparatus comprising first means for reproducing a signal representative of digital information from a recording medium; second means for sampling the signal reproduced by the first means in response to a clock signal to generate a sampling-resultant signal; third means for deciding whether the sampling-resultant signal is in a specified-pattern repetition interval where an inversion period of the sampling-resultant signal changes in accordance with a repetition of a specified pattern or in a random-wave interval where the inversion period of the sampling-resultant signal varies at random; fourth means for extracting a first value of the sampling-resultant signal at a time point corresponding to every zero-cross timing, for controlling a polarity of the extracted first value in response to whether the sampling-resultant signal is rising or falling in value to generate a first polarity-control-resultant value, and for generating a first phase error in response to the first polarity-control-resultant value; fifth means for repetitively extracting a second value of the sampling-resultant signal at a period changing in accordance with the specified pattern, for controlling a polarity of the extracted second value in response to whether the extracted second value is in a value-rising time or a value-falling time to generate a second polarity-control-resultant value, and for generating a second phase error in response to the second polarity-control-resultant value; sixth means for selecting the first phase error generated by the fourth means when the third means decides that the sampling-resultant signal is in a random-wave interval, and for selecting the second phase error generated by the fifth means when the third means decides that the sampling-resultant signal is in a specified-pattern repetition interval; and seventh means for generating the clock signal in response to the phase error selected by the sixth means.

A seventh aspect of this invention provides a reproducing apparatus comprising first means for reproducing a signal representative of digital information from a recording medium; second means for sampling the signal reproduced by the first means in response to a clock signal to generate a sampling-resultant signal; third means for subjecting the sampling-resultant signal to a re-sampling process and an interpolation process responsive to timing information to generate a re-sampling-resultant signal; fourth means for deciding whether the re-sampling-resultant signal is in a specified-pattern repetition interval where an inversion period of the re-sampling-resultant signal changes in accordance with a repetition of a specified pattern or in a random-wave interval where the inversion period of the re-sampling-resultant signal varies at random; fifth means for extracting a first value of the re-sampling-resultant signal at a time point corresponding to every zero-cross timing, for controlling a polarity of the extracted first value in response to whether the re-sampling-resultant signal is rising or falling in value to generate a first polarity-control-resultant value, and for generating a first phase error in response to the first polarity-control-resultant value; sixth means for repetitively extracting a second value of the re-sampling-resultant signal at a period changing in accordance with the specified pattern, for controlling a polarity of the extracted second value in response to whether the extracted second value is in a value-rising time or a value-falling time to generate a second polarity-control-resultant value, and for generating a second phase error in response to the second polarity-control-resultant value; seventh means for selecting the first phase error generated by the fifth means when the fourth means decides that the re-sampling-resultant signal is in a random-wave interval, and for selecting the second phase error generated by the sixth means when the fourth means decides that the re-sampling-resultant signal is in a specified-pattern repetition interval; a loop filter for integrating the phase error selected by the seventh means to generate a phase-error integration result; and eighth means for generating the timing information in response to the phase-error integration result generated by the loop filter.

An eighth aspect of this invention is based on the sixth aspect thereof, and provides a reproducing apparatus wherein the third means comprises means for deciding whether or not a latest inversion period Y(i) of the sampling-resultant signal satisfies one of relations as follows:

$$Y(i-J)-1 \leq Y(i) \leq Y(i-J)+1$$

$$Y(i-J)-2 \leq Y(i) \leq Y(i-J)$$

$$Y(i-J) \leq Y(i) \leq Y(i-J)+2$$

where J denotes a number of inversion period elements composing the specified pattern; means for deciding whether or not the latest inversion period Y(i) consecutively satisfies one of the relations a prescribed number of times; and means for deciding that the sampling-resultant signal is in a specified-pattern repetition interval when the latest inversion period Y(i) consecutively satisfies one of the relations the prescribed number of times.

A ninth aspect of this invention is based on the sixth aspect thereof, and provides a reproducing apparatus wherein the third means comprises means for deciding whether or not a latest inversion period Z(i+k) of the sampling-resultant signal satisfies one of relations as follows:

$$X(k)-1 \leq Z(i+k) \leq X(k)+1$$

$$X(k)-2 \leq Z(i+k) \leq X(k)$$

$$X(k) \leq Z(i+k) \leq X(k)+2$$

where X(k) denotes one among inversion period elements composing the specified pattern; means for deciding whether or not the latest inversion period Z(i+k) consecutively satisfies one of the relations a prescribed number of times; and means for deciding that the sampling-resultant signal is in a specified-pattern repetition interval when the latest inversion period Z(i+k) consecutively satisfies one of the relations the prescribed number of times.

A tenth aspect of this invention is based on the sixth aspect thereof, and provides a reproducing apparatus wherein the third means comprises means for deciding whether or not a latest inversion period Y(i+1) and a second latest inversion period Y(i) of the sampling-resultant signal satisfy one of relations as follows:

$$Y(i) \cdot 2 < Y(i+1)$$

$$Y(i) > Y(i+1) \cdot 2$$

where the character "·" denotes product, and means for starting the decision about whether the sampling-resultant signal is in a specified-pattern repetition interval or a random-wave interval when it is decided that the latest inversion period Y(i+1) and the second latest inversion period Y(i) satisfy one of the relations.

An eleventh aspect of this invention is based on the sixth aspect thereof, and provides a reproducing apparatus wherein the third means comprises means for measuring a time interval for which the sampling-resultant signal remains in a specified-pattern repetition interval; and means for controlling the sixth means to select the first phase error when the measured time interval reaches a predetermined time value.

A twelfth aspect of this invention is based on the sixth aspect thereof, and provides a reproducing apparatus wherein the specified pattern includes a succession of inversion periods as 5T·5T·3T·3T·2T·2T, where T denotes a bit period of the digital information.

A thirteenth aspect of this invention is based on the first aspect thereof, and provides a reproducing apparatus wherein the third means, the fifth means, the sixth means, the seventh means, the loop filter, and the eighth means compose a feedback loop, and further comprising means for changing a loop gain of the feedback loop in response to which of the first phase error and the second phase error is selected by the seventh means.

A fourteenth aspect of this invention is based on the sixth aspect thereof, and provides a reproducing apparatus wherein the sixth means comprises means for selecting only the second phase error which corresponds to an inversion period longer than a prescribed period.

A fifteenth aspect of this invention is based on the first aspect thereof, and provides a reproducing apparatus wherein the seventh means comprises means for measuring a time interval for which the second phase error remains selected; and means for selecting the first phase error instead of the second phase error when the measured time interval reaches a predetermined time value.

A sixteenth aspect of this invention provides a computer program used for a reproducing apparatus comprising first means for reproducing a signal representative of digital information from a recording medium, second means for sampling the signal reproduced by the first means in response to a clock signal to generate a sampling-resultant signal, and a computer. The computer program enables the computer to operate as third means for deciding whether the sampling-resultant signal is in a continuous-wave interval where an inversion period of the sampling-resultant signal remains constant or in a random-wave interval where the inversion period of the sampling-resultant signal varies at random; fourth means for extracting a first value of the sampling-resultant signal at a time point corresponding to every zero-cross timing, for controlling a polarity of the extracted first value in response to whether the sampling-resultant signal is rising or falling in value to generate a polarity-control-resultant value, and for generating a first phase error in response to the polarity-control-resultant value; fifth means for repetitively extracting a second value of the sampling-resultant signal at a constant period corresponding to a normal inversion period occurring during the continuous-wave interval, for alternately changing a polarity of the extracted second value between positive and negative to generate a polarity-change-resultant value, and for generating a second phase error in response to the polarity-change-resultant value; sixth means for selecting the first phase error generated by the fourth means when the third means decides that the sampling-resultant signal is in a random-wave interval, and for selecting the second phase error generated by the fifth means when the third means decides that the sampling-resultant signal is in a continuous-wave interval; and seventh means for generating the clock signal in response to the phase error selected by the sixth means.

A seventeenth aspect of this invention provides a computer program used for a reproducing apparatus comprising first means for reproducing a signal representative of digital information from a recording medium, second means for sampling the signal reproduced by the first means in response to a clock signal to generate a sampling-resultant signal, and a computer. The computer program enables the computer to operate as third means for deciding whether the sampling-resultant signal is in a specified-pattern repetition interval where an inversion period of the sampling-resultant signal changes in accordance with a repetition of a specified pattern or in a random-wave interval where the inversion period of the sampling-resultant signal varies at random; fourth means for extracting a first value of the sampling-resultant signal at a time point corresponding to every zero-cross timing, for controlling a polarity of the extracted first value in response to whether the sampling-resultant signal is rising or falling in value to generate a first polarity-control-resultant value, and for generating a first phase error in response to the first polarity-control-resultant value; fifth means for repetitively extracting a second value of the sampling-resultant signal at a period changing in accordance with the specified pattern, for controlling a polarity of the extracted second value in response to whether the extracted second value is in a value-rising time or a value-falling time to generate a second polarity-control-resultant value, and for generating a second phase error in response to the second polarity-control-resultant value; sixth means for selecting the first phase error generated by the fourth means when the third means decides that the sampling-resultant signal is in a random-wave interval, and for selecting the second phase error generated by the fifth means when the third means decides that the sampling-resultant signal is in a specified-pattern repetition interval; and seventh means for generating the clock signal in response to the phase error selected by the sixth means.

An eighteenth aspect of this invention is based on the first aspect thereof, and provides a reproducing apparatus further comprising ninth means for recovering the digital information from the re-sampling-resultant signal; tenth means for deciding whether or not a sync signal regularly appears in the recovered digital information; and eleventh means for forcing the seventh means to select the first phase error when the tenth means decides that a sync signal regularly appears in the recovered digital information.

A nineteenth aspect of this invention is based on the sixth aspect thereof, and provides a reproducing apparatus further comprising eighth means for recovering the digital information from the sampling-resultant signal; ninth means for deciding whether or not a sync signal regularly appears in the recovered digital information; and tenth means for forcing the sixth means to select the first phase error when the ninth means decides that a sync signal regularly appears in the recovered digital information.

BRIEF DESCRIPTION OF THE DRAWINGS

FIG. 2 is a diagram of the structure of a header field in FIG. 1.

DETAILED DESCRIPTION OF THE INVENTION

A DVD-RAM and a prior-art apparatus will be explained below for a better understanding of this invention.

Figure 1:
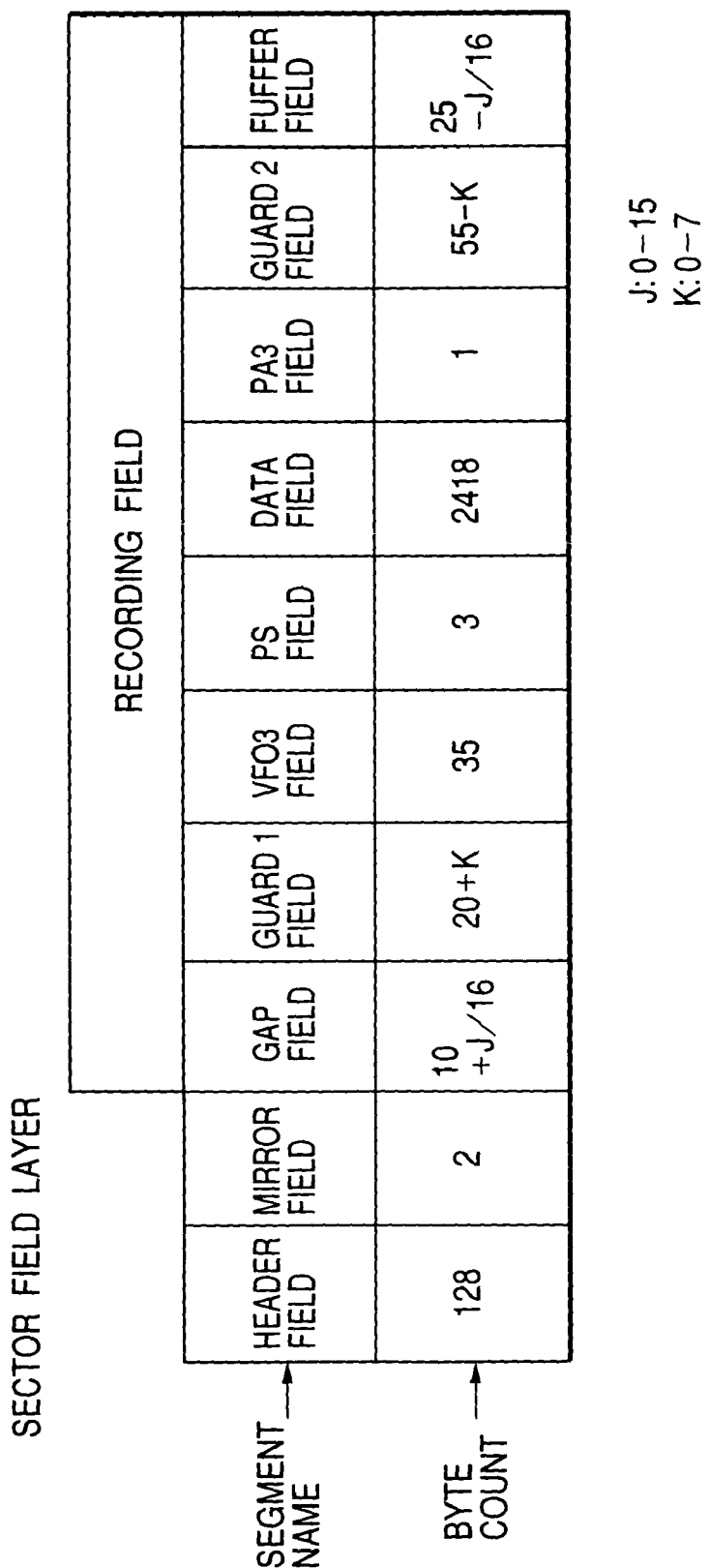
FIG. 1 is a diagram of the structure of a sector field in a rewritable area of a DVD-RAM.

FIG. 1 shows the structure of a sector field in a rewritable area of a DVD-RAM. As shown in FIG. 1, a header field occupies a head of the sector field. A mirror field follows the header field. A recording field follows the mirror field. The recording field contains a VFO3 field preceding a data field.

FIG. 2 shows the structure of the header field in FIG. 1. As shown in FIG. 2, the header field is separated into a header 1 field, a header 2 field, a header 3 field, and a header 4 field. The header 1 field contains a VFO1 segment at its first portion. The header 2 field contains a VFO2 segment at its first portion. The header 3 field contains a VFO1 segment at its first portion. The header 4 field contains a VFO2 segment at its first portion.

Figure 3:
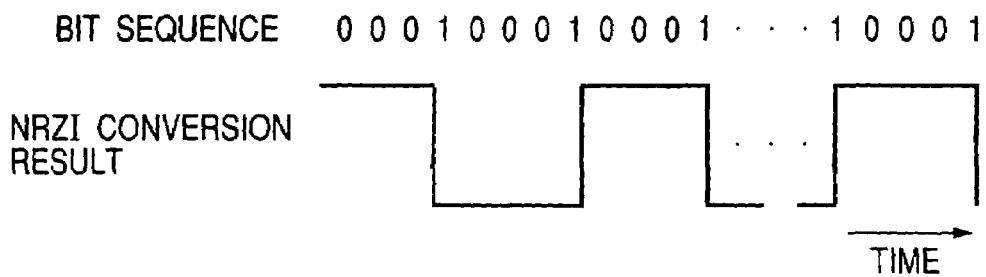
FIG. 3 is a time-domain diagram of a bit sequence stored in a VFO3 field in FIG. 1 and VFO1 and VFO2 segments in FIG. 3, and an NRZI conversion result of the bit sequence.

Each of the VFO1 segments and the VFO2 segments in FIG. 2 is loaded with a bit sequence of "000100010001 . . . 10001" shown in FIG. 3. Similarly, the VFO3 field in FIG. 1 is loaded with a bit sequence of "1000100010001 . . . 10001". The bit sequence in FIG. 3 has repetition of a predetermined pattern (that is, "00010001") with a constant period equal to 4T, where T denotes a bit period. As shown in FIG. 3, the NRZI conversion result of the bit sequence in FIG. 3 corresponds to a rectangular waveform which has an inversion period equal to 4T, and which will appear as a carrier-like continuous wave in a reproduced signal. Here, "inversion period" means the time interval between two adjacent zero-cross points (points at which a reproduced-signal level crosses zero).

A prior-art apparatus for reproducing information from a DVD-RAM utilizes reproduced VFO1–VFO3 signals to stabilize a data recovery process. Here, the reproduced VFO1–VFO3 signals mean signals reproduced from the VFO1 segments, the VFO2 segments, and the VFO3 field. A correct inversion period of the reproduced VFO1–VFO3 signals is equal to 4T.

The prior-art apparatus includes a PLL circuit for recovering a timing signal from a reproduced signal. The PLL circuit generates zero-cross information from the reproduced signal, and generates a phase error signal on the basis of the zero-cross information. The PLL circuit locks up in response to the phase error signal. In the presence of a phase error corresponding to 1T or longer, the PLL circuit fails to generate a correct phase error signal since the zero-cross information is employed.

Figure 4:
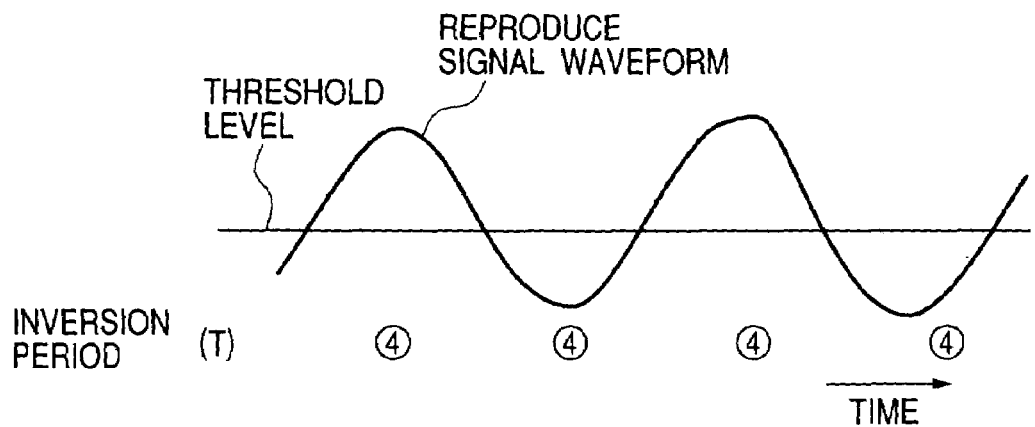
FIG. 4 is a time-domain diagram of a reproduced VFO1, VFO2, or VFO3 signal, and a proper threshold level.
Figure 5:
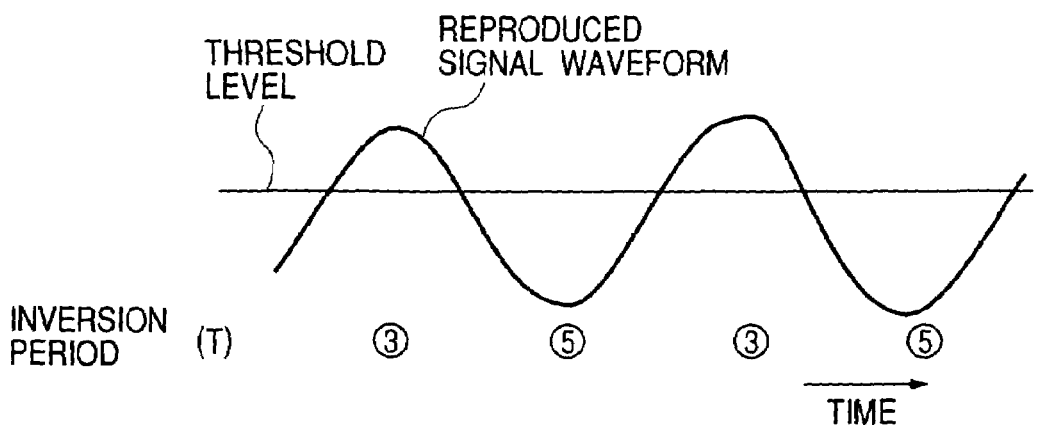
FIG. 5 is a time-domain diagram of a reproduced VFO1, VFO2, or VFO3 signal, and an improper threshold level.

In the case where the PLL circuit erroneously recognizes the inversion period of reproduced VFO1–VFO3 signals to be 3T or 5T, the PLL circuit does not generate a correct phase error signal. Such a phenomenon tends to occur when a threshold level for defining a zero level is wrong. FIG. 4 shows a condition in which a threshold level corresponding to zero is proper for the waveform of a reproduced VFO1, VFO2, or VFO3 signal so that the inversion period of the reproduced signal is correctly recognized to be 4T. FIG. 5 shows a condition in which a threshold level corresponding to zero is improper for the waveform of a reproduced VFO1, VFO2, or VFO3 signal so that the inversion period of the reproduced signal is erroneously recognized to be 3T or 5T. In such a condition, the PLL circuit does not generate a correct phase error signal.

For some of reproduced signals, the level and polarity of a wrong phase error detected by the PLL circuit are outputted at random so that the PLL circuit is hindered from moving out of lock-on the present frequency and falls into a pseudo locked state (a wrong locked state). Asymmetry in the waveform of a signal reproduced from a DVD-RAM occurs depending on conditions of a recording laser power and a reproducing laser power, and also conditions of a recording area of the DVD-RAM. The waveform asymmetry tends to cause the PLL circuit to generate a wrong phase error signal in response to a reproduced VFO1, VFO2, or VFO3 signal. The wrong phase error signal makes it difficult for the PLL circuit to lock on a correct frequency and a correct phase during the reproduction of data which follow the VFO1, VFO2, or VFO3 signal.

First Embodiment

A recording medium such as an optical disc or a DVD-RAM stores a signal representative of digital information. The recording medium has a recording area divided into main segments and sub segments which alternate with each other along the direction of scanning of the recording medium. Each of the heads of the main segments is occupied by a sync signal having a special bit sequence pattern. The sync pattern is divided into longer-period portions corresponding to an inversion period equal to 14T and shorter-period portions corresponding to an inversion period equal to 4T, where T denotes a bit period. The post-head regions of the main segments are loaded with portions of user data, respectively. Each of the sub segments is loaded with repetition of a predetermined bit sequence pattern having a period which is equal to 4T as prescribed by the DVD-RAM standards. The repetition of the predetermined bit sequence pattern is reproduced as a carrier-like continuous wave corresponding to a constant inversion period equal to 4T.

A reproducing apparatus of a first embodiment of this invention reproduces a signal from the recording medium, and thereby gets a reproduced signal representative of digital information. The reproduced signal has a waveform such as shown in FIG. 6.

Figure 6:
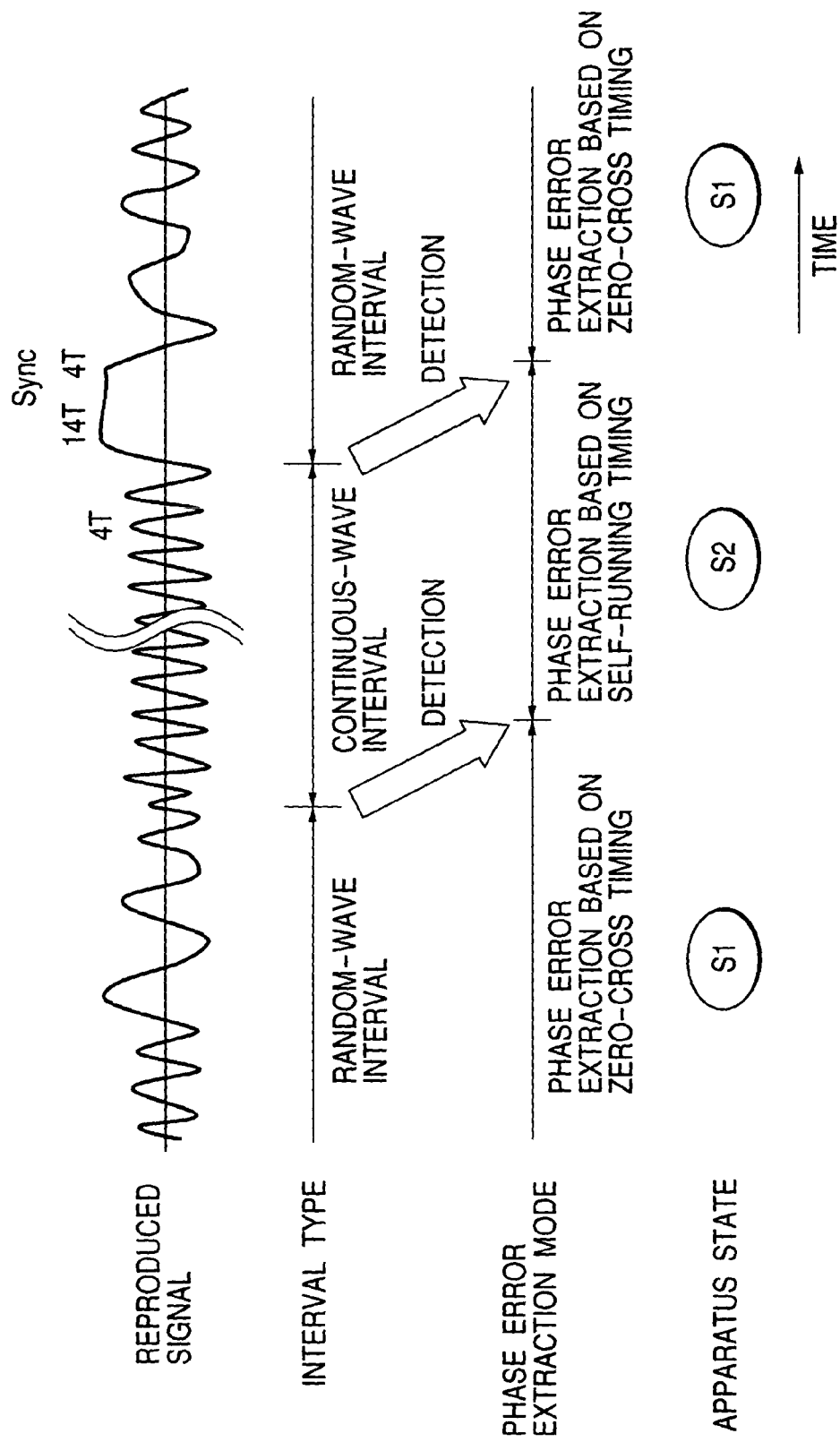
FIG. 6 is a time-domain diagram of a reproduced signal, an interval type, a phase error extraction mode, and a reproducing apparatus state in a first embodiment of this invention.

With reference to FIG. 6, regarding the reproduced signal, there are random-wave intervals between which continuous-wave intervals extend. The reproduced signal in the random-wave intervals originates from the sync signals and the user data in the main segments of the recording area of the recording medium. The reproduced signal in the initial parts of the random-wave intervals reflects reproduced sync signals each including at least one longer-period portion corresponding to an inversion period of 14T and at least one shorter-period portion corresponding to an inversion period of 4T. The reproduced signal in the later parts of the random-wave intervals has a period which changes depending on the user data, and thus which appears to vary at random. The reproduced signal in the continuous-wave intervals originates from the repetitions of the predetermined bit sequence pattern in the sub segments of the recording area of the recording medium. The reproduced signal in the continuous-wave intervals is a carrier-like continuous wave corresponding to a constant inversion period equal to 4T.

Basic operation of the reproducing apparatus will be described below with reference to FIG. 6. The reproducing apparatus includes a section for detecting every continuous-wave interval and also every random-wave interval regarding a reproduced signal. The reproducing apparatus further includes a PLL-based section for extracting a phase error in either a first method or a second method. Here, PLL is short for a phase locked loop. The first method uses a zero-cross timing. The second method uses a self-running timing. Upon the detection of a continuous-wave interval, the method of extracting a phase error on a zero-cross-timing basis is replaced by that on a self-running-timing basis. Upon the detection of a random-wave interval, the method of extracting a phase error on a self-running-timing basis is replaced by that on a zero-cross-timing basis. The characters S1 denote the operation state of the reproducing apparatus in which the method of extracting a phase error on a zero-cross-timing basis is carried out. The characters S2 denote the operation state of the reproducing apparatus in which the method of extracting a phase error on a self-running-timing basis is carried out. Normally, the operation state S1 and the operation state S2 alternate with each other.

Figure 7:
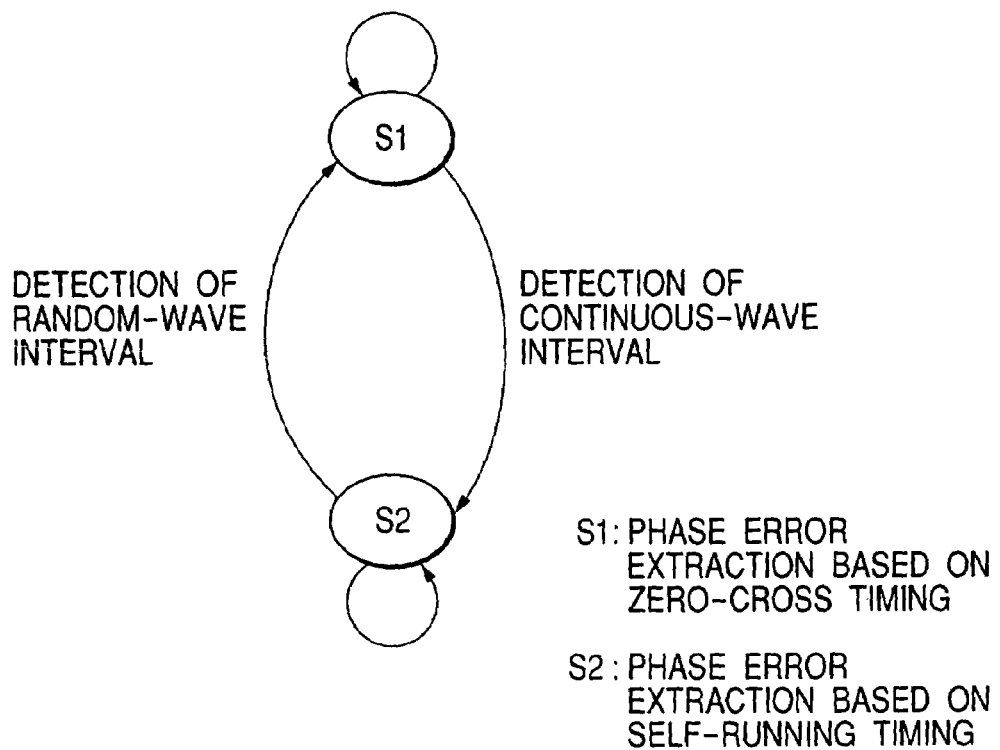
FIG. 7 is a diagram of transitions between different reproducing-apparatus operation states in the first embodiment of this invention.

FIG. 7 shows transitions between the operation states S1 and S2 of the reproducing apparatus. The reproducing apparatus changes to or remains in the operation state S1 when a random-wave interval is detected. The reproducing apparatus changes to or remains in the operation state S2 when a continuous-wave interval is detected.

Figure 8:
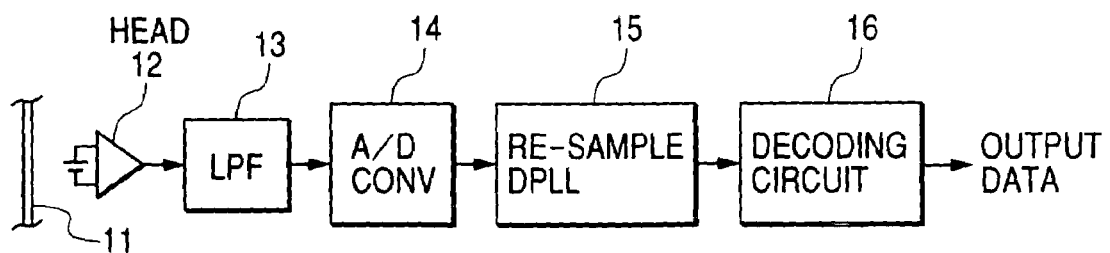
FIG. 8 is a block diagram of a reproducing apparatus in the first embodiment of this invention.

FIG. 8 shows the reproducing apparatus in the first embodiment of this invention. With reference to FIG. 8, an optical disc 11 stores a signal representative of digital information, that is, a signal of a run-length-limited code, at a predetermined high recording density. The reproducing apparatus contains an optical head 12 which reads out the signal of the run-length-limited code from the optical disc 11. The optical head 12 includes a photoelectric converter (a photodetector), and an amplifier following the photoelectric converter. The optical head 12 outputs the read-out signal to a low pass filter (LPF) 13.

The low pass filter 13 removes high-frequency components, that is, noise components, from the read-out signal. The output signal of the low pass filter 13 is applied to an A/D (analog-to-digital) converter 14. The A/D converter 14 changes the output signal of the low pass filter 13 into a corresponding digital signal. Specifically, the A/D converter 14 receives a clock signal from a suitable circuit. In general, the clock signal has a fixed frequency. The clock signal may be a system block signal or a bit clock signal. The A/D converter 14 periodically samples the output signal of the low pass filter 13 in response to the clock signal, and converts every resultant sample into a digital sample. The A/D converter 14 outputs the digital signal, that is, a sequence of the digital samples, to a re-sampling DPLL section (a re-sampling digital PLL section) 15. The output signal of the A/D converter 14 is also referred to as a first digital signal. The position of the A/D converter 14 may be between the optical head 12 and the low pass filter 13. In this case, the low pass filter 13 is of a digital type.

A digital AGC (automatic gain control) circuit may be provided between the A/D converter 14 and the re-sampling DPLL section 15. In this case, the AGC circuit subjects the output signal of the A/D converter 14 to automatic gain control for providing a constant signal amplitude on a digital basis. The AGC circuit outputs the resultant digital signal to the re-sampling DPLL section 15.

The re-sampling DPLL section 15 converts the output signal (the first digital signal) of the A/D converter 14 into a second digital signal. Timings related to samples of the output signal (the first digital signal) of the A/D converter 14 are determined by the fixed-frequency clock signal, for example, the system clock signal. Timings related to samples of the second digital signal are determined by a bit clock signal synchronized with the fixed-frequency clock signal. Timings related to samples of the second digital signal differ from those related to samples of the first digital signal by a phase of, for example, 180°. The re-sampling DPLL section 15 generates samples of the second digital signal from samples of the first digital signal through at least one of interpolation and decimation.

The re-sampling DPLL section 15 includes a digital PLL (phase locked loop) circuit having a closed loop, that is, a feedback loop. The digital PLL circuit in the re-sampling DPLL section 15 generates a second digital signal on the basis of the output signal of the A/D converter 14. The second digital signal relates to a sampling frequency equal to a bit clock frequency. Specifically, samples of the second digital signal are generated from samples of the output signal of the A/D converter 14 through a PLL re-sampling process based on at least one of interpolation and decimation. The re-sampling DPLL section 15 outputs the second digital signal to a decoding circuit 16.

The decoding circuit 16 includes an equalization section, and a viterbi decoding section following the equalization section. The equalization section subjects the output signal of the re-sampling DPLL section 15 to waveform equalization which corresponds to a process of providing the signal in question to a partial-response (PR) characteristic. The equalization section outputs the equalization-resultant signal to the viterbi decoding section. The viterbi decoding section recovers original data from the output signal of the equalization section through a viterbi decoding procedure. The viterbi decoding section in the circuit 16 outputs the recovered data to an ECC (error checking and correcting) circuit which is not shown in FIG. 8. The ECC circuit extracts an error correction code from the recovered data outputted by the decoding circuit 16. The ECC circuit corrects errors in the recovered data in response to the extracted error correction code. The ECC circuit outputs the resultant recovered data.

The viterbi decoding section of the circuit 16 is of a known structure. An example of the viterbi decoding section is as follows. The viterbi decoding section includes a memory loaded with a plurality of candidate recovered data pieces. Also, the viterbi decoding section includes a portion for calculating branch metric values from samples of the output signal of the equalization section. Furthermore, the viterbi decoding section includes a portion for accumulating the branch metric values into path metric values respectively on a 1-clock by 1-clock basis. In addition, the viterbi decoding section includes a portion for detecting the minimum value among the path metric values, and generating a selection signal corresponding to the detected minimum path metric value. The selection signal is applied to the memory. One of the candidate recovered data pieces which corresponds to the minimum path metric value is elected in response to the selection signal, being outputted from the memory as a piece of the recovered data.

It should be noted that the decoding circuit 16 may implement a bit-by-bit decoding procedure instead of the viterbi decoding procedure.

Figure 9:
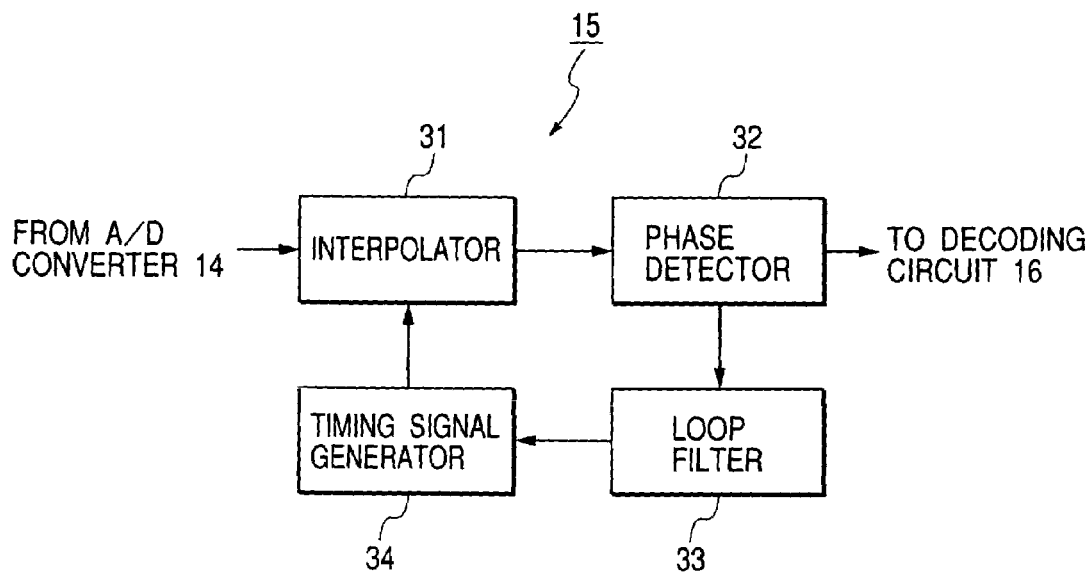
FIG. 9 is a block diagram of a re-sampling DPLL section in FIG. 8.

As shown in FIG. 9, the re-sampling DPLL section 15 includes an interpolator 31, a phase detector 32, a loop filter 33, and a timing signal generator 34 which are connected in a closed loop (a feedback loop) in that order. The interpolator 31 receives the output signal (the first digital signal) of the A/D converter 14. The interpolator 31 receives data point phase information and a bit clock signal from the timing signal generator 34. The interpolator 31 estimates 0°-phase-point data samples from samples of the output signal of the A/D converter 14 through interpolation responsive to the data point phase information and the bit clock signal. Here, "phase" is defined relative to the bit clock signal. The interpolator 31 outputs the estimated 0°-phase-point data samples to the phase detector 32.

In the re-sampling DPLL section 15, the phase detector 32 generates 180°-phase-point data samples from the 0°-phase-point data samples. Specifically, the phase detector 32 calculates a mean of a current 0°-phase-point data sample and an immediately preceding 0°-phase-point data sample, and uses the calculated mean as a current 180°-phase-point data sample. The phase detector 32 outputs the 180°-phase-point data samples to the decoding circuit 16 as the second digital signal. Furthermore, the phase detector 32 generates a signal representative of a phase error in response to the 0°-phase-point data samples. The phase detector 32 outputs the phase error signal to the loop filter 33. The loop filter 33 integrates the phase error signal. The loop filter 33 outputs the integration-resultant signal to the timing signal generator 34. The timing signal generator 34 produces the data point phase information and the bit clock signal in response to the output signal of the loop filter 33. The timing signal generator 34 outputs the data point phase information and the bit clock signal to the interpolator 31.

Figure 10:
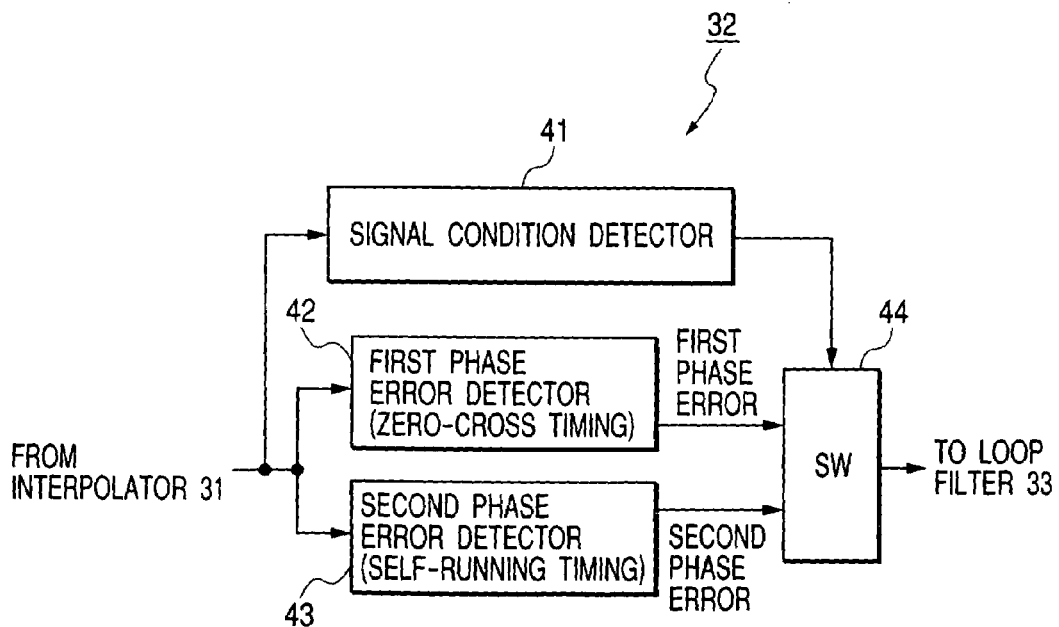
FIG. 10 is a block diagram of a phase detector in FIG. 9.

As shown in FIG. 10, the phase-error-signal producing portion of the phase detector 32 includes a signal condition detector 41, a first phase error detector 42, a second phase error detector 43, and a switch 44. The signal condition detector 41 receives the output signal of the interpolator 31 (that is, the 0°-phase-point data samples). The signal condition detector 41 decides whether the output signal of the interpolator 31 is in a continuous-wave interval or a random-wave interval by referring to a condition of the output signal of the interpolator 31. The signal condition detector 41 generates a control signal in response to the result of the decision. The generated control signal is "1" when the decision result indicates the output signal of the interpolator 31 is in a continuous-wave interval. The generated control signal is "0" when the decision result indicates that the output signal of the interpolator 31 is in a random-wave interval. The signal condition detector 41 outputs the generated control signal to the switch 44. The first phase error detector 42 receives the output signal of the interpolator 31, and detects a first phase error of the received signal on the basis of a zero-cross timing. The first phase error detector 42 generates a signal representative of the detected first phase error. The first phase error detector 42 feeds the first phase error signal to the switch 44. The second phase error detector 43 receives the output signal of the interpolator 31, and detects a second phase error of the received signal on the basis of a self-running timing. The second phase error detector 43 generates a signal representative of the detected second phase error. The second phase error detector 43 feeds the second phase error signal to the switch 44. The switch 44 selects one of the first and second phase error signals in response to the control signal outputted by the signal condition detector 41. Specifically, the switch 44 selects the first phase error signal when the control signal is "0", that is, when the output signal of the interpolator 31 is in a random-wave interval. On the other hand, the switch 44 selects the second phase error signal when the control signal is "1", that is, when the output signal of the interpolator 31 is in a continuous-wave interval. The switch 44 passes the selected phase error signal to the loop filter 31 as a final phase error signal.

Figure 11:
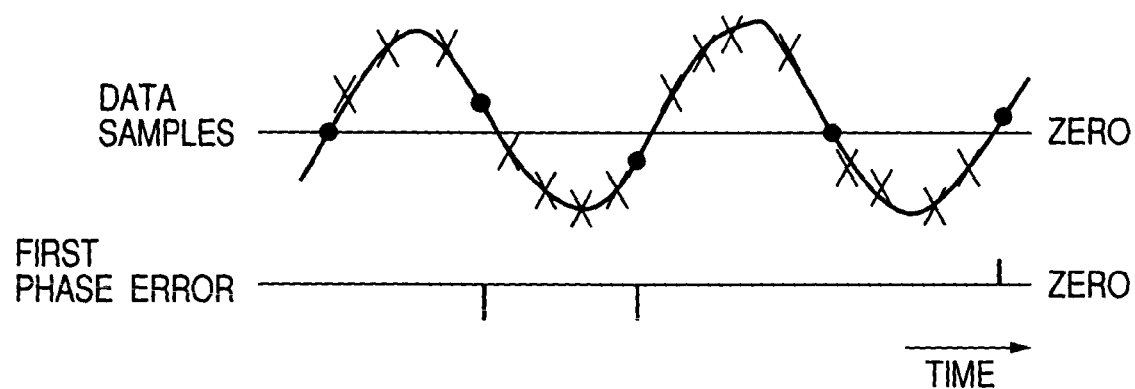
FIG. 11 is a time-domain diagram of the values of successive data samples, and a first phase error extracted by a first phase error detector in FIG. 10.

Operation of the first phase error detector 42 will be described below with reference to FIG. 11. The first phase error detector 42 uses a zero-cross timing. Data samples sequentially inputted into the first phase error detector 42 from the interpolator 31 vary in value as shown in FIG. 11. The value of every input data sample is measured from zero. The first phase error detector 42 monitors the value of every input data sample, and detects every zero cross related to the monitored sample value. The first phase error detector 42 senses zero-cross-corresponding points "●" among the input data samples in response to the detected zero crosses. At each of the timings of the sensed zero-cross-corresponding points "●", the first phase error detector 42 generates a first phase error on the basis of the related data sample. For example, at every zero-cross-corresponding point "●" in a time range where the data sample value is rising, the first phase error detector 42 uses the value of the related data sample as a first phase error. At every zero-cross-corresponding point "●" in a time range where the data sample value is falling, the first phase error detector 42 inverts the polarity (the sign) of the value of the related data sample and uses the inversion-resultant value as a first phase error. Accordingly, the first phase error generated by the first phase error detector 42 varies as shown in FIG. 11.

Figure 12:
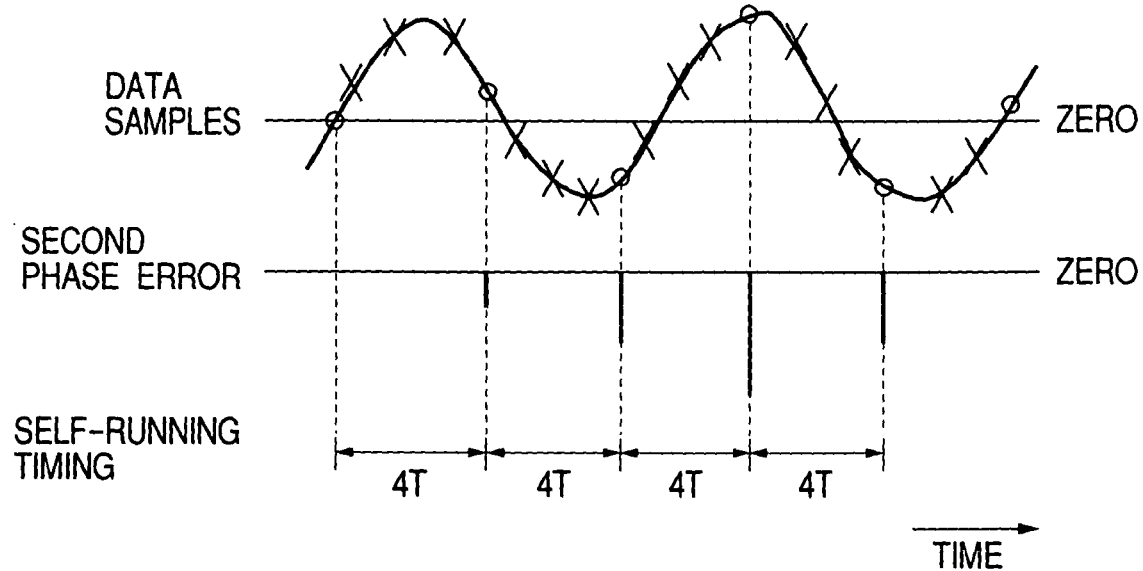
FIG. 12 is a time-domain diagram of the values of successive data samples, and a second phase error extracted by a second phase error detector in FIG. 10.

Operation of the second phase error detector 43 will be described below with reference to FIG. 12. The second phase error detector 43 uses a self-running timing. The second phase error detector 43 has a self-running signal with an inversion period equal to 4T. The self-running timing is provided by the self-running signal. Data samples sequentially inputted into the second phase error detector 43 from the interpolator 31 vary in value as shown in FIG. 12. Self-running timings spaced at 4T intervals and provided by the self-running signal are used as zero-cross timings. The second phase error detector 43 senses zero-cross-corresponding points "○" among the input data samples in response to the self-running timings provided by the self-running signal. At each of the timings of the sensed zero-cross-corresponding points "○", the second phase error detector 43 generates a second phase error on the basis of the related data sample. For example, at each of first alternate ones of zero-cross-corresponding points "○", the second phase error detector 43 uses the value of the related data sample as a second phase error. At each of second alternate ones of zero-cross-corresponding points "○", the second phase error detector 43 inverts the polarity (the sign) of the value of the related data sample and uses the inversion-resultant value as a second phase error. Accordingly, the second phase error generated by the second phase error detector 43 varies as shown in FIG. 12.

Figure 13:
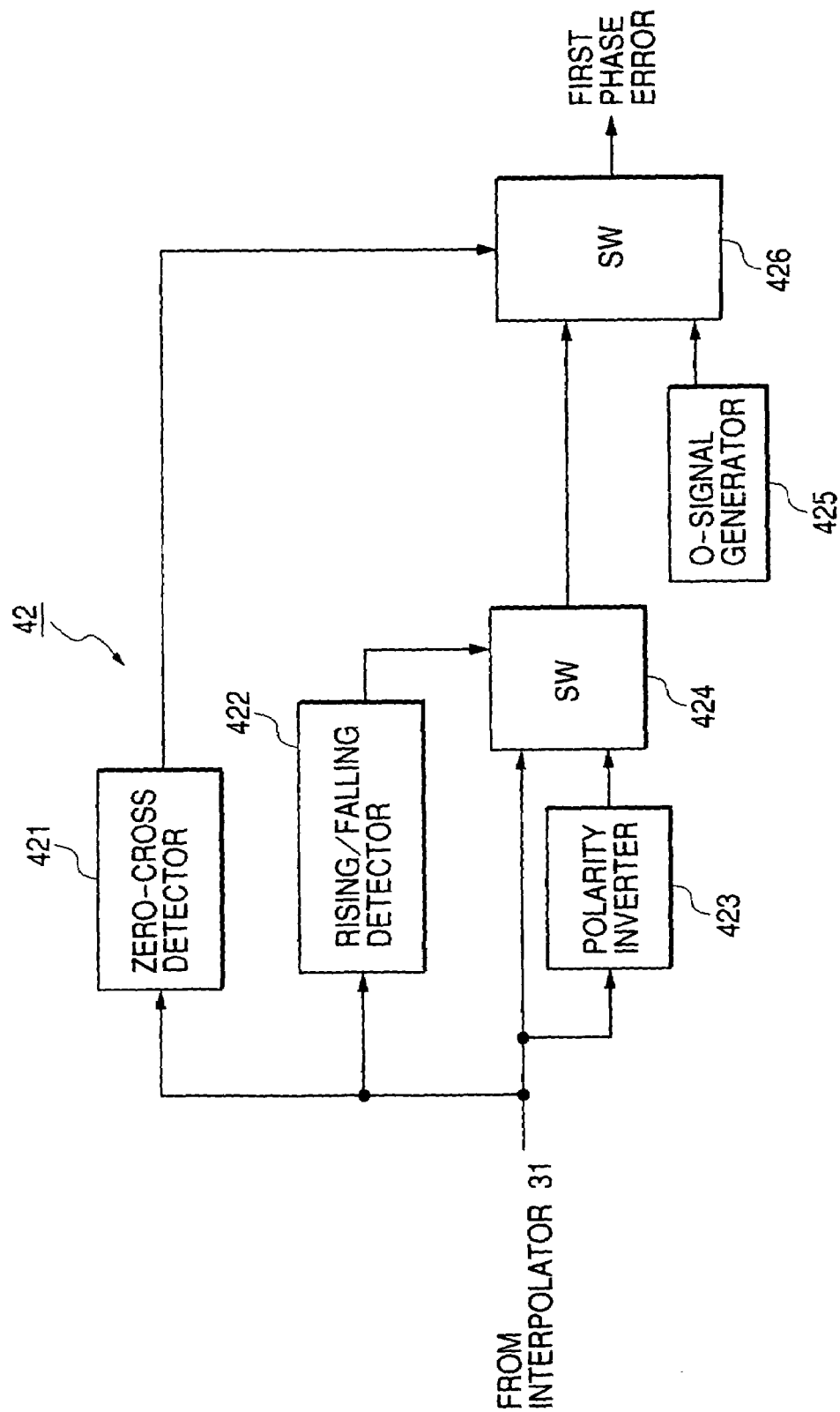
FIG. 13 is a block diagram of the first phase error detector in FIG. 10.

As shown in FIG. 13, the first phase error detector 42 includes a zero-cross detector 421, a rising/falling detector 422, a polarity inverter 423, a switch 424, a 0-signal generator 425, and a switch 426. The zero-cross detector 421 receives a sequence of data samples from the interpolator 31. The zero-cross detector 421 monitors a time-domain behavior of the value represented by the data sample sequence, and detects every zero cross related to the value of the data sample sequence in response to the monitored time-domain behavior. At a timing of the detection of every zero cross, the zero-cross detector 421 outputs a high-level signal to the switch 426. At other timings, the zero-cross detector 421 outputs a low-level signal to the switch 426. The rising/falling detector 422 receives the sequence of data samples from the interpolator 31. The rising/falling detector 422 senses a time-domain change in the value represented by the data sample sequence, and decides whether the value represented by the data sample sequence is rising or falling. The rising/falling detector 422 generates a control signal in response to the result of the decision. The rising/falling detector 422 outputs the generated control signal to the switch 424. The polarity inverter 423 sequentially receives data samples from the interpolator 31. The device 423 inverts the polarities of the data samples, and outputs a sequence of the inversion-resultant data samples to the switch 424. The switch 424 receives the sequence of data samples from the interpolator 31 which is referred to as the sequence of non-inverted data samples. The switch 424 selects either the sequence of the inversion-resultant data samples or the sequence of the non-inverted data samples in response to the output signal of the rising/falling detector 422. Specifically, the switch 424 selects the sequence of the non-inverted data samples when the output signal of the rising/falling detector 422 represents that the data sample value is rising. On the other hand, the switch 424 selects the sequence of the inversion-resultant data samples when the output signal of the rising/falling detector 422 represents that the data sample value is falling. The switch 424 passes the selected data sample sequence to the switch 426. The 0-signal generator 425 feeds a signal representative of a value of zero to the switch 426. At every sample timing, the switch 426 selects one among a data sample outputted from the switch 424 and the 0-signal outputted from the 0-signal generator 425 in response to the output signal of the zero-cross detector 421. Specifically, when the output signal of the zero-cross detector 421 is in its high-level state, that is, when a zero cross is detected, the switch 426 selects a data sample outputted from the switch 424 and passes the selected data sample to the switch 44 (see FIG. 10) as a signal indicative of a first phase error. On the other hand, when the output signal of the zero-cross detector 421 is in its low-level state, the switch 426 selects the 0-signal and passes it to the switch 44 as a signal indicative of a first phase error.

Figure 14:
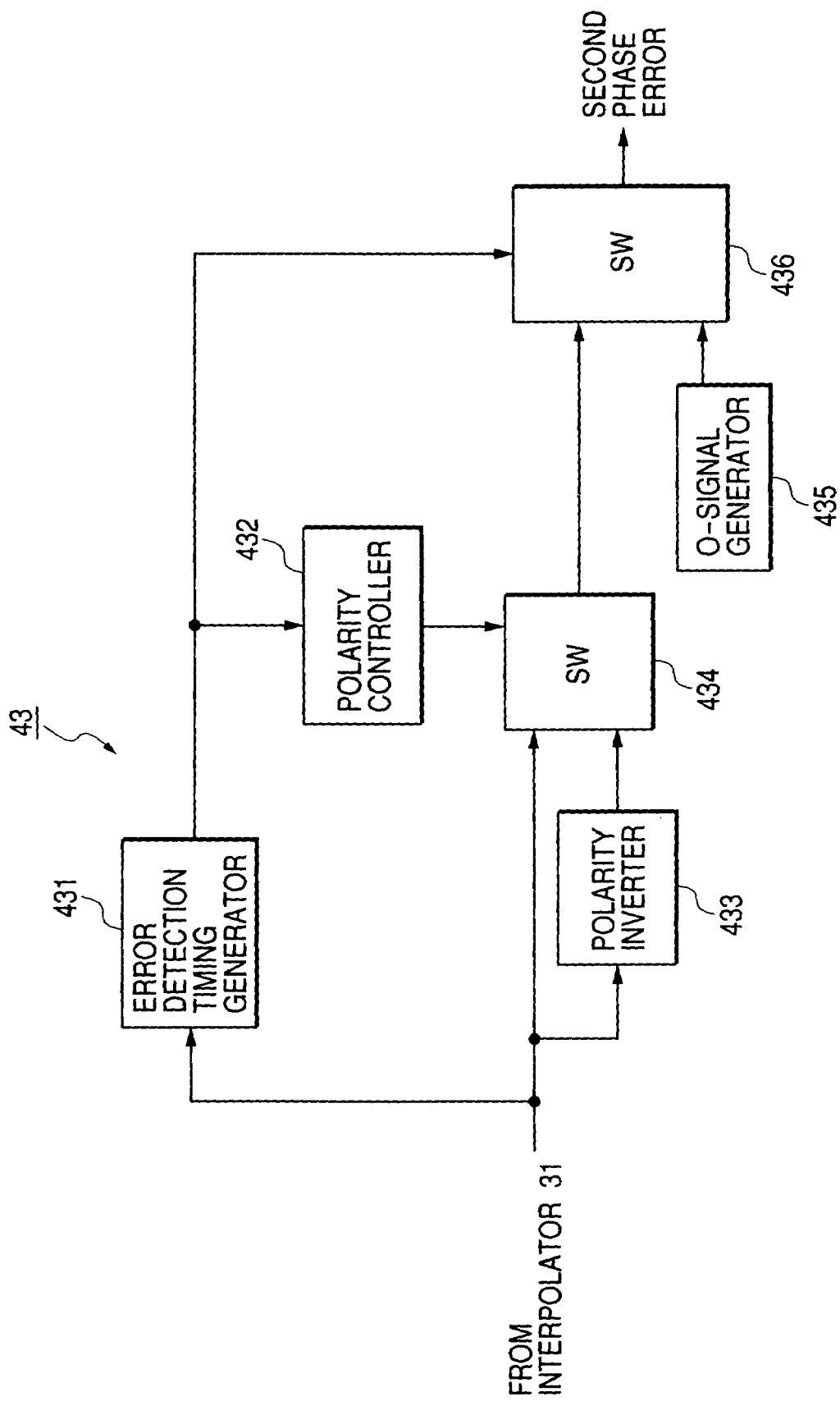
FIG. 14 is a block diagram of the second phase error detector in FIG. 10.

As shown in FIG. 14, the second phase error detector 43 includes an error detection timing generator 431, a polarity controller 432, a polarity inverter 433, a switch 434, a 0-signal generator 435, and a switch 436. The error detection timing generator 431 receives a sequence of data samples from the interpolator 31. The error detection timing generator 431 derives sample timings (self-running sample timings) from the self-running signal. The error detection timing generator 431 selects ones among the derived sample timings which are spaced at 4T intervals by, for example, a frequency dividing procedure. The selected sample timings are defined as self-running zero-cross timings or self-running error detection timings. The error detection timing generator 431 produces a control signal in response to the selected sample timings. The produced control signal is in a high-level state at each of the selected sample timings. The produced control signal is in a low-level state at other timings. The error detection timing generator 431 outputs the produced control signal to the polarity controller 432 and the switch 436. The polarity controller 432 generates a control signal in response to the output signal of the error detection timing generator 431. The control signal generated by the polarity controller 432 changes between a low level state and a high level state each time the output signal of the error detection timing generator 431 assumes its high level state. For example, the control signal changes from its low level state to its high level state in response to a low-to-high transition of the output signal of the error detection timing generator 431. Then, the control signal returns from its high level state to its low level state in response to a next low-to-high transition of the output signal of the error detection timing generator 431. The polarity controller 432 includes, for example, a flip-flop or a bi-stable multivibrator. The polarity controller 432 outputs the generated control signal to the switch 434. The polarity inverter 433 sequentially receives data samples from the interpolator 31. The device 433 inverts the polarities of the data samples, and outputs a sequence of the inversion-resultant data samples to the switch 434. The switch 434 receives the sequence of data samples from the interpolator 31 which is referred to as the sequence of non-inverted data samples. The switch 434 selects either the sequence of the inversion-resultant data samples or the sequence of the non-inverted data samples in response to the output signal of the polarity controller 432. For example, the switch 434 selects the sequence of the non-inverted data samples when the output signal of the polarity controller 432 is in its low level state. On the other hand, the switch 434 selects the sequence of the inversion-resultant data samples when the output signal of the polarity controller 432 is in its high level state. The switch 434 passes the selected data sample sequence to the switch 436. The 0-signal generator 435 feeds a signal representative of a value of zero to the switch 436. At every sample timing, the switch 436 selects one among a data sample outputted from the switch 434 and the 0-signal outputted from the 0-signal generator 435 in response to the output signal of the error detection timing generator 431. Specifically, when the output signal of the error detection timing generator 431 is in its high-level state, that is, when a self-running zero-cross timing or a self-running error detection timing has come, the switch 436 selects a data sample outputted from the switch 434 and passes the selected data sample to the switch 44 (see FIG. 10) as a signal indicative of a second phase error. On the other hand, when the output signal of the error detection timing generator 431 is in its low-level state, the switch 436 selects the 0-signal and passes it to the switch 44 as a signal indicative of a second phase error.

Figure 15:
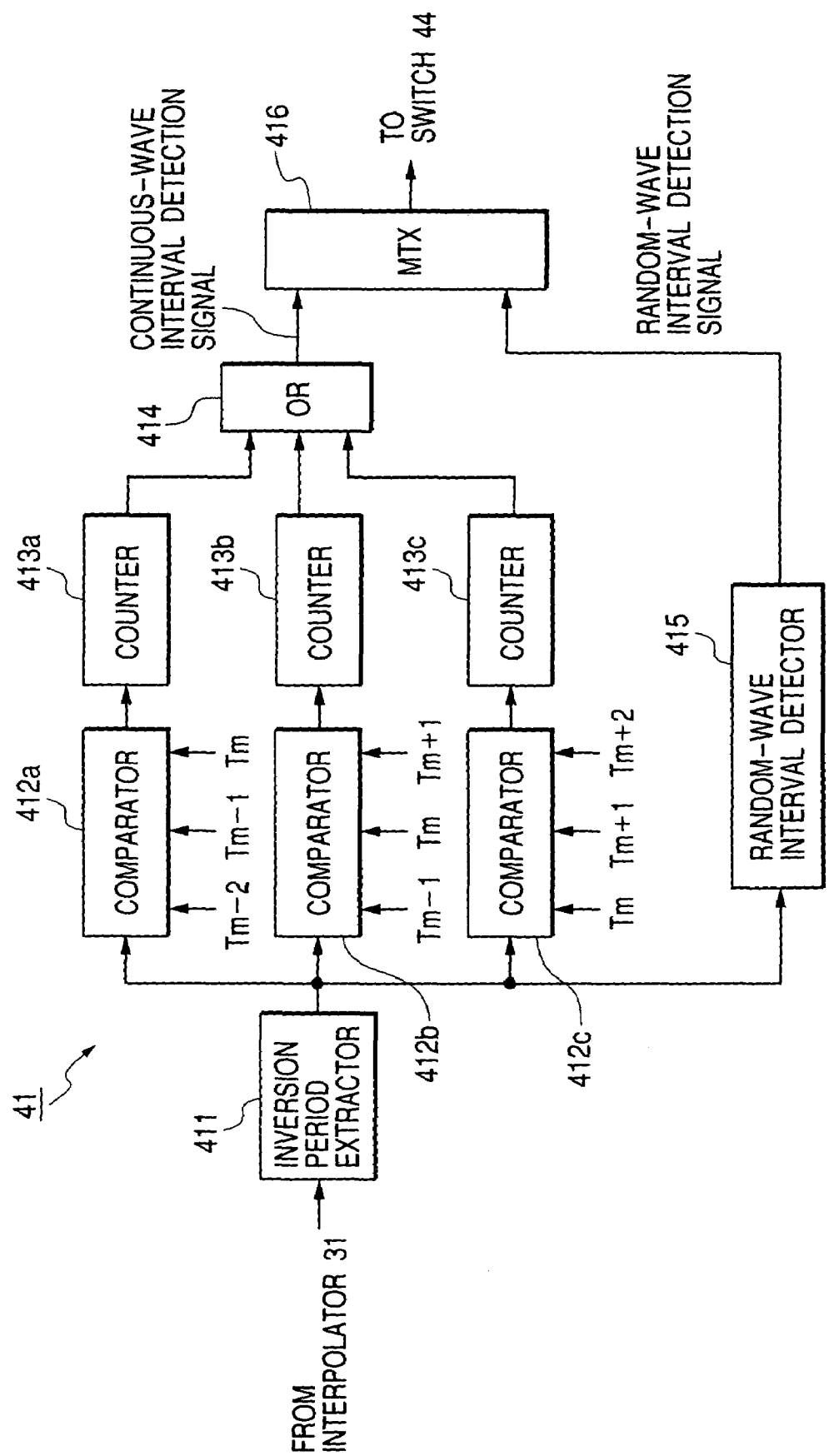
FIG. 15 is a block diagram of a signal condition detector in FIG. 10.

As shown in FIG. 15, the signal condition detector 41 includes an inversion period extractor 411, comparators 412a, 412b, and 412c, counters 413a, 413b, and 413c, an OR circuit 414, a random-wave interval detector 415, and a matrix device 416. The inversion period extractor 411 receives a sequence of data samples from the interpolator 31. The inversion period extractor 411 detects every change in polarity (sign) of the received data sample sequence. The inversion period extractor 411 counts data samples between the latest polarity change and the immediately preceding polarity change to detect an inversion period Tn for the timing "n" of the latest polarity change, where "n" denotes a serially incremented integer. The detected inversion periods are denoted by T1, T2, T3, . . . , Tn, and the oldest one is indicated by T1 and the latest one is indicated by Tn. The inversion period extractor 411 outputs a signal representative of the detected inversion period Tn to the comparators 412a, 412b, 412c, and the random-wave interval detector 415.

The reference letters Tm denote an inversion period of 4T, that is, the inversion period corresponding to the continuous wave. The comparator 412a receives, from a suitable device, a signal representing an inversion period Tm−2 equal to the inversion period Tm minus 2 (2T), a signal representing the inversion period Tm−1 equal to the inversion period Tm minus 1 (1·T), and a signal representing the inversion period Tm, where the character "·" denotes product. The comparator 412b receives, from a suitable device, a signal representing the inversion period Tm−1, a signal representing the inversion period Tm, and a signal representing an inversion period Tm+1 equal to the inversion period Tm plus 1 (1·T). The comparator 412c receives, from a suitable device, a signal representing the inversion period Tm, a signal representing the inversion period Tm+1, and a signal representing an inversion period Tm+2 equal to the inversion period Tm plus 2 (2T). The device 412a compares the detected inversion period Tn with the inversion periods Tm−2, Tm−1, and Tm, and thereby decides whether or not the detected inversion period Tn is equal to one of the inversion periods Tm−2, Tm−1, and Tm. When the detected inversion period Tn is equal to one of the inversion periods Tm−2, Tm−1, and Tm, the comparator 412a outputs a signal of "1" to the counter 413a. Otherwise, the comparator 412a outputs a signal of "0" to the counter 413a. The device 412b compares the detected inversion period Tn with the inversion periods Tm−1, Tm, and Tm+1, and thereby decides whether or not the detected inversion period Tn is equal to one of the inversion periods Tm−1, Tm, and Tm+1. When the detected inversion period Tn is equal to one of the inversion periods Tm−1, Tm, and Tm+1, the comparator 412b outputs a signal of "1" to the counter 413b. Otherwise, the comparator 412b outputs a signal of "0" to the counter 413b. The device 412c compares the detected inversion period Tn with the inversion periods Tm, Tm+1, and Tm+2, and thereby decides whether or not the detected inversion period Tn is equal to one of the inversion periods Tm, Tm+1, and Tm+2. When the detected inversion period Tn is equal to one of the inversion periods Tm, Tm+1, and Tm+2, the comparator 412c outputs a signal of "1" to the counter 413c. Otherwise, the comparator 412c outputs a signal of "0" to the counter 413c.

The device 413a counts signals of "1" which are successively outputted from the comparator 412a. The counter 413a compares the number of successively outputted signals of "1" with a prescribed number N. When the number of successively outputted signals of "1" is equal to or greater than the prescribed number N, the counter 413a outputs a signal of "1" to the OR circuit 414. Otherwise, the counter 413a outputs a signal of "0" to the OR circuit 414. The device 413b counts signals of "1" which are successively outputted from the comparator 412b. The counter 413b compares the number of successively outputted signals of "1" with the prescribed number N. When the number of successively outputted signals of "1" is equal to or greater than the prescribed number N, the counter 413b outputs a signal of "1" to the OR circuit 414. Otherwise, the counter 413b outputs a signal of "0" to the OR circuit 414. The device 413c counts signals of "1" which are successively outputted from the comparator 412c. The counter 413c compares the number of successively outputted signals of "1" with the prescribed number N. When the number of successively outputted signals of "1" is equal to or greater than the prescribed number N, the counter 413c outputs a signal of "1" to the OR circuit 414. Otherwise, the counter 413c outputs a signal of "0" to the OR circuit 414.

The OR circuit 414 executes OR operation among the output signals of the counters 413a, 413b, and 413c. The OR circuit 414 outputs a signal representative of the OR-operation result to the matrix device 416 as a continuous-wave interval detection signal. Specifically, the output signal of the OR circuit 414 which is "1" indicates that the reproduced signal (the output signal of the interpolator 31) is in a continuous-wave interval. On the other hand, the output signal of the OR circuit 414 which is "0" indicates that the reproduced signal is not in a continuous-wave interval.

As previously mentioned, a sync signal existing in the head of every random-wave interval has a first portion corresponding to an inversion period of 14T and a second portion corresponding to an inversion period of 4T. The characters Ts denote an inversion period of 14T, that is, the inversion period corresponding to the first portion of the sync signal. The random-wave interval detector 415 has a signal representative of a preset inversion period Tu which is chosen to satisfy the following relation.

$$Tm < Tu \leq Ts$$

The random-wave interval detector 415 compares the detected inversion period Tn with the preset inversion period Tu. When the detected inversion period Tn is equal to or greater than the preset inversion period Tu, the random-wave interval detector 415 outputs a signal of "1" to the matrix device 416. Otherwise, the random-wave interval detector 415 outputs a signal of "0" to the matrix device 416. The output signal of the random-wave interval detector 415 constitutes a random-wave interval detection signal. Specifically, the output signal of the random-wave interval detector 415 which is "1" indicates that the reproduced signal (the output signal of the interpolator 31) is in a random-wave interval. On the other hand, the output signal of the random-wave interval detector 415 which is "0" indicates that the reproduced signal is not in a random-wave interval.

The matrix device 416 executes matrix operation among the continuous-wave interval detection signal (the output signal of the OR circuit 414, the random-wave interval detection signal (the output signal of the random-wave interval detector 415), and an internally-stored signal to generate a control signal for the switch 44. The matrix device 416 outputs the generated control signal to the switch 44.

Figure 16:
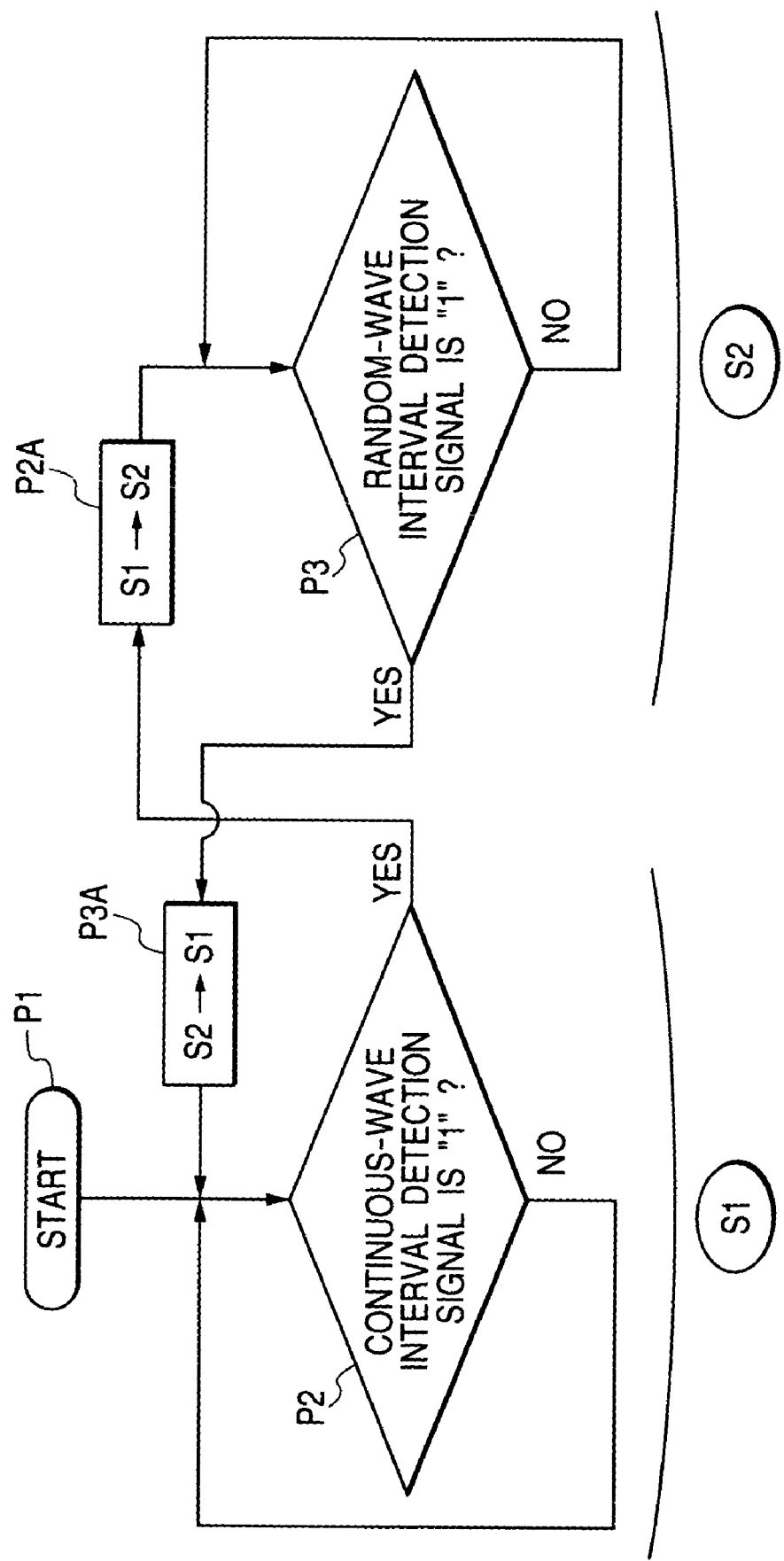
FIG. 16 is a flowchart of a control program for a matrix device in FIG. 15.

The matrix device 416 may include a digital signal processor, a CPU, or a similar device which operates in accordance with a control program stored therein. FIG. 16 is a flowchart of the control program for the matrix device 416. The control program starts from a step P1 which corresponds to the operation state S1 (see FIGS. 6 and 7) of the reproducing apparatus, and which sets the control signal in a state representing that the reproduced signal (the output signal of the interpolator 31) is in a random-wave interval. The step P1 is followed by a step P2. The step P2 decides whether or not the continuous-wave interval detection signal is "1". When the step P2 decides that the continuous-wave interval detection signal is "1", the program advances from the step P2 to a step P2A which changes the control signal to a state representing that the reproduced signal (the output signal of the interpolator 31) is in a continuous-wave interval. Therefore, the reproducing apparatus changes from the operation state S1 to the operation state S2 (see FIGS. 6 and 7). On the other hand, when it is decided that the continuous-wave interval detection signal is not "1", the step P2 is repeated. The step P2A is followed by a step P3. The step P3 decides whether or not the random-wave interval detection signal is "1". When the step P3 decides that the random-wave interval detection signal is "1", the program advances from the step P3 to a step P3A which changes the control signal to the state representing that the reproduced signal (the output signal of the interpolator 31) is in a random-wave interval. Therefore, the reproducing apparatus changes from the operation state S2 to the operation state S1. On the other hand, when it is decided that the random-wave interval detection signal is not "1", the step P3 is repeated. The step P3A is followed by the step P2.

A comparative reproducing apparatus is made by modifying the reproducing apparatus of FIG. 8. Specifically, the comparative reproducing apparatus includes a modified phase detector in a re-sampling DPLL section. The signal condition detector 41, the second phase error detector 43, and the switch 44 (see FIG. 10) are omitted from the modified phase detector. Thus, the modified phase detector includes only the first phase error detector 42 which is directly followed by the loop filter 33 (see FIG. 9).

Figure 17:
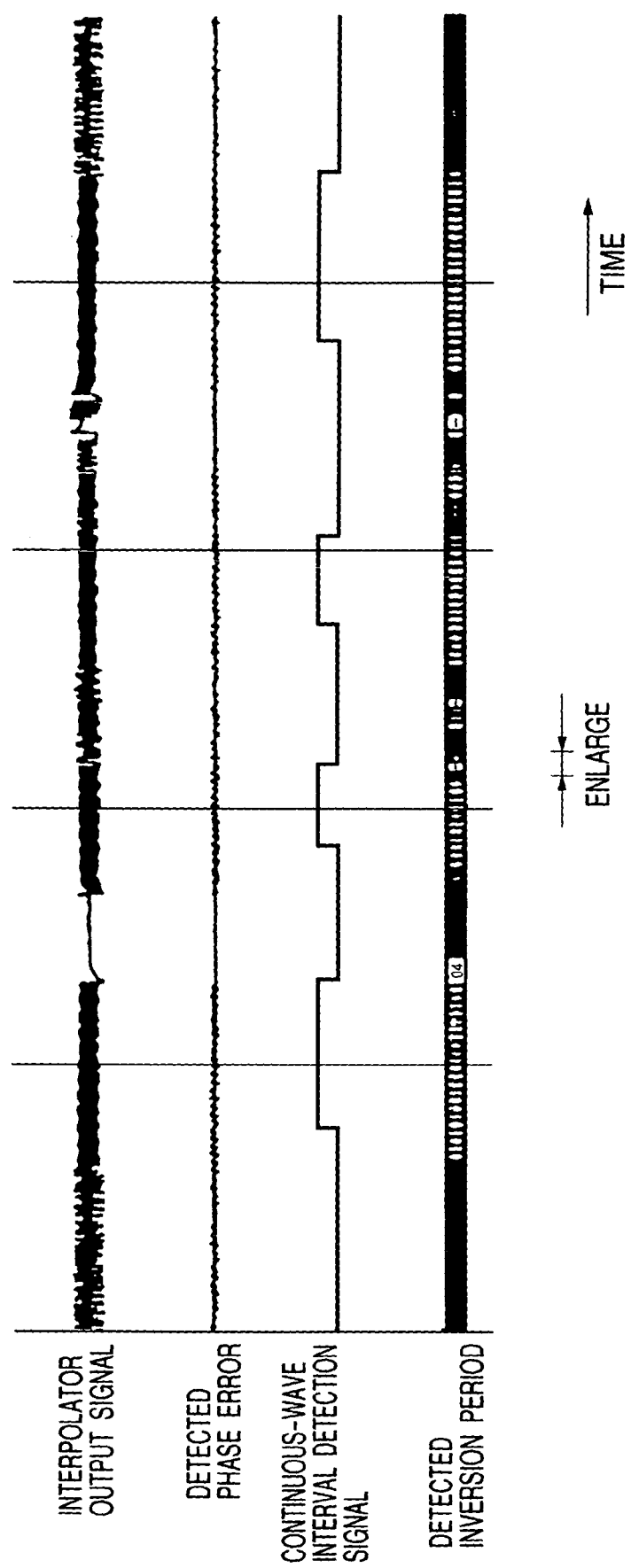
FIG. 17 is a time-domain diagram of an output signal of an interpolator, a phase error detected by a modified phase detector, a continuous-wave interval detection signal, and a detected inversion period which occur in a comparative reproducing apparatus.
Figure 18:
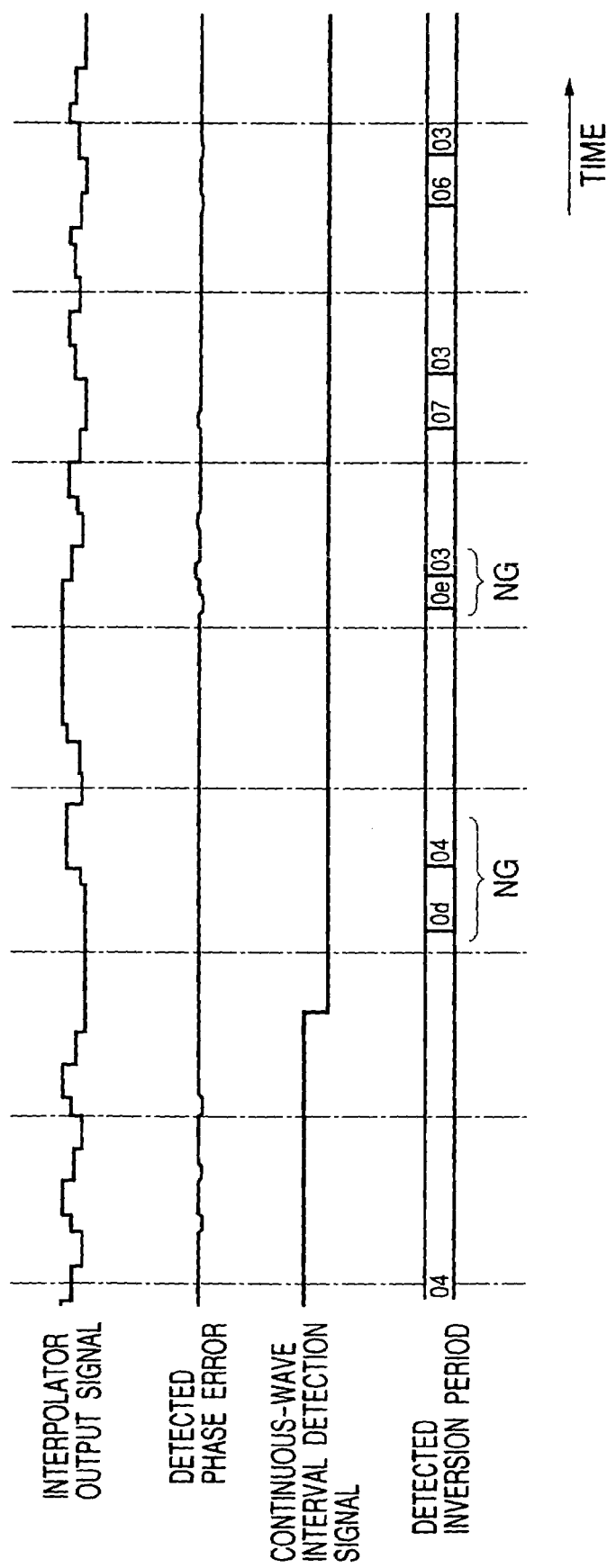
FIG. 18 is an enlarged view of a portion of FIG. 17.

FIGS. 17 and 18 show the output signal of the interpolator 31, the phase error detected by the modified phase detector, the continuous-wave interval detection signal, and the detected inversion period which occur in the comparative reproducing apparatus. In FIGS. 17 and 18, the detected inversion period has errors in both waveform regions above and below zero, and therefore the re-sampling DPLL section can not move out of a side locked state (a wrong locked state). As a result, it is difficult to correctly detect the continuous-wave interval in which a constant inversion period of 4T repetitively occurs. Also, it is difficult to correctly detect the sync signal which follows the continuous-wave interval, and which has a succession of inversion periods as 4T·14T·4T·4T·14T·4T.

Figure 19:
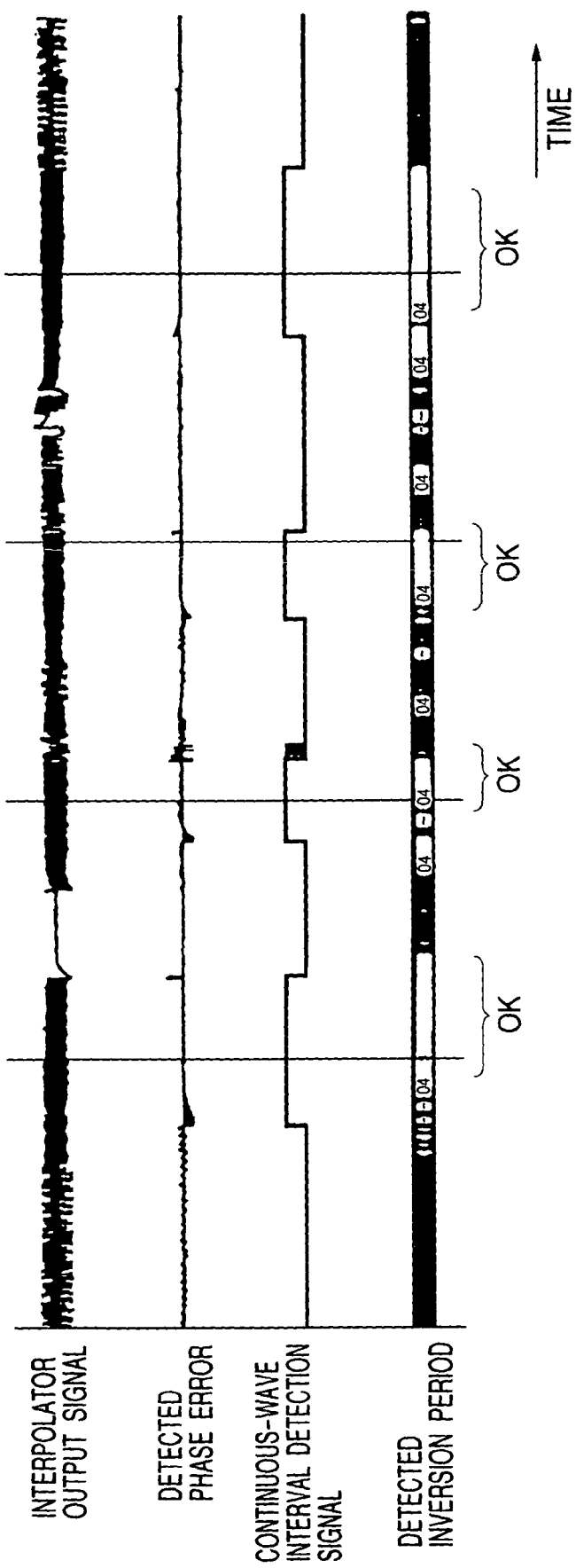
FIG. 19 is a time-domain diagram of an output signal of an interpolator, a phase error detected by a phase detector, a continuous-wave interval detection signal, and a detected inversion period which occur in the reproducing apparatus of FIG. 8.
Figure 20:
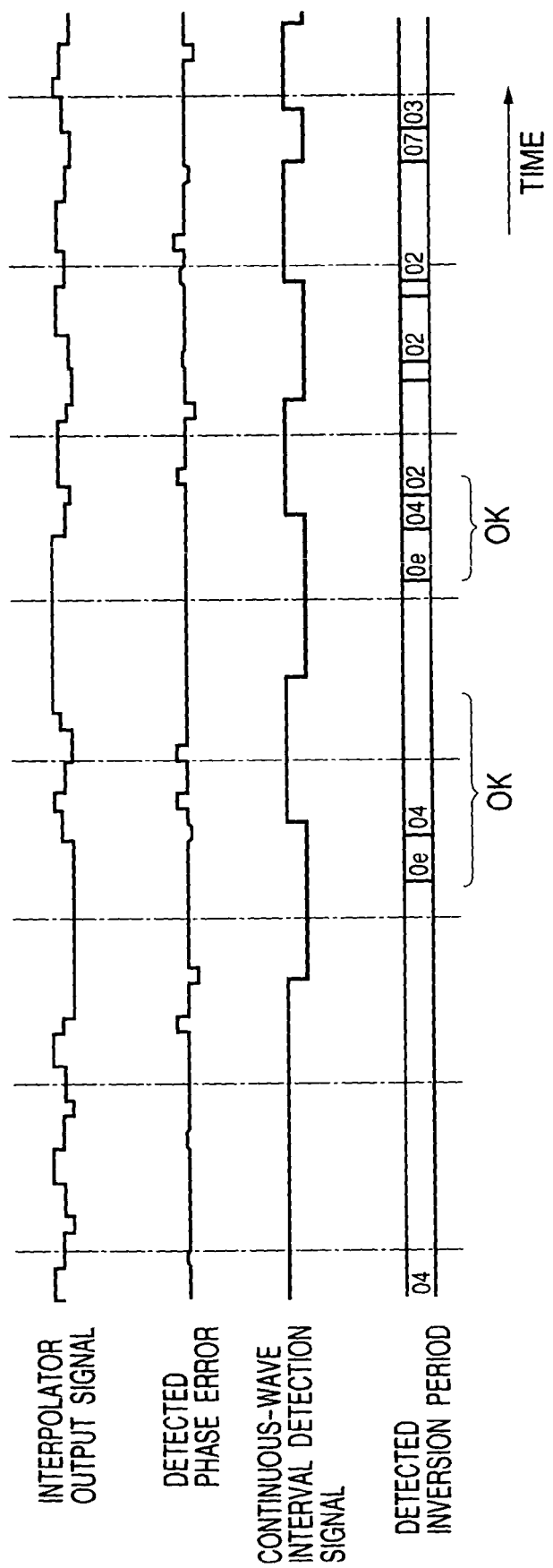
FIG. 20 is an enlarged view of a portion of FIG. 19.

FIGS. 19 and 20 show the output signal of the interpolator 31, the phase error detected by the phase detector 32, the continuous-wave interval detection signal, and the detected inversion period which occur in the reproducing apparatus of FIG. 8. As previously mentioned, the phase detector 32 decides whether the output signal of the interpolator 31 is in a continuous-wave interval or a random-wave interval. When it is decided that the output signal of the interpolator 31 is in a continuous-wave interval, the device 32 detects a phase error on the basis of a self-running timing rather than a zero-cross timing. With reference to FIGS. 19 and 20, the re-sampling DPLL section 15 can move out of a side locked state (a wrong locked state). As a result, it is possible to correctly detect the continuous-wave interval in which a constant inversion period of 4T repetitively occurs. Also, it is possible to correctly detect the sync signal which follows the continuous-wave interval, and which has a succession of inversion periods as 4T·14T·4T·4T·4T·4T.

The signal condition detector 41 in FIGS. 10 and 15 may be modified as follows. The modified signal condition detector includes a slope inversion period extractor which receives a sequence of data samples from the interpolator 31. The slope inversion period extractor detects every rising period for which the received sample sequence rises in value, and every falling period for which the received sample sequence falls in value. The modified signal condition detector includes first, second, and third comparators instead of the comparators 412a, 412b, and 412c. The first comparator decides whether or not the latest period (the latest rising period or the latest falling period) Z detected by the slope inversion period extractor satisfies the following relation:

$2X-1 \leq Z \leq 2X+1$ (that is, $2X-T \leq Z \leq 2X+T$)

where X denotes an inversion period equal to 4T. When the latest period Z satisfies the above-indicated relation, the first comparator outputs a signal of "1" to the counter 413a. Otherwise, the first comparator outputs a signal of "0" to the counter 413a. The second comparator decides whether or not the latest period Z satisfies the following relation:

$2X-2 \leq Z \leq 2X$ (that is, $2X-2T \leq Z \leq 2X$)

When the latest period Z satisfies the above-indicated relation, the second comparator outputs a signal of "1" to the counter 413b. Otherwise, the second comparator outputs a signal of "0" to the counter 413b. The third comparator decides whether or not the latest period Z satisfies the following relation:

$2X \leq Z \leq 2X+2$ (that is, $2X \leq Z \leq 2X+2T$)

When the latest period Z satisfies the above-indicated relation, the third comparator outputs a signal of "1" to the counter 413c. Otherwise, the third comparator outputs a signal of "0" to the counter 413c.

Second Embodiment

A recording medium such as an optical disc stores a signal representative of digital information. The recording medium has a recording area divided into main segments and sub segments which alternate with each other along the direction of scanning of the recording medium. Preferably, each of the heads of the main segments is occupied by a sync signal having a special bit sequence pattern. The sync pattern is divided into longer-period portions corresponding to an inversion period equal to 14T and shorter-period portions corresponding to an inversion period equal to 4T, where T denotes a bit period. Alternatively, the sync pattern may be divided into portions including shorter-period portions corresponding to inversion periods of less than 9T and longer-period portions each corresponding to an inversion period of 9T. The post-head regions of the main segments are loaded with portions of user data, respectively. Each of the sub segments is loaded with repetition of a specified bit sequence pattern corresponding to a succession of predetermined inversion periods. A first example of the succession of the predetermined inversion periods is "5T·5T·3T·3T·2T·2T". A second example of the succession of the predetermined inversion periods is "2T·2T·3T·3T·5T·5T". The succession of the predetermined inversion periods may differ from the above-indicated examples. The repetition of the specified bit sequence pattern is reproduced as a wave which cyclically reflects the above-mentioned succession of the predetermined inversion periods.

A reproducing apparatus of a second embodiment of this invention reproduces a signal from the recording medium, and thereby gets a reproduced signal representative of digital information. The reproduced signal has a waveform such as shown in FIG. 21.

Figure 21:
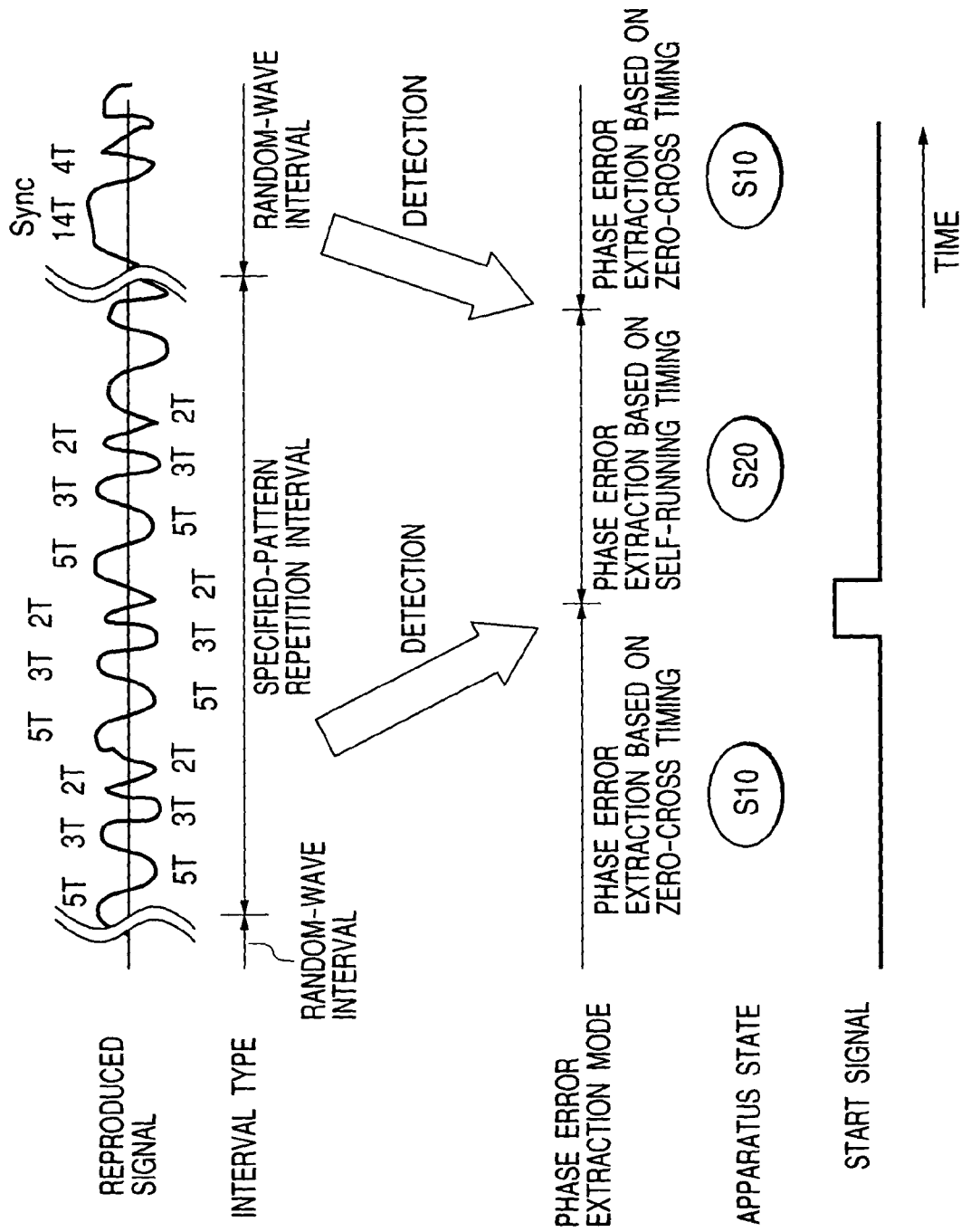
FIG. 21 is a time-domain diagram of a reproduced signal, an interval type, a phase error extraction mode, a reproducing apparatus state, and a start signal in a second embodiment of this invention.

With reference to FIG. 21, regarding the reproduced signal, there are random-wave intervals between which specified-pattern repetition intervals extend. The reproduced signal in the random-wave intervals originates from the sync signals and the user data in the main segments of the recording area of the recording medium. The reproduced signal in the initial parts of the random-wave intervals reflects reproduced sync signals each including at least one longer-period portion corresponding to an inversion period of 14T and at least one shorter-period portion corresponding to an inversion period of 4T. The sync signal may include shorter-period portions and longer-period portions each corresponding to an inversion period of 9T. The reproduced signal in the later parts of the random-wave intervals has a period which changes depending on the user data, and thus which appears to vary at random. The reproduced signal in the specified-pattern repetition intervals originates from the repetitions of the specified bit sequence pattern in the sub segments of the recording area of the recording medium. The reproduced signal in the specified-pattern repetition intervals cyclically reflects a succession of inversion periods, for example, "5T·5T·3T·3T·2T·2T" or "2T·2T·3T·3T·5T·5T".

Basic operation of the reproducing apparatus will be described below with reference to FIG. 21. The reproducing apparatus includes a section for detecting every specified-pattern repetition interval and also every random-wave interval regarding a reproduced signal. The reproducing apparatus further includes a PLL-based section for extracting a phase error in either a first method or a second method. Here, PLL is short for a phase locked loop. The first method uses a zero-cross timing. The second method uses a self-running timing. Upon the detection of a specified-pattern repetition interval, the method of extracting a phase error on a zero-cross-timing basis is replaced by that on a self-running-timing basis. Upon the detection of a random-wave interval, the method of extracting a phase error on a self-running-timing basis is replaced by that on a zero-cross-timing basis. The characters S10 denote the operation state of the reproducing apparatus in which the method of extracting a phase error on a zero-cross-timing basis is carried out. The characters S20 denote the operation state of the reproducing apparatus in which the method of extracting a phase error on a self-running-timing basis is carried out. Normally, the operation state S10 and the operation state S20 alternate with each other.

Figure 22:
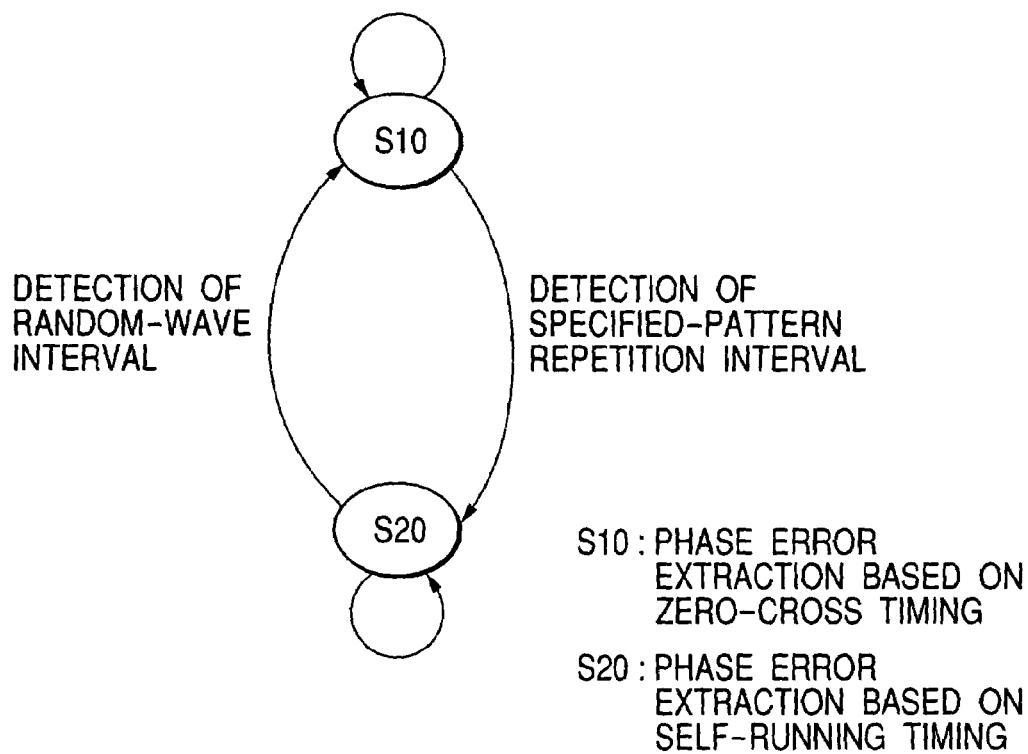
FIG. 22 is a diagram of transitions between different reproducing-apparatus operation states in the second embodiment of this invention.

FIG. 22 shows transitions between the operation states S10 and S20 of the reproducing apparatus. The reproducing apparatus changes to or remains in the operation state S110 when a random-wave interval is detected. The reproducing apparatus changes to or remains in the operation state S20 when a specified-pattern repetition interval is detected.

Figure 23:
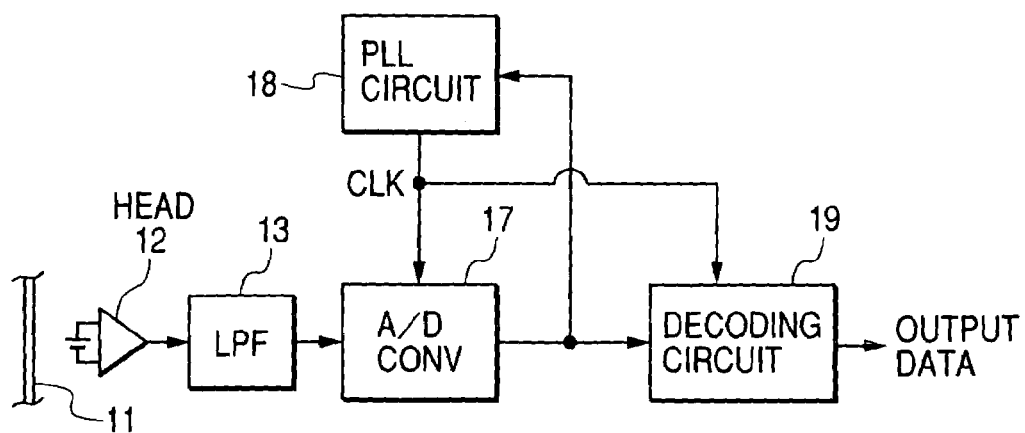
FIG. 23 is a block diagram of a reproducing apparatus in the second embodiment of this invention.

FIG. 23 shows the reproducing apparatus in the second embodiment of this invention. The reproducing apparatus of FIG. 23 is similar to that of FIG. 8 except for design changes mentioned hereafter. The reproducing apparatus of FIG. 23 includes an A/D converter 17 instead of the A/D converter 14 in FIG. 8. The A/D converter 17 is followed by a PLL circuit 18 and a decoding circuit 19.

The PLL circuit 18 generates a bit clock signal (a system clock signal) in response to an output signal of the A/D converter 17. The PLL circuit 18 may respond to a signal resulting from filtering the output signal of the A/D converter 17. The PLL circuit 18 feeds the generated bit clock signal to the A/D converter 17 and the decoding circuit 19. The A/D converter 17 changes an output signal of a low pass filter 13 into a corresponding digital signal. Specifically, the A/D converter 17 periodically samples the output signal of the low pass filter 13 in response to the bit clock signal, and converts every resultant sample into a digital sample. The A/D converter 17 outputs the digital signal, that is, a sequence of the digital samples, to the PLL circuit 18 and the decoding circuit 19. The decoding circuit 19 is basically similar to the decoding circuit 16 in FIG. 8. The decoding circuit 19 subjects the output signal of the A/D converter 17 to waveform equalization and a viterbi decoding procedure responsive to the bit clock signal to recover original data. The decoding circuit 19 outputs the recovered data to an ECC (error checking and correcting) circuit which is not shown in FIG. 23.

Figure 24:
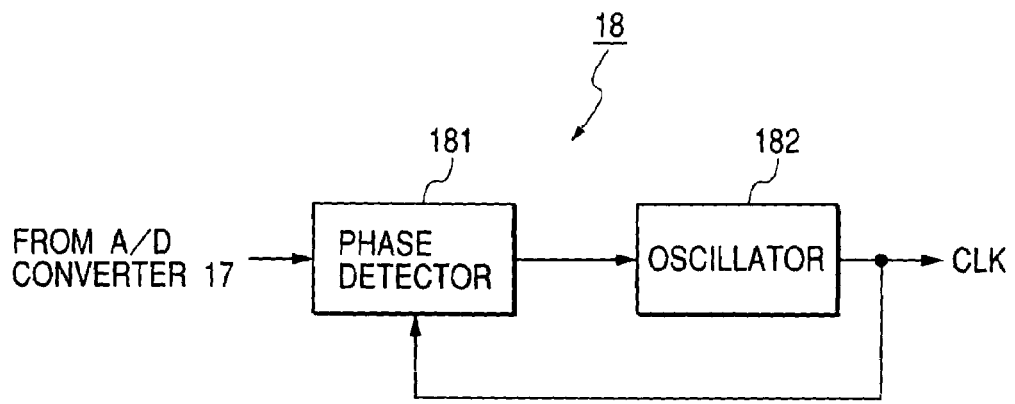
FIG. 24 is a block diagram of a PLL circuit in FIG. 23.

As shown in FIG. 24, the PLL circuit 18 includes a phase detector 181 and an oscillator 182. The phase detector 181 receives the output signal of the A/D converter 17 (see FIG. 23). The phase detector 181 decides whether the output signal of the A/D converter 17 is in a specified-pattern repetition interval or a random-wave interval. The phase detector 181 extracts a phase error in a method depending on whether the output signal of the A/D converter 17 is in a specified-pattern repetition interval or a random-wave interval. The phase detector 181 outputs a signal representative of the extracted phase error to the oscillator 182. The oscillator 182 generates a bit clock signal (a system clock signal) in response to the phase error signal. The oscillator 182 feeds the bit clock signal to the A/D converter 17 and the decoding circuit 19 (see FIG. 23). In addition, the oscillator 182 feeds the bit clock signal back to the phase detector 181. The phase error extracted by the phase detector 181 means the phase error of the output signal of the A/D converter 17 relative to the bit clock signal. The phase detector 181 is controlled by the bit clock signal in the direction of reducing the phase error. Thus, the phase detector 181 and the oscillator 182 compose a PLL loop for generating a bit clock signal (a system clock signal) locked to the output signal of the A/D converter 17. A loop filter (not shown) may be interposed between the phase detector 181 and the oscillator 182.

Figure 25:
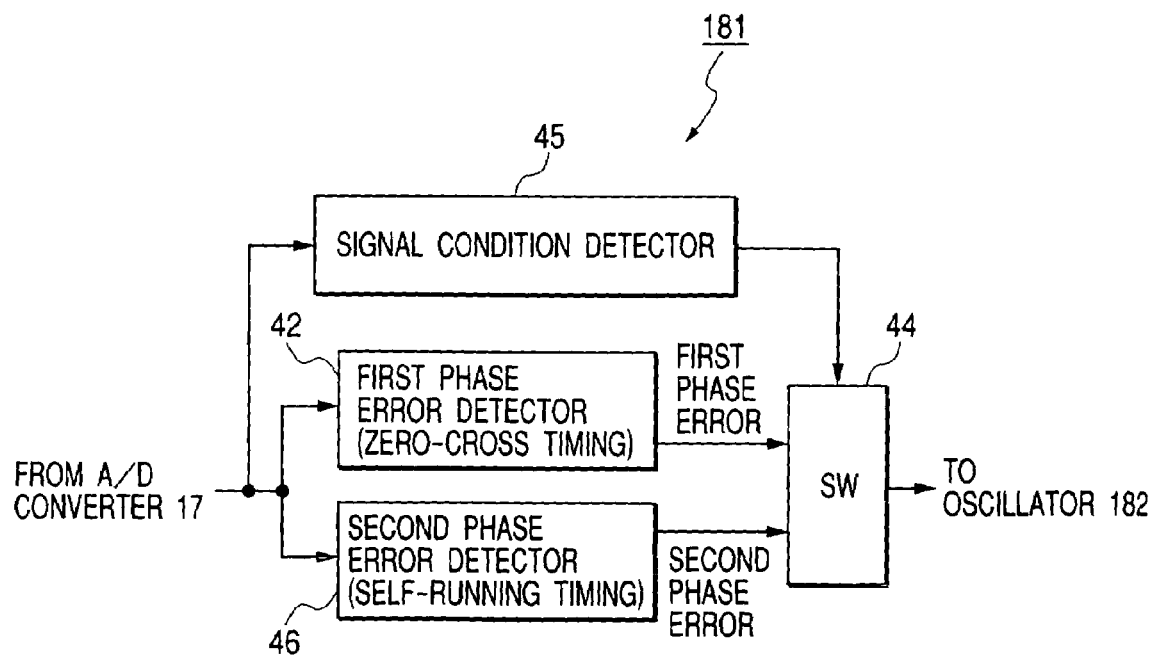
FIG. 25 is a block diagram of a phase detector in FIG. 24.

As shown in FIG. 25, the phase detector 181 includes a first phase error detector 42, a switch 44, a signal condition detector 45, and a second phase error detector 46 to which operation timings are given by a system clock signal being the bit clock signal outputted from the oscillator 182 (see FIG. 24). The first phase error detector 42 and the switch 44 are similar to those in FIG. 10. The signal condition detector 45 receives the output signal of the A/D converter 17 (see FIG. 23). The signal condition detector 45 decides whether the output signal of the A/D converter 17 is in a specified-pattern repetition interval or a random-wave interval by referring to a condition of the output signal of the A/D converter 17. The signal condition detector 45 generates a control signal in response to the result of the decision. The generated control signal is "1" when the decision result indicates that the output signal of the A/D converter 17 is in a specified-pattern repetition interval. The generated control signal is "0" when the decision result indicates that the output signal of the A/D converter 17 is in a random-wave interval. The signal condition detector 45 outputs the generated control signal to the switch 44. The first phase error detector 42 receives the output signal of the A/D converter 17. The first phase error detector 42 receives the bit clock signal from the oscillator 182. The first phase error detector 42 derives every zero-cross timing from the output signal of the A/D converter 17, and detects the phase error of the derived zero-cross timing relative to the bit clock signal. The detected phase error is defined as a first phase error of the output signal of the A/D converter 17 relative to the bit clock signal. The first phase error detector 42 generates a signal representative of the first phase error. The first phase error detector 42 feeds the first phase error signal to the switch 44. The second phase error detector 46 receives the output signal of the A/D converter 17. The second phase error detector 46 receives the bit clock signal from the oscillator 182. The device 46 detects a second phase error of the output signal of the A/D converter 17 on the basis of a self-running timing decided by the bit clock signal. The second phase error detector 46 generates a signal representative of the detected second phase error. The second phase error detector 46 feeds the second phase error signal to the switch 44. The switch 44 selects one of the first and second phase error signals in response to the control signal outputted by the signal condition detector 45. Specifically, the switch 44 selects the first phase error signal when the control signal is "0", that is, when the output signal of the A/D converter 17 is in a random-wave interval. On the other hand, the switch 44 selects the second phase error signal when the control signal is "1", that is, when the output signal of the A/D converter 17 is in a specified-pattern repetition interval. The switch 44 passes the selected phase error signal to the oscillator 182.

Figure 26:
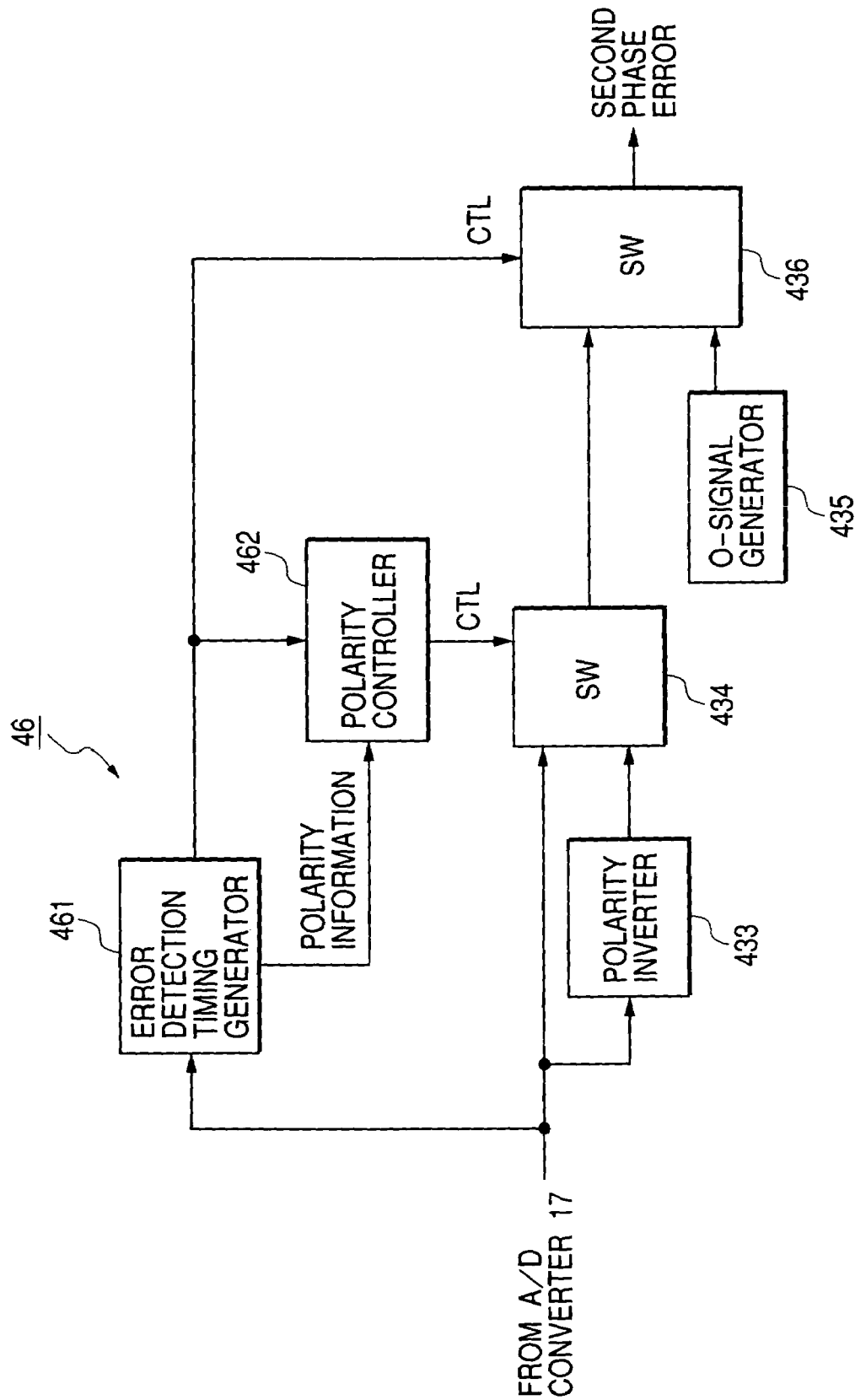
FIG. 26 is a block diagram of a second phase error detector in FIG. 25.

As shown in FIG. 26, the second phase error detector 46 includes an error detection timing generator 461, a polarity controller 462, a polarity inverter 433, a switch 434, a 0-signal generator 435, and a switch 436 to which operation timings are given by the system clock signal being the bit clock signal outputted from the oscillator 182 (see FIG. 24). The polarity inverter 433, the switch 434, the 0-signal generator 435, and the switch 436 are similar to those in FIG. 14. The error detection timing generator 461 receives the output signal of the A/D converter 17 (see FIG. 23). The error detection timing generator 461 receives the bit clock signal from the oscillator 182. The error detection timing generator 461 decides a start timing in response to the output signal of the A/D converter 17. The decided start timing is defined with respect to the bit clock signal. The decided start timing is iteratively given. The error detection timing generator 461 derives sample timings (self-running sample timings) from the bit clock signal. The error detection timing generator 461 selects ones among the derived sample timings after the start timing has been decided. The selected sample timings are defined as self-running zero-cross timings or self-running error detection timings. The error detecting timing generator 461 produces a first control signal in response to the selected sample timings. The first control signal is in a high-level state at each of the selected sample timings. The first control signal is in a low-level state at other timings. The error detection timing generator 461 outputs the first control signal to the polarity controller 462 and the switch 436. The error detection timing generator 461 produces polarity information in connection with the self-running error detection timings (the self-running zero-cross timings) after the start timing has been decided. The error detection timing generator 461 outputs the produced polarity information to the polarity controller 462. The polarity controller 462 generates a second control signal in response to the first control signal and the polarity information from the error detection timing generator 461. The second control signal changes between a low level state and a high level state each time the first control signal assumes its high level state. For example, the second control signal changes from its low level state to its high level state in response to a low-to-high transition of the first control signal. Then, the second control signal returns from its high level state to its low level state in response to a next low-to-high transition of the first control signal. The polarity information determines which of the high level state and the low level state the second control signal takes. The polarity controller 462 outputs the second control signal to the switch 434. The polarity inverter 433 sequentially receives data samples from the A/D converter 17. The device 433 inverts the polarities of the data samples, and outputs a sequence of the inversion-resultant data samples to the switch 434. The switch 434 receives the sequence of data samples from the A/D converter 17 which is referred to as the sequence of non-inverted data samples. The switch 434 selects either the sequence of the inversion-resultant data samples or the sequence of the non-inverted data samples in response to the output signal of the polarity controller 462. For example, the switch 434 selects the sequence of the non-inverted data samples when the output signal of the polarity controller 462 is in its low level state. On the other hand, the switch 434 selects the sequence of the inversion-resultant data samples when the output signal of the polarity controller 462 is in its high level state. The switch 434 passes the selected data sample sequence to the switch 436. The 0-signal generator 435 feeds a signal representative of a value of zero to the switch 436. The switch 436 selects one among a data sample outputted from the switch 434 and the 0-signal outputted from the 0-signal generator 435 in response to the first control signal fed from the error detection timing generator 461. Specifically, when the first control signal is in its high-level state, that is, when a self-running zero-cross timing or a self-running error detection timing has come, the switch 436 selects a data sample outputted from the switch 434 and passes the selected data sample to the switch 44 (see FIG. 25) as a signal indicative of a second phase error. On the other hand, when the first control signal is in its low-level state, the switch 436 selects the 0-signal and passes it to the switch 44 as a signal indicative of a second phase error.

Figure 27:
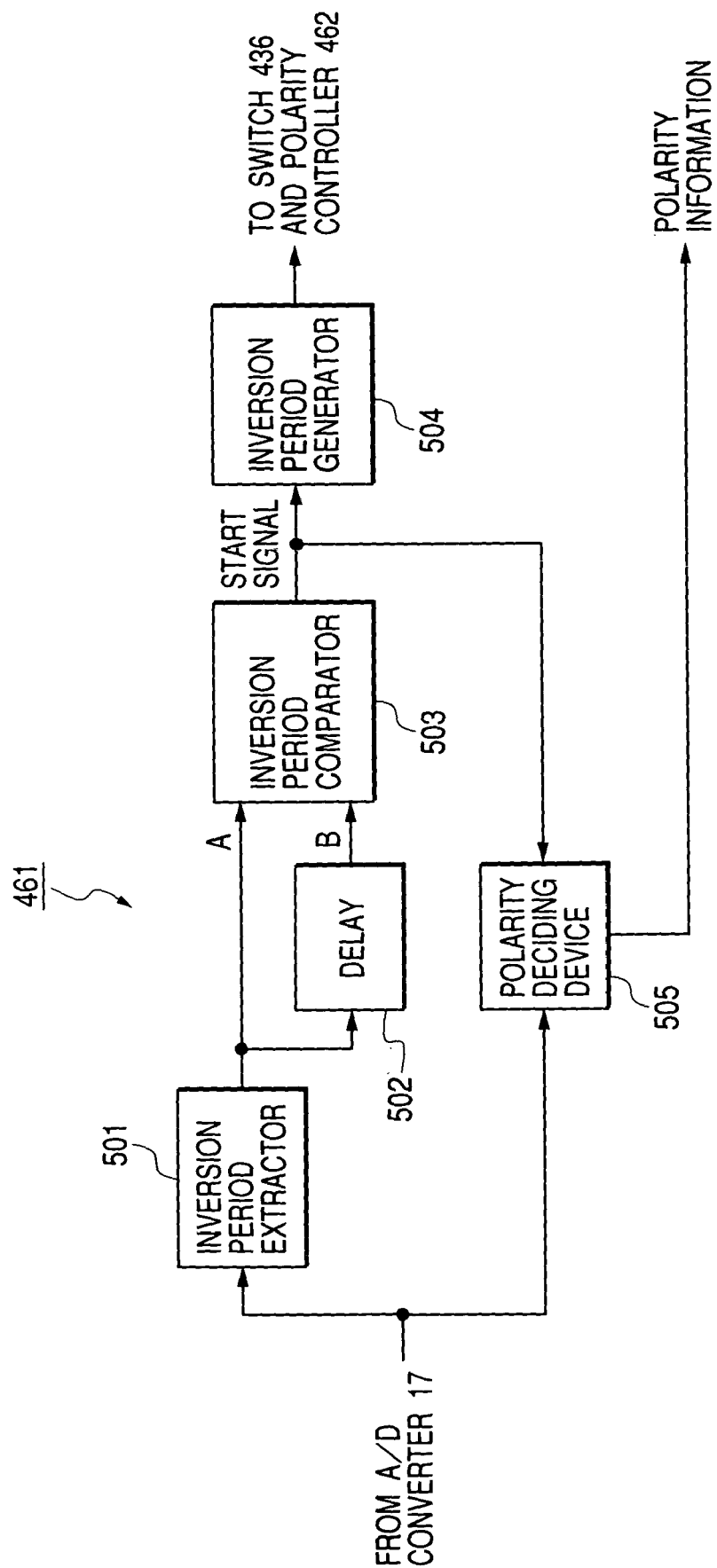
FIG. 27 is a block diagram of an error detection timing generator in FIG. 26.

As shown in FIG. 27, the error detection timing generator 461 includes an inversion period extractor 501, a delay circuit 502, an inversion period comparator 503, an inversion period generator 504, and a polarity deciding device 505 to which operation timings are given by the system clock signal being the bit clock signal outputted from the oscillator 182 (see FIG. 24). The inversion period extractor 501 receives the output signal of the A/D converter 17 (see FIG. 23). The device 501 extracts every inversion period from the output signal of the A/D converter 17. Specifically, the inversion period extractor 501 detects every zero-cross timing of the output signal of the A/D converter 17 (that is, every change in polarity of the output signal of the A/D converter 17). Every time a new zero-cross timing is detected, the inversion period extractor 501 measures the time interval between the new zero-cross timing and the immediately-preceding zero-cross timing by counting pulses in the bit clock signal. The measured time interval is used as the extracted inversion period. The inversion period extractor 501 feeds a signal "A" representative of the extracted inversion period to the delay circuit 502 and the inversion period comparator 503. The inversion period extractor 501 informs the delay circuit 502 of every detected zero-cross timing. The delay circuit 502 defers the inversion period signal "A" by a variable time equal to the time length between a current zero-cross timing and an immediately-preceding zero-cross timing to get a delayed inversion period signal "B". Specifically, the delay circuit 502 samples and holds the inversion period signal "A" at every detected zero-cross timing. Until a next detected zero-cross timing, the delay circuit 502 continues to output the held inversion period signal as the delayed inversion period signal "B". The held inversion period signal is updated at every detected zero-cross timing. The delay circuit 502 feeds the delayed inversion period signal "B" to the inversion period comparator 503.

The device 503 compares the inversion period represented by the non-delayed signal "A" and the inversion period represented by the delayed signal "B" to decide whether or not the two inversion periods satisfy the following relation.

$$A > 2 \cdot B$$

where "A" denotes the inversion period represented by the non-delayed signal "A", and "B" denotes the inversion period represented by the delayed signal "B" and "·" denotes product. When the above-indicated relation is satisfied, that is, when the inversion period represented by the non-delayed signal "A" is greater than twice the inversion period represented by the delayed signal "B", the inversion period comparator 503 outputs a start signal regarding a specified pattern to the inversion period generator 504 and the polarity deciding device 505. Otherwise, the inversion period comparator 503 does not output a start signal. For example, in the case where the inversion period represented by the delayed signal "B" is the last "2T" among a first succession of specified-pattern inversion periods "5T·5T·3T·3T·2T·2T" while the inversion period represented by the non-delayed signal "A" is the first "5T" among a second succession of specified-pattern inversion periods "5T·5T·3T·3T·2T·2T", the above-indicated relation is satisfied so that the inversion period comparator 503 outputs the start signal. Generally, the start signal indicates a head of every specified-pattern repetition interval. The start signal has a waveform such as shown in FIG. 21.

The inversion period generator 504 receives the bit clock signal from the oscillator 182. The inversion period generator 504 derives sample timings (self-running sample timings) from the bit clock signal. For example, the inversion period generator 504 includes a memory storing information about zero-cross timings which correspond to repetition of a succession of specified-pattern inversion periods, for example, "5T·5T·3T·3T·2T·2T" or "2T·2T·3T·3T·5T·5T". When receiving the start signal from the inversion period comparator 503, the inversion period generator 504 begins to select ones among the derived sample timings as self-running error detection timings (self-running zero-cross timings) according to the stored zero-cross timing information. The inversion period generator 504 produces the first control signal in response to the selected sample timings. The first control signal is in a high-level state at each of the selected sample timings. The first control signal is in a low-level state at other timings. The inversion period generator 504 outputs the first control signal to the polarity controller 462 and the switch 436 (see FIG. 26). The polarity deciding device 505 receives the output signal of the A/D converter 17. The polarity deciding device 505 determines the polarity variation aspect of a specified pattern on the basis of the polarity of the output signal of the A/D converter 17 when receiving the start signal from the inversion period comparator 503. The determined polarity variation aspect assigns each of successive elements of the specified pattern (each of successive inversion periods composing the specified pattern) to a polarity depending on whether the element corresponds to a sample-value rising state or a sample-value falling state. The polarity deciding device 505 generates polarity information in response to the determined polarity variation aspect of the specified pattern. The polarity deciding device 505 feeds the generated polarity information to the polarity controller 462 (see FIG. 26).

Figure 28:
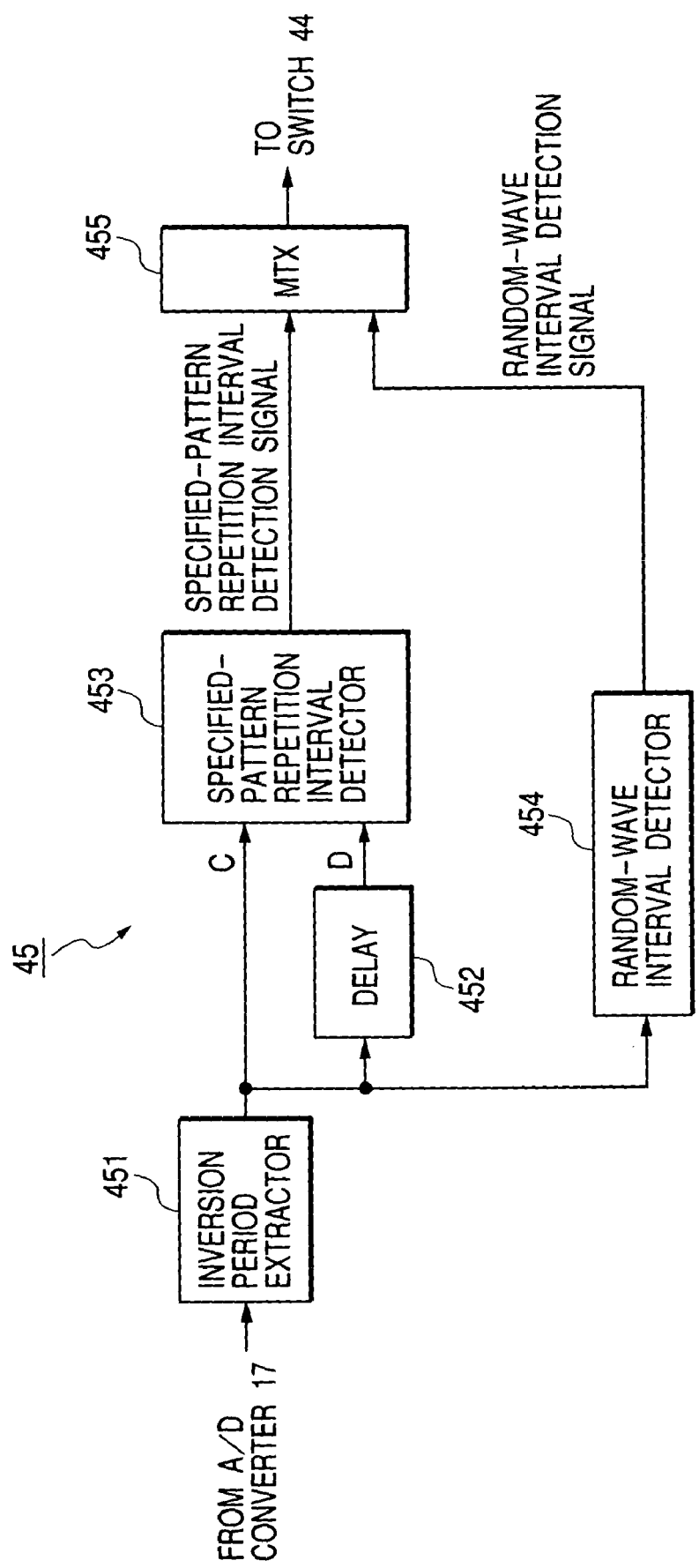
FIG. 28 is a block diagram of a signal condition detector in FIG. 25.

As shown in FIG. 28, the signal condition detector 45 includes an inversion period extractor 451, a delay circuit 452, a specified-pattern-repetition interval detector 453, a random-wave interval detector 454, and a matrix device 455 to which operation timings are given by the system clock signal being the bit clock signal outputted from the oscillator 182 (see FIG. 24). The inversion period extractor 451 receives a sequence of data samples from the A/D converter 17 (see FIG. 23). The inversion period extractor 451 detects every change in polarity (sign) of the received data sample sequence. The inversion period extractor 451 counts pulses in the bit clock signal between the latest polarity change and the immediately preceding polarity change to detect an inversion period Tn for the timing "n" of the latest polarity change, where "n" denotes a serially incremented integer. The detected inversion periods are denoted by T1, T2, T3, . . . , Tn, and the oldest one is indicated by T1 and the latest one is indicated by Tn. The inversion period extractor 451 outputs a signal "C" representative of the detected inversion period Tn to the delay circuit 452, the specified-pattern-repetition interval detector 453, and the random-wave interval detector 454. The delay circuit 452 defers the inversion period signal "C" by a time equal to the duration of a succession of specified-pattern inversion periods (for example, "5T·5T·3T·3T·2T·2T" or "2T·2T·3T·3T·5T·5T") to get a delayed inversion period signal "D". The delay circuit 452 feeds the delayed inversion period signal "D" to the specified-pattern-repetition interval detector 453.

The specified-pattern-repetition interval detector 453 compares the inversion period represented by the non-delayed signal "C" and the inversion period represented by the delayed signal "D" to decide whether or not the two inversion periods satisfy the following relation.

$$D-1 \leq C \leq D+1 \text{ (that is, } D-T \leq C > D+T)$$

where "C" denotes the inversion period represented by the non-delayed signal "C", and "D" denotes the inversion period represented by the delayed signal "D". Furthermore, the specified-pattern-repetition interval detector 453 decides whether or not the above-indicated relation continues to be satisfied at least a prescribed number of times. For example, the specified-pattern-repetition interval detector 453 decides whether or not the above-indicated relation continues to be satisfied for at least a prescribed number of successive data sample timings given by the bit clock signal. In the case where the above-indicated relation continues to be satisfied at least a prescribed number of times, the specified-pattern-repetition interval detector 453 outputs a signal of "1" to the matrix device 455 as an indication that the output signal of the A/D converter 17 is in a specified-pattern repetition interval. Otherwise, the specified-pattern-repetition interval detector 453 outputs a signal of "0" to the matrix device 455 as an indication that the output signal of the A/D converter 17 is not in a specified-pattern repetition interval. Thus, the output signal of the device 453 is a specified-pattern-repetition interval detection signal.

As previously mentioned, a sync signal existing in the head of every random-wave interval has at least one longer-period portion corresponding to an inversion period of 14T or 9T. The characters TTs denote an inversion period of 14T or 9T, that is, the inversion period corresponding to the longer-period portion of the sync signal. The random-wave interval detector 454 has a signal representative of a preset inversion period TTu which is chosen to satisfy the following relation.

$$TTm < TTu \leq TTs$$

where the characters TTm denote the maximum inversion period (5T) among specified-pattern inversion periods of 5T, 3T, and 2T. The random-wave interval detector 454 receives the inversion period signal "C" from the inversion period extractor 451. The random-wave interval detector 454 compares the detected inversion period Tn represented by the inversion period signal "C" with the preset inversion period TTu. When the detected inversion period Tn is equal to or greater than the preset inversion period TTu, the random-wave interval detector 454 outputs a signal of "1" to the matrix device 455. Otherwise, the random-wave interval detector 454 outputs a signal of "0" to the matrix device 455. The output signal of the random-wave interval detector 454 constitutes a random-wave interval detection signal. Specifically, the output signal of the random-wave interval detector 454 which is "1" indicates that the output signal of the A/D converter 17 is in a random-wave interval. On the other hand, the output signal of the random-wave interval detector 454 which is "0" indicates that the output signal of the A/D converter 17 is not in a random-wave interval.

The matrix device 455 executes matrix operation among the specified-pattern-repetition interval detection signal (the output signal of the specified-pattern-repetition interval detector 453), the random-wave interval detection signal (the output signal of the random-wave interval detector 454), and an internally-stored signal to generate a control signal for the switch 44. The matrix device 455 outputs the generated control signal to the switch 44.

Figure 29:
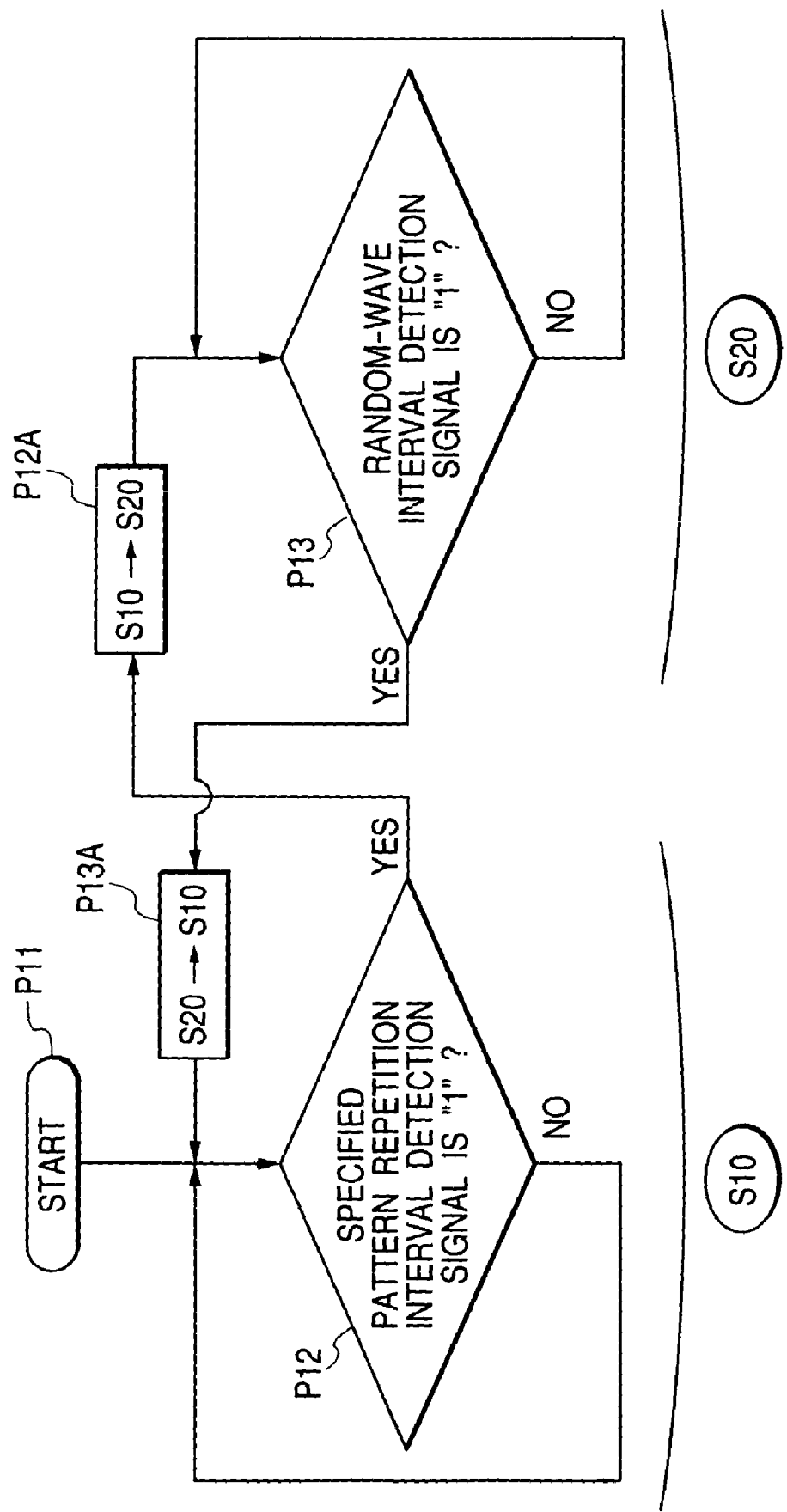
FIG. 29 is a flowchart of a control program for a matrix device in FIG. 28.

The matrix device 455 may include a digital signal processor, a CPU, or a similar device which operates in accordance with a control program stored therein. FIG. 29 is a flowchart of the control program for the matrix device 455. The control program starts from a step P11 which corresponds to the operation state S10 (see FIGS. 21 and 22) of the reproducing apparatus, and which sets the control signal in a state representing that the reproduced signal (the output signal of the A/D converter 17) is in a random-wave interval. The step P11 is followed by a step P12. The step P12 decides whether or not the specified-pattern-repetition interval detection signal is "1". When the step P12 decides that the specified-pattern-repetition interval detection signal is "1", the program advances from the step P12 to a step P12A which changes the control signal to a state representing that the reproduced signal (the output signal of the A/D converter 17) is in a specified-pattern repetition interval. Therefore, the reproducing apparatus changes from the operation state S10 to the operation state S20 (see FIGS. 21 and 22). On the other hand, when it is decided that the specified-pattern-repetition interval detection signal is not "1", the step P12 is repeated. The step P12A is followed by a step P13. The step P13 decides whether or not the random-wave interval detection signal is "1". When the step P13 decides that the random-wave interval detection signal is "1", the program advances from the step P13 to a step P13A which changes the control signal to the state representing that the reproduced signal (the output signal of the A/D converter 17) is in a random-wave interval. Therefore, the reproducing apparatus changes from the operation state S20 to the operation state S10. On the other hand, when it is decided that the random-wave interval detection signal is not "1", the step P13 is repeated. The step P13A is followed by the step P12.

A comparative reproducing apparatus is made by modifying the reproducing apparatus of FIG. 23. Specifically, the comparative reproducing apparatus includes a modified phase detector in a PLL circuit. The switch 44, the signal condition detector 45, and the second phase error detector 46 (see FIG. 25) are omitted from the modified phase detector. Thus, the modified phase detector includes only the first phase error detector 42 which is directly followed by the oscillator 182 (see FIG. 24) or the loop filter.

Figure 30:
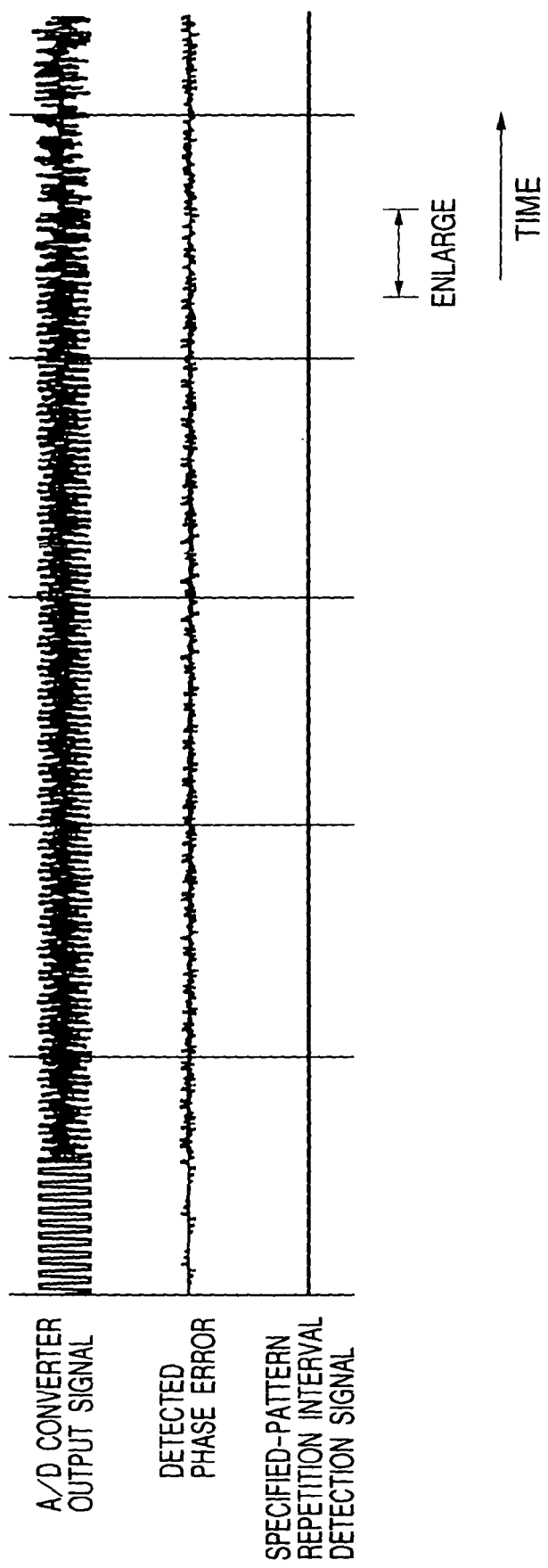
FIG. 30 is a time-domain diagram of an output signal of an A/D converter, a phase error detected by a modified phase detector, and a specified-pattern-repetition interval detection signal which occur in a comparative reproducing apparatus.
Figure 31:
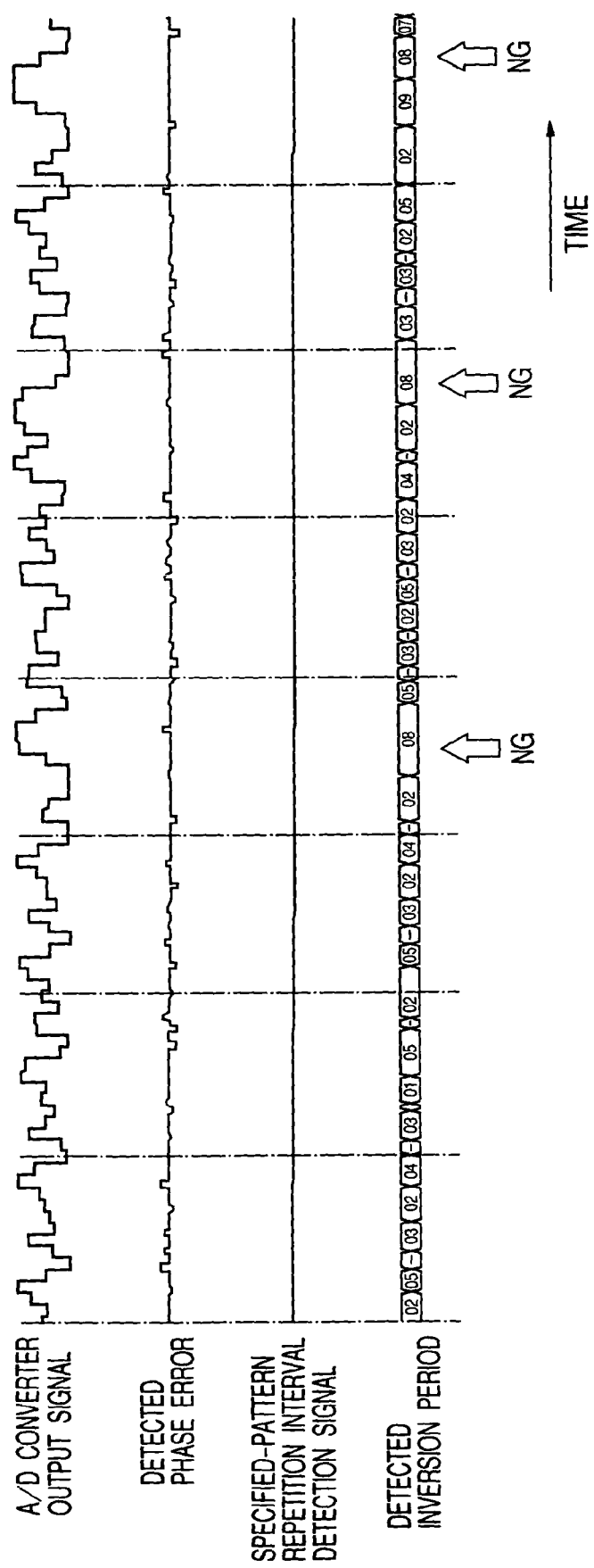
FIG. 31 is an enlarged view of a portion of FIG. 30 which further shows a detected inversion period occurring in the comparative reproducing apparatus.

FIGS. 30 and 31 show the output signal of the A/D converter 17, the phase error detected by the modified phase detector, the specified-pattern-repetition interval detection signal, and the detected inversion period which occur in the comparative reproducing apparatus. In FIGS. 30 and 31, the detected inversion period has errors in both waveform regions above and below zero, and therefore the PLL circuit can not move out of a side locked state (a wrong locked state). As a result, it is difficult to correctly detect the specified-pattern repetition interval in which a succession of inversion periods (for example, "5T·5T·3T·3T·2T·2T" or "2T·2T·3T·3T·5T·5T") repetitively occurs. Also, it is difficult to correctly detect the sync signal which follows the specified-pattern repetition interval, and which has longer-period portions each corresponding to an inversion period of 9T.

Figure 32:
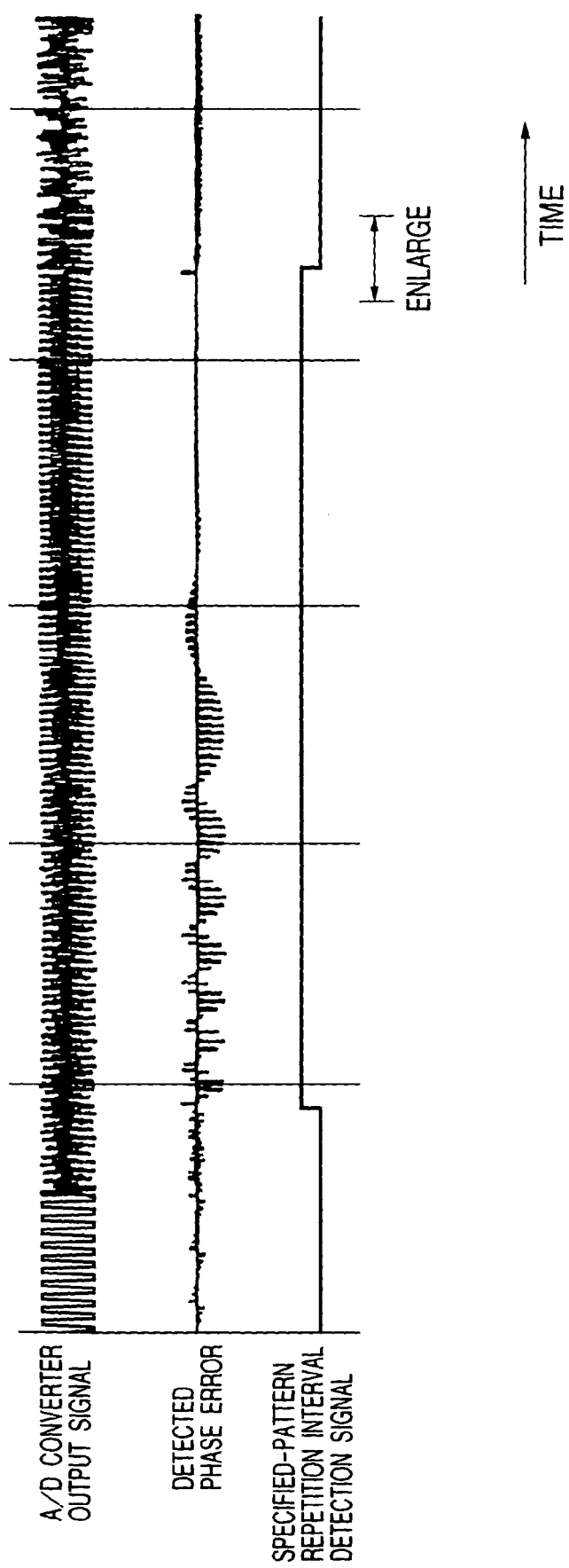
FIG. 32 is a time-domain diagram of an output signal of an A/D converter, a phase error detected by a phase detector, and a specified-pattern-repetition interval detection signal which occur in the reproducing apparatus of FIG. 23.
Figure 33:
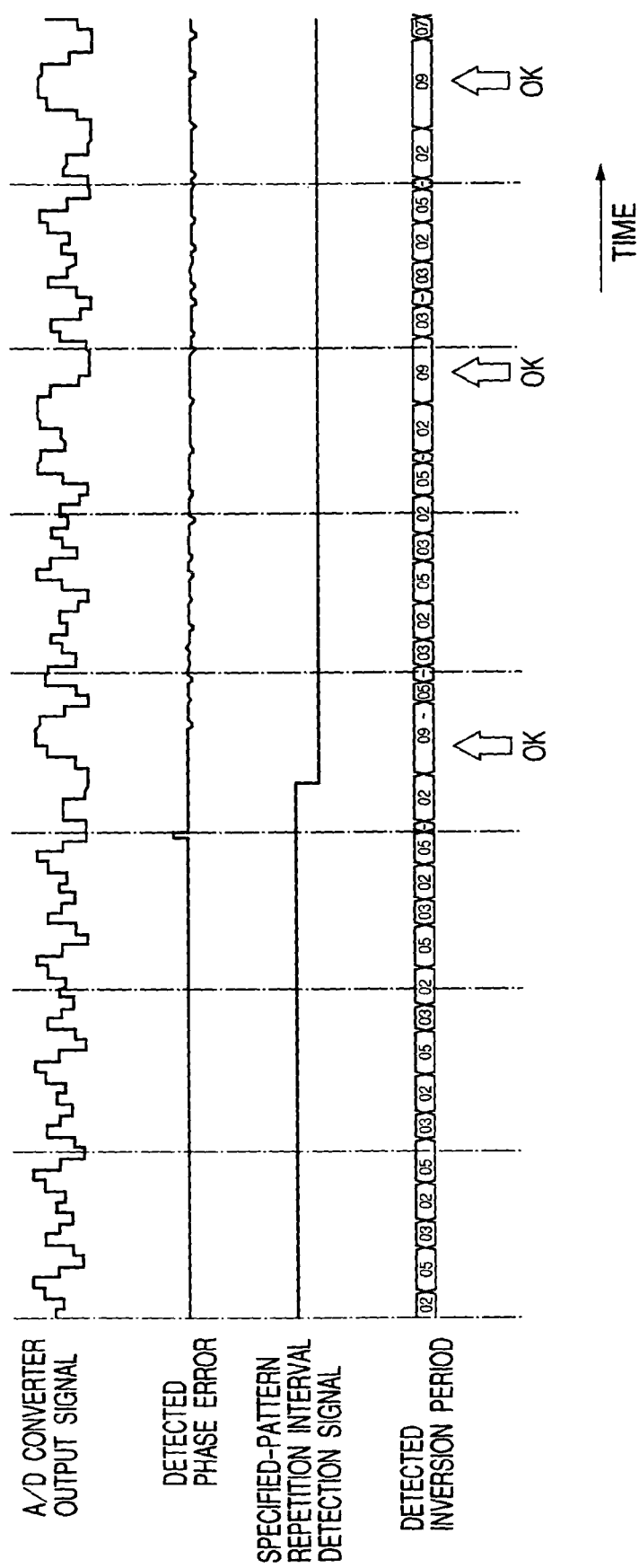
FIG. 33 is an enlarged view of a portion of FIG. 32 which further shows a detected inversion period occurring in the reproducing apparatus of FIG. 23.

FIGS. 32 and 33 show the output signal of the A/D converter 17, the phase error detected by the phase detector 181, the specified-pattern-repetition interval detection signal, and the detected inversion period which occur in the reproducing apparatus of FIG. 23. As previously mentioned, the phase detector 181 decides whether the output signal of the A/D converter 17 is in a specified-pattern repetition interval or a random-wave interval. When it is decided that the output signal of the A/D converter 17 is in a specified-pattern repetition interval, the device 181 detects a phase error on the basis of a self-running timing rather than a zero-cross timing. With reference to FIGS. 32 and 33, the PLL circuit 18 can move out of a side locked state (a wrong locked state). As a result, it is possible to correctly detect the specified-pattern repetition interval in which a succession of inversion periods (for example, "5Te5T·3T·3T*2T·2T" or "2T·2T·3T·3T·5T·5T") repetitively occurs. Also, it is possible to correctly detect the sync signal which follows the specified-pattern repetition interval, and which has longer-period portions each corresponding to an inversion period of 9T.

Third Embodiment

Figure 34:
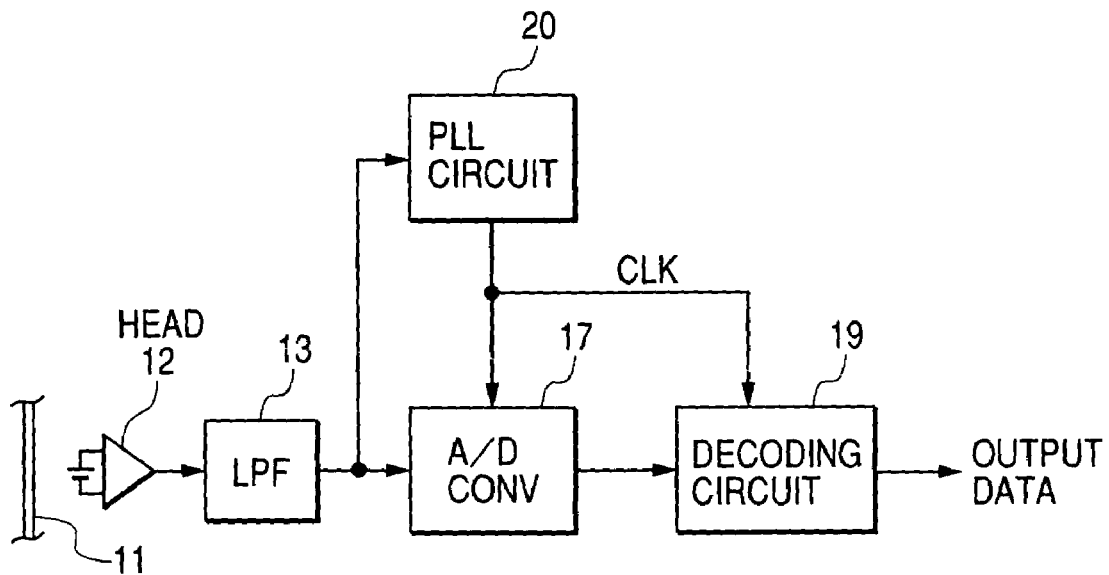
FIG. 34 is a block diagram of a reproducing apparatus according to a third embodiment of this invention.

FIG. 34 shows a reproducing apparatus according to a third embodiment of this invention. The reproducing apparatus of FIG. 34 is similar to that of FIG. 23 except for design changes mentioned hereafter. The reproducing apparatus of FIG. 34 includes a PLL circuit 20 instead of the PLL circuit 18 in FIG. 23.

The PLL circuit 20 is of an analog type. The PLL circuit 20 receives the output signal of a low pass filter 13. The PLL circuit 20 generates a bit clock signal (a system clock signal) in response to the output signal of the low pass filter 13. The PLL circuit 20 feeds the generated bit clock signal to the A/D converter 17 and the decoding circuit 19.

Figure 35:
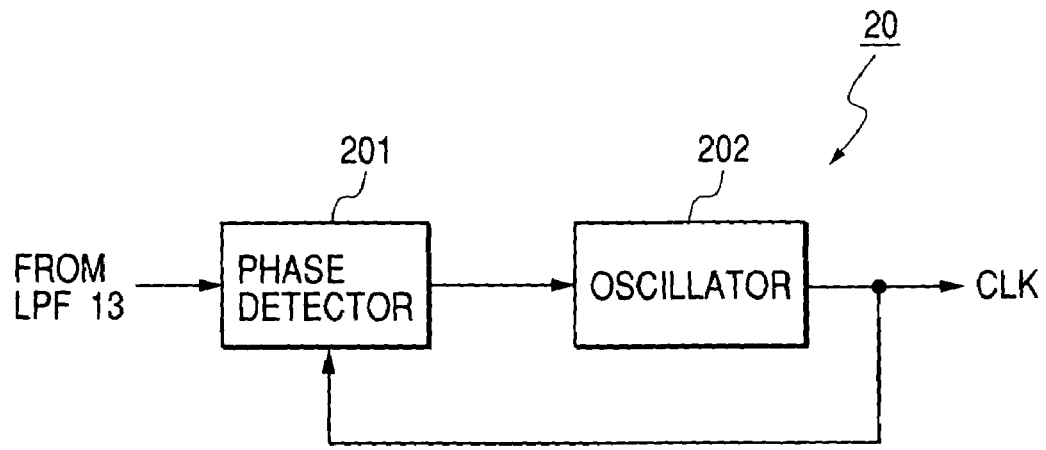
FIG. 35 is a block diagram of a PLL circuit in FIG. 34.

As shown in FIG. 35, the PLL circuit 20 includes a phase detector 201 and an oscillator 202. The phase detector 201 receives the output signal of the low pass filter 13 (see FIG. 34). The phase detector 201 decides whether the output signal of the low pass filter 13 is in a specified-pattern repetition interval or a random-wave interval. The phase detector 201 extracts a phase error in a method depending on whether the output signal of the low pass filter 13 is in a specified-pattern repetition interval or a random-wave interval. The phase detector 201 outputs a signal representative of the extracted phase error to the oscillator 202. The oscillator 202 generates a bit clock signal (a system clock signal) in response to the phase error signal. The oscillator 202 feeds the bit clock signal to the A/D converter 17 and the decoding circuit 19 (see FIG. 34). In addition, the oscillator 202 feeds the bit clock signal back to the phase detector 201. The phase error extracted by the phase detector 201 means the phase error of the output signal of the low pass filter 13 relative to the bit clock signal. The phase detector 201 is controlled by the bit clock signal in the direction of reducing the phase error. Thus, the phase detector 201 and the oscillator 202 compose a PLL loop for generating a bit clock signal (a system clock signal) locked to the output signal of the low pass filter 13. A loop filter (not shown) may be interposed between the phase detector 201 and the oscillator 202. The phase detector 201 is similar in design to the phase detector 181 in FIGS. 24 and 25.

Fourth Embodiment

A fourth embodiment of this invention is similar to the first embodiment thereof except for design changes mentioned hereafter. The fourth embodiment of this invention includes a modified signal condition detector 41 (see FIG. 10).

Upon a change of the control signal for the switch 44 (see FIG. 10) to select the second phase error signal, that is, the output signal of the second phase error detector 43 (see FIG. 10), the modified signal condition detector 41 starts counting pulses of a reference clock signal (for example, a system clock signal). The modified signal condition detector 41 compares the counted pulse number with a predetermined reference number to decide whether or not the counted pulse number reaches the predetermined reference number. In the case where the counted pulse number reaches the predetermined reference number while the switch 44 continues to select the second phase error signal, the modified signal condition detector 41 forcibly changes the control signal for the switch 44 to select the first phase error signal, that is, the output signal of the first phase error detector 42 (see FIG. 10).

Alternatively, the switch 44 may be designed to have similar functions. Specifically, at the beginning of the selection of the second phase error signal, the switch 44 may start counting pulses of the reference clock signal. In this case, the switch 44 decides whether or not the counted pulse number reaches the predetermined reference number. When the counted pulse number reaches the predetermined reference number, the switch 44 selects the first phase error signal instead of the second phase error signal.

The signal condition detector 41 (see FIGS. 10 and 15) may also be modified as follows. The modified signal condition detector 41 includes a comparator for deciding whether or not the inversion period represented by the output signal of the inversion period extractor 411 exceeds a preset period. When the comparator decides that the inversion period exceeds the preset period, the modified signal condition detector 41 forcibly changes the control signal for the switch 44 to select the first phase error signal, that is, the output signal of the first phase error detector 42.

Fifth Embodiment

A fifth embodiment of this invention is similar to the second embodiment thereof (or the third embodiment thereof) except for design changes mentioned hereafter. The fifth embodiment of this invention includes a modified signal condition detector 45 (see FIG. 25).

Upon a change of the control signal for the switch 44 (see FIG. 25) to select the second phase error signal, that is, the output signal of the second phase error detector 46 (see FIG. 25), the modified signal condition detector 45 starts counting pulses of the bit clock signal (the system clock signal). The modified signal condition detector 45 compares the counted pulse number with a predetermined reference number to decide whether or not the counted pulse number reaches the predetermined reference number. In the case where the counted pulse number reaches the predetermined reference number while the switch 44 continues to select the second phase error signal, the modified signal condition detector 45 forcibly changes the control signal for the switch 44 to select the first phase error signal, that is, the output signal of the first phase error detector 42 (see FIG. 25).

Alternatively, the switch 44 may be designed to have similar functions. Specifically, at the beginning of the selection of the second phase error signal, the switch 44 may start counting pulses of the bit clock signal. In this case, the switch 44 decides whether or not the counted pulse number reaches the predetermined reference number. When the counted pulse number reaches the predetermined reference number, the switch 44 selects the first phase error signal instead of the second phase error signal.

Figure 36:
FIG. 36 is a time-domain diagram of an output signal of an A/D converter, a phase error detected by a phase detector, and a specified-pattern-repetition interval detection signal which occur in a fifth embodiment of this invention.
Figure 37:
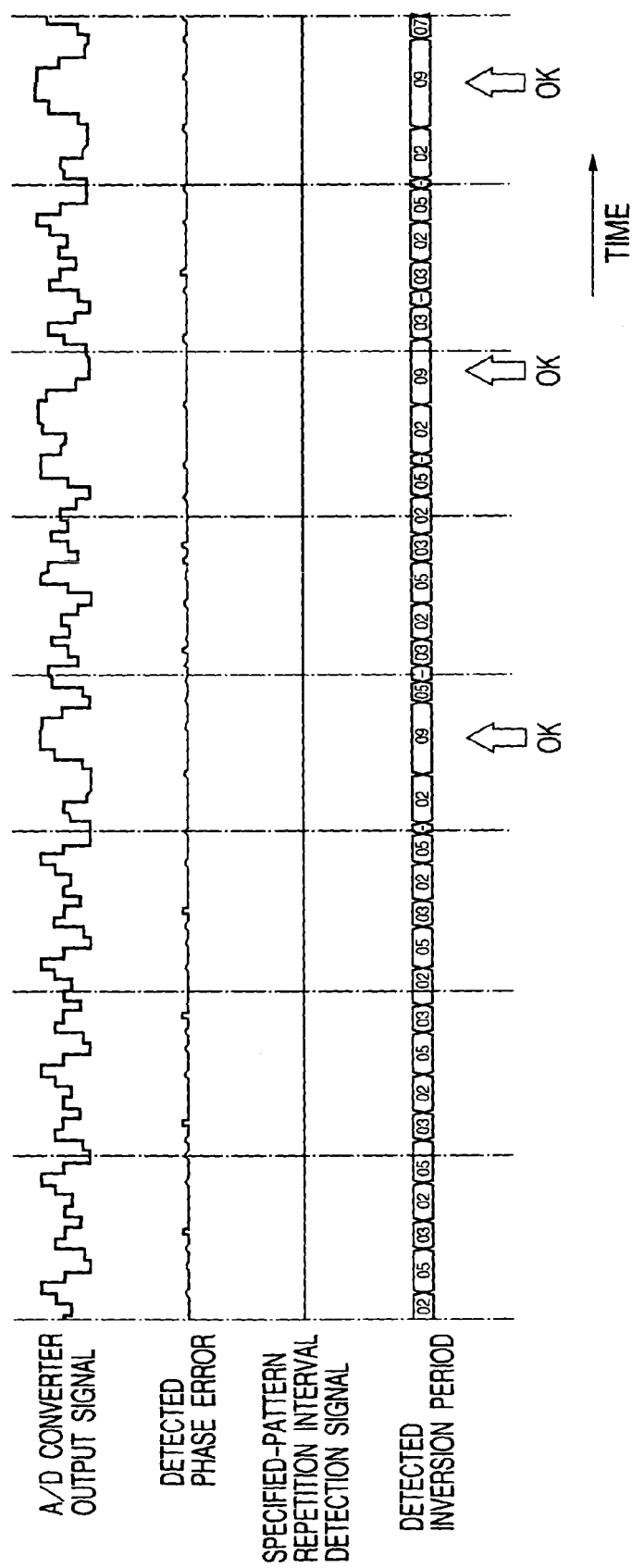
FIG. 37 is an enlarged view of a portion of FIG. 36 which further shows a detected inversion period occurring in the fifth embodiment of this invention.

FIGS. 36 and 37 show the output signal of the A/D converter 17 (see FIG. 23), the phase error detected by the phase detector 181 (see FIG. 24), the specified-pattern-repetition interval detection signal, and the detected inversion period which occur in the fifth embodiment of this invention. The phase detector 181 decides whether the output signal of the A/D converter 17 is in a specified-pattern repetition interval or a random-wave interval. When it is decided that the output signal of the A/D converter 17 is in a specified-pattern repetition interval, the device 181 detects a phase error on the basis of a self-running timing rather than a zero-cross timing. With reference to FIGS. 36 and 37, the PLL circuit 18 (see FIG. 23) can move out of a side locked state (a wrong locked state). As a result, it is possible to correctly detect the specified-pattern repetition interval in which a succession of inversion periods (for example, "5T·5T·3T·3T·2T·2T" or "2T·2T·3T·3T·5T·5T") repetitively occurs. Also, it is possible to correctly detect the sync signal which follows the specified-pattern repetition interval, and which has longer-period portions each corresponding to an inversion period of 9T.

Sixth Embodiment

According to a sixth embodiment of this invention, the signal condition detector 41 in the phase detector 32 of FIG. 10 is replaced by a signal condition detector similar to the signal condition detector 45 in FIG. 25 which can discriminate between a random-wave interval and a specified-pattern repetition interval.

Seventh Embodiment

According to a seventh embodiment of this invention, the signal condition detector 45 in the phase detector 181 of FIGS. 24 and 25 (or the signal condition detector in the phase detector 201 of FIG. 35) is replaced by a signal condition detector similar to the signal condition detector 41 in FIG. 10 which can discriminate between a random-wave interval and a continuous-wave interval.

Eighth Embodiment

An eighth embodiment of this invention is similar to the second embodiment of this invention except for design changes mentioned hereafter. The eighth embodiment of this invention includes a modified specified-pattern-repetition interval detector 453 (see FIG. 28).

The modified specified-pattern-repetition interval detector 453 compares the inversion period represented by the non-delayed signal "C" and the inversion period represented by the delayed signal "D" to decide whether or not the two inversion periods satisfy one of the following relations.

$D-2 \leq C \leq D$ (that is, $D-2T<C<D$)

$D \leq C \leq D+2$ (that is, $D \leq C \leq D+2T$)

where "C" denotes the inversion period represented by the non-delayed signal "C", and "D" denotes the inversion period represented by the delayed signal "D". Furthermore, the modified specified-pattern-repetition interval detector 453 decides whether or not one of the above-indicated relations continues to be satisfied at least a prescribed number of times. For example, the modified specified-pattern-repetition interval detector 453 decides whether or not one of the above-indicated relations continues to be satisfied for at least a prescribed number of successive data sample timings given by the bit clock signal. In the case where one of the above-indicated relations continues to be satisfied at least a prescribed number of times, the modified specified-pattern-repetition interval detector 453 outputs a signal of "1" to the matrix device 455 (see FIG. 28) as an indication that the output signal of the A/D converter 17 (see FIG. 23) is in a specified-pattern repetition interval. Otherwise, the modified specified-pattern-repetition interval detector 453 outputs a signal of "0" to the matrix device 455 as an indication that the output signal of the A/D converter 17 is not in a specified-pattern repetition interval. Thus, the output signal of the modified device 453 is a specified-pattern-repetition interval detection signal. The specified-pattern-repetition interval detection signal being "1" causes the switch 44 (see FIG. 25) to select the second phase error signal.

Ninth Embodiment

A ninth embodiment of this invention is similar to the second embodiment thereof except for design changes mentioned hereafter.

A succession of specified-pattern inversion periods (for example, "5T·5T·3T·3T·2T·2T" or "2T·2T·3T·3T·5T·5T") is repeated a plurality of times during a specified-pattern repetition interval. Specified-pattern inversion periods composing one succession are assigned serial ID numbers 1, 2, . . . , k, . . . respectively, and are denoted by the characters X(1), X(2), . . . , X(k), . . . respectively.

Detected inversion periods successively represented by the output signal "C" of the inversion period extractor 451 (see FIG. 28) are denoted by the characters Z(1), Z(2), . . . , Z(i), . . . respectively.

The ninth embodiment of this invention includes a modified signal condition detector 45 from which the delay circuit 452 (see FIG. 28) is omitted. The modified signal condition detector 45 includes a modified specified-pattern-repetition interval detector 453 (see FIG. 28).

The modified specified-pattern-repetition interval detector 453 contains a memory previously loaded with information about a reference inversion period X(k) which is selected one from the specified-pattern inversion periods X(1), X(2), . . . . The modified specified-pattern-repetition interval detector 453 monitors the inversion period Z(i+k) represented by the output signal "C" of the inversion period extractor 451 and corresponding to the reference inversion period X(k).

The modified specified-pattern-repetition interval detector 453 compares the inversion period Z(i+k) represented by the output signal "C" of the inversion period extractor 451 with the reference inversion period X(k) to decide whether or not the two inversion periods satisfy one of the following relations.

$X(k)-1 \leq Z(i+k) \leq X(k)+1$ (that is, $X(k)-T \leq Z(i+k) \leq X(k)+T$)

$X(k)-2 \leq Z(i+k) \leq X(k)$ (that is, $X(k)-2T \leq Z(i+k) \leq X(k)$)

$X(k) \leq Z(i+k) \leq X(k)+2$ (that is, $X(k) \leq Z(i+k) \leq X(k)+2T$)

Furthermore, the modified specified-pattern-repetition interval detector 453 decides whether or not one of the above-indicated relations continues to be satisfied at least a prescribed number of times. For example, the modified specified-pattern-repetition interval detector 453 decides whether or not one of the above-indicated relations continues to be satisfied for at least a prescribed number of successive data sample timings given by the bit clock signal. In the case where one of the above-indicated relations continues to be satisfied at least a prescribed number of times, the modified specified-pattern-repetition interval detector 453 outputs a signal of "1" to the matrix device 455 (see FIG. 28) as an indication that the output signal of the A/D converter 17 (see FIG. 23) is in a specified-pattern repetition interval. Otherwise, the modified specified-pattern-repetition interval detector 453 outputs a signal of "0" to the matrix device 455 as an indication that the output signal of the A/D converter 17 is not in a specified-pattern repetition interval. Thus, the output signal of the modified device 453 is a specified-pattern-repetition interval detection signal. The specified-pattern-repetition interval detection signal being "1" causes the switch 44 (see FIG. 25) to select the second phase error signal.

Tenth Embodiment

A tenth embodiment of this invention is similar to the second embodiment thereof except for design changes mentioned hereafter.

Detected inversion periods successively represented by the output signal "A" of the inversion period extractor 501 (see FIG. 27) are denoted by the characters Y(1), Y(2), . . . , Y(i), . . . respectively.

The tenth embodiment of this invention includes a modified inversion period comparator 503 (see FIG. 27). The modified device 503 compares the inversion period Y(i+1) represented by the non-delayed signal "A" and the inversion period Y(i) represented by the delayed signal "B" to decide whether or not the two inversion periods satisfy the following relation.

$Y(i) > Y(i+1) \cdot 2$ where the character "·" denotes product. When the above-indicated relation is satisfied, that is, when the inversion period Y(i) represented by the delayed signal "B" is smaller than twice the inversion period Y(i+1) represented by the non-delayed signal "A", the modified inversion period comparator 503 outputs a start signal regarding a specified pattern to the inversion period generator 504 and the polarity deciding device 505 (see FIG. 27). Otherwise, the modified inversion period comparator 503 does not output a start signal. For example, in the case where the inversion period Y(i) represented by the delayed signal "B" is the last "5T" among a first succession of specified-pattern inversion periods "2T·2T·3T·3T·5T·5T" while the inversion period Y(i+1) represented by the non-delayed signal "A" is the first "2T" among a second succession of specified-pattern inversion periods "2T·2T·3T·3T·5T·5T", the above-indicated relation is satisfied so that the modified inversion period comparator 503 outputs the start signal.

Eleventh Embodiment

An eleventh embodiment of this invention is similar to one of the first to tenth embodiments thereof except for design changes mentioned hereafter. In the eleventh embodiment of this invention, a loop gain in the re-sampling DPLL section 15 (see FIG. 8), the PLL circuit 18 (see FIG. 23), or the PLL circuit 20 (see FIG. 34) is changed depending on whether the switch 44 (see FIGS. 10 and 25) selects the first phase error signal or the second phase error signal. Preferably, the loop gain is optimized in accordance with the length of a continuous-wave interval, the length of a specified-pattern repetition interval, the length of a random-wave interval, and the frequency at which a phase error is outputted.

Twelfth Embodiment

A twelfth embodiment of this invention is similar to the second embodiment thereof (or the third embodiment thereof) except for design changes mentioned hereafter.

A succession of specified-pattern inversion periods (for example, "5T·5T·3T·3T·2T·2T" or "2T·2T·3T·3T·5T·5T") is repeated a plurality of times during a specified-pattern repetition interval. Thus, specified-pattern inversion periods composing a succession include longer ones equal to, for example, 5T.

The twelfth embodiment of this invention includes a modified switch 44 and a modified signal condition detector 45 (see FIG. 25). Regarding each succession of specified-pattern inversion periods, the modified signal condition detector 45 discriminates longer inversion periods from other inversion periods. The longer inversion periods mean inversion periods longer than a prescribed period. For example, the longer inversion periods are "5T" among specified-pattern inversion periods of 5T·5T·3T·3T·2T·2T or 2T·2T·3T·3T·5T·5T. The modified signal condition detector 45 informs the modified switch 44 of detected longer inversion periods in a specified-pattern repetition interval. Only during the longer inversion periods in a specified-pattern repetition interval, the switch 44 passes the second phase error signal to the next stage.

The second phase error signal outputted from the switch 44 is accurate and reliable even in the event that the frequency of the bit clock signal generated by the PLL circuit 18 (see FIG. 23) significantly deviates from the correct value.

Thirteenth Embodiment

Figure 38:
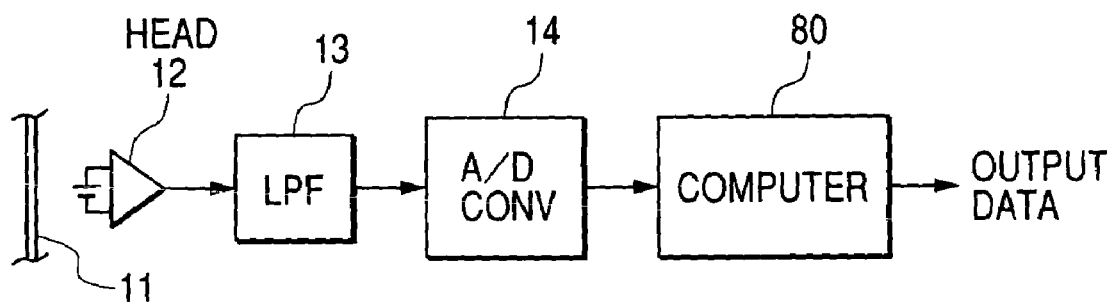
FIG. 38 is a block diagram of a reproducing apparatus according to a thirteenth embodiment of this invention.

FIG. 38 shows a reproducing apparatus according to a thirteenth embodiment of this invention. The reproducing apparatus of FIG. 38 is similar to that of FIG. 8 except for design changes mentioned hereafter. The reproducing apparatus of FIG. 38 includes a computer 80 which replaces the re-sampling DPLL section 15 and the decoding circuit 16 (see FIG. 8). The computer 80 processes the output signal of the A/D converter 14 (see FIG. 8).

The computer 80 operates in accordance with a control program stored in its internal memory. The control program has first and second segments. The first segment of the control program is designed to enable the computer 80 to operate as the re-sampling DPLL section 15. The second segment of the control program is designed to enable the computer 80 to operate as the decoding circuit 16.

Fourteenth Embodiment

Figure 39:
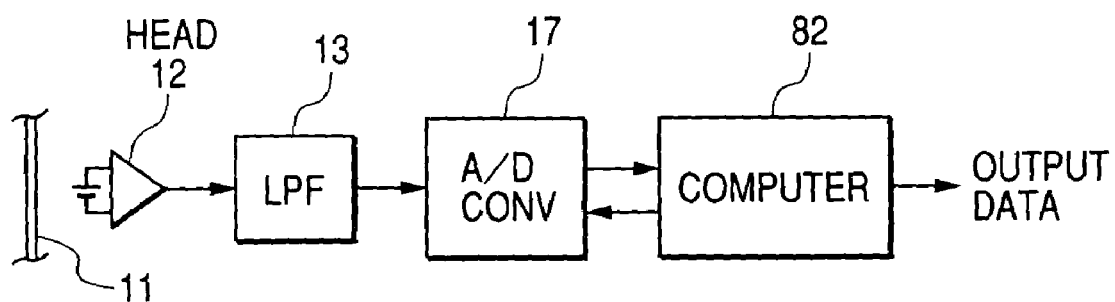
FIG. 39 is a block diagram of a reproducing apparatus according to a fourteenth embodiment of this invention.

FIG. 39 shows a reproducing apparatus according to a fourteenth embodiment of this invention. The reproducing apparatus of FIG. 39 is similar to that of FIG. 23 except for design changes mentioned hereafter. The reproducing apparatus of FIG. 39 includes a computer 82 which replaces the PLL circuit 18 and the decoding circuit 19 (see FIG. 23). The computer 82 processes the output signal of the A/D converter 17 (see FIG. 8) to generate a bit clock signal and to recover original data.

The computer 82 operates in accordance with a control program stored in its internal memory. The control program has first and second segments. The first segment of the control program is designed to enable the computer 82 to operate as the PLL circuit 18. The second segment of the control program is designed to enable the computer 82 to operate as the decoding circuit 19.

Fifteenth Embodiment

Figure 40:
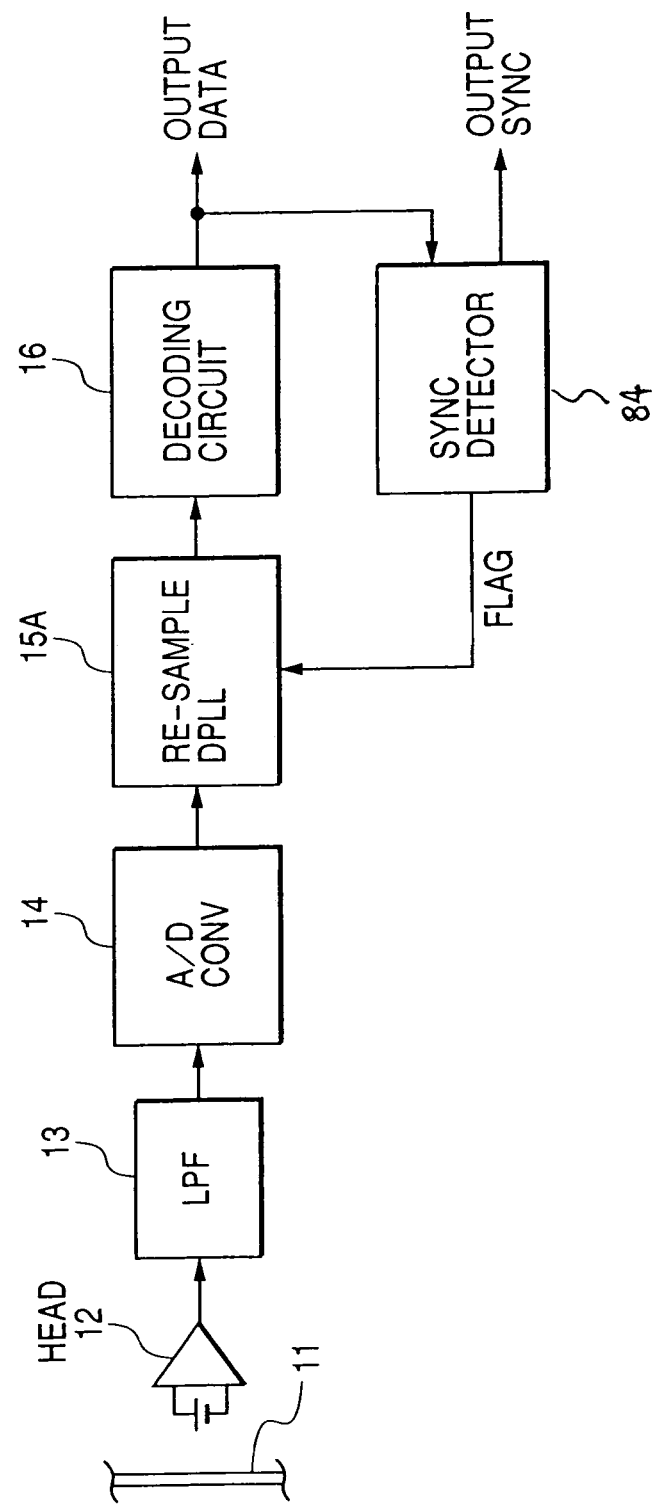
FIG. 40 is a block diagram of a reproducing apparatus according to a fifteenth embodiment of this invention.

FIG. 40 shows a reproducing apparatus according to a fifteenth embodiment of this invention. The reproducing apparatus of FIG. 40 is similar to that of FIG. 8 except for design changes mentioned hereafter. The reproducing apparatus of FIG. 40 includes a re-sampling DPLL section 15A instead of the re-sampling DPLL section 15 (see FIG. 8). The reproducing apparatus of FIG. 40 includes a sync detector 84.

The sync detector 84 receives recovered data from the decoding circuit 16. The sync detector 84 senses a sync signal in the recovered data. The sync detector 84 outputs the sensed sync signal to a next stage (not shown). In addition, the sync detector 84 decides whether or not a sync signal regularly appears in the recovered data without being skipped. In other words, the sync detector 84 decides whether or not a succession of sync signals is correctly recovered. When it is decided that a sync signal regularly appears in the recovered data without being skipped, that is, when a succession of sync signals is correctly recovered, the sync detector 84 outputs a signal of "1" to the re-sampling DPLL section 15A. Otherwise, the sync detector 84 outputs a signal of "0" to the re-sampling DPLL section 15A.

Figure 41:
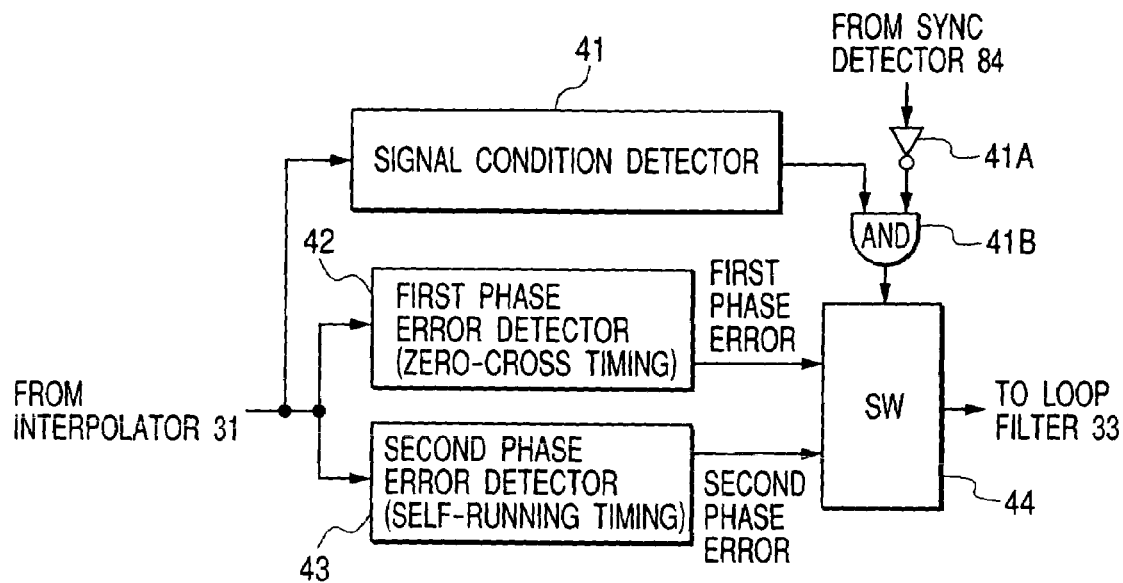
FIG. 41 is a block diagram of a phase detector in a re-sampling DPLL section in FIG. 40.

As shown in FIG. 41, a phase detector in the re-sampling DPLL section 15A includes an inverter 41A and an AND circuit 41B. A first input terminal of the AND circuit 41B receives the output signal of the signal condition detector 41. The output signal of the sync detector 84 is applied via the inverter 41A to a second input terminal of the AND circuit 41B. The output terminal of the AND circuit 41B is connected to the switch 44.

When the output signal of the sync detector 84 is "1", that is, when a sync signal regularly appears in the recovered data without being skipped, the inverter 41A outputs a signal of "0" to the AND circuit 41B so that the AND circuit 41B is closed. In this case, the AND circuit 41B feeds a control signal of "0" to the switch 44 independently of the state of the output signal of the signal condition detector 41, and therefore the switch 44 always selects the first phase error signal. Thus, in this case, the first phase error signal is used even when the output signal of the signal condition detector 41 represents that the reproduced signal is in a continuous-wave interval. Accordingly, change from the first phase error signal to the second phase error signal is disabled. This procedure is effective in preventing the occurrence of wrong operation of the reproducing apparatus.

When the output signal of the sync detector 84 is "0", that is, when a sync signal does not regularly appear in the recovered data, the inverter 41A outputs a signal of "1" to the AND circuit 41B so that the AND circuit 41B is opened.

In this case, the AND circuit 41B passes the output signal of the signal condition detector 41 to the switch 44. Thus, in this case, the switch 44 selects one of the first phase error signal and the second phase error signal in response to the output signal of the signal condition detector 41. Specifically, the switch 44 selects the first phase error signal when the output signal of the signal condition detector 41 represents that the reproduced signal is in a random-wave interval. The switch 44 selects the second phase error signal when the output signal of the signal condition detector 41 represents that the reproduced signal is in a continuous-wave interval. Accordingly, change from the first phase error signal to the second phase error signal is enabled.

Figure 42:
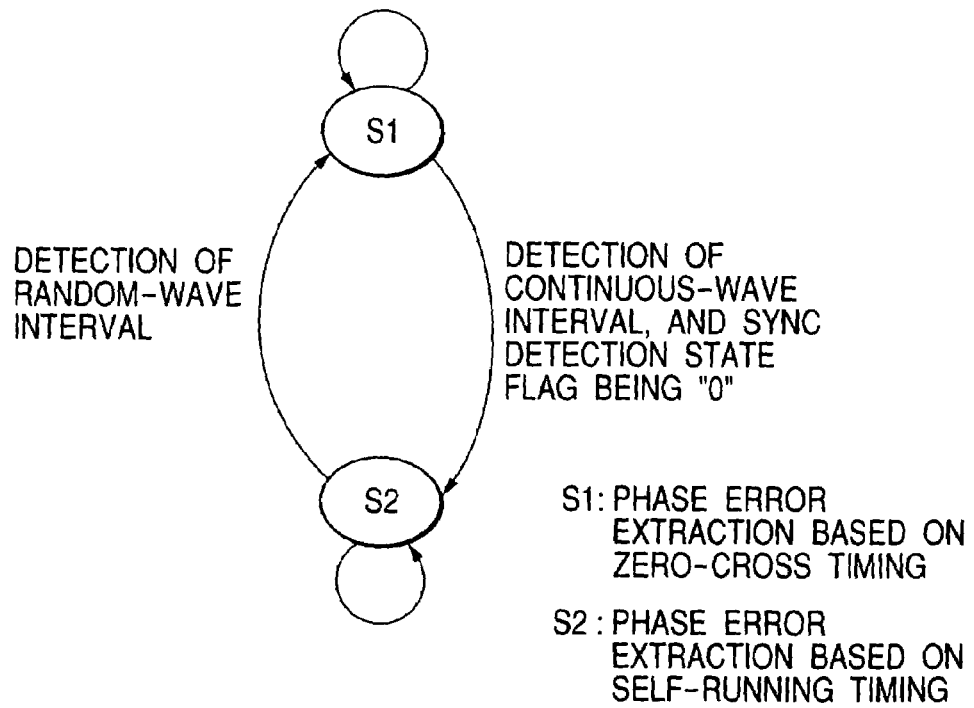
FIG. 42 is a diagram of transitions between different operation states of the reproducing apparatus in FIG. 40.

FIG. 42 shows transitions between the operation states S1 and S2 of the reproducing apparatus of FIG. 40. When the reproducing apparatus is in the operation state S1, the method of extracting a phase error is based on a zero-cross timing. When the reproducing apparatus is in the operation state S2, the method of extracting a phase error is based on a self-running timing. The output signal of the sync detector 84 is defined as a sync detection state flag. The sync detection state flag being "1" indicates that a sync signal is regularly detected without being skipped. The sync detection state flag being "0" indicates that a sync signal fails to be regularly detected. In the case where the sync detection state flag is "0", the reproducing apparatus transitions from the operation state S1 to the operation state S2 when a continuous-wave interval is detected. On the other hand, in the case where the sync detection state flag is "1", the reproducing apparatus remains in the operation state S1 even when a continuous-wave interval is detected. The reproducing apparatus changes to or remains in the operation state S1 when a random-wave interval is detected.

Sixteenth Embodiment

Figure 43:
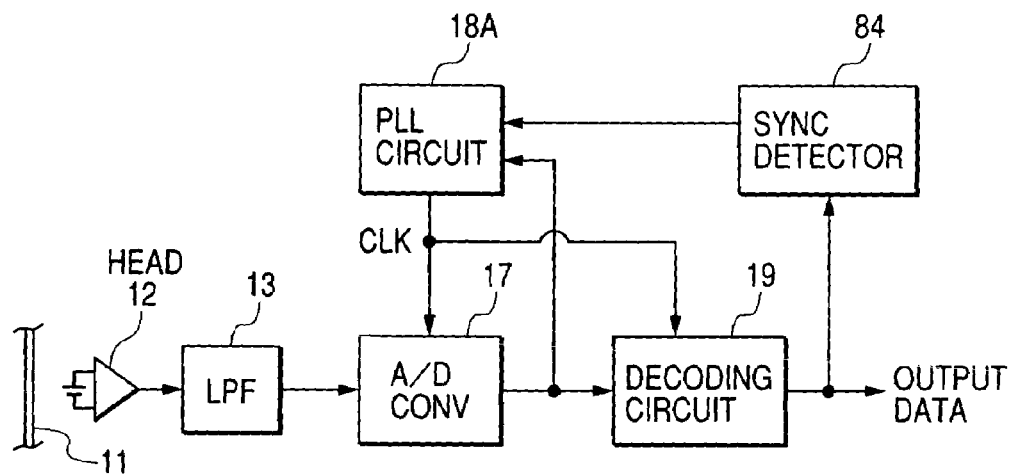
FIG. 43 is a block diagram of a reproducing apparatus according to a sixteenth embodiment of this invention.

FIG. 43 shows a reproducing apparatus according to a sixteenth embodiment of this invention. The reproducing apparatus of FIG. 43 is similar to that of FIG. 23 except for design changes mentioned hereafter. The reproducing apparatus of FIG. 43 includes a PLL circuit 18A instead of the PLL circuit 18 (see FIG. 23). The reproducing apparatus of FIG. 43 includes a sync detector 84 similar to that in FIG. 40.

The sync detector 84 processes recovered data fed from the decoding circuit 19. When a sync signal regularly appears in the recovered data without being skipped, the sync detector 84 outputs a signal of "1" to the PLL circuit 18A. Otherwise, the sync detector 84 outputs a signal of "0" to the PLL circuit 18A.

Figure 44:
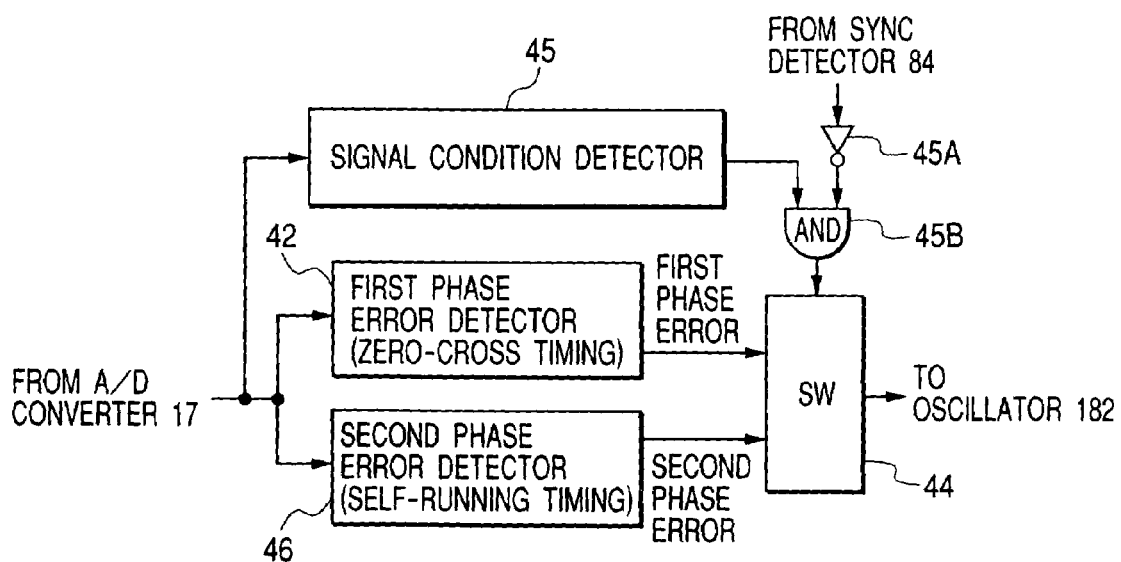
FIG. 44 is a block diagram of a phase detector in a PLL circuit in FIG. 43.

As shown in FIG. 44, a phase detector in the PLL circuit 18A includes an inverter 45A and an AND circuit 45B. A first input terminal of the AND circuit 45B receives the output signal of the signal condition detector 45. The output signal of the sync detector 84 is applied via the inverter 45A to a second input terminal of the AND circuit 45B. The output terminal of the AND circuit 45B is connected to the switch 44.

When the output signal of the sync detector 84 is "1", that is, when a sync signal regularly appears in the recovered data without being skipped, the inverter 45A outputs a signal of "0" to the AND circuit 45B so that the AND circuit 45B is closed. In this case, the AND circuit 45B feeds a control signal of "0" to the switch 44 independently of the state of the output signal of the signal condition detector 45, and therefore the switch 44 always selects the first phase error signal. Thus, in this case, the first phase error signal is used even when the output signal of the signal condition detector 45 represents that the reproduced signal is in a specified-pattern repetition interval. Accordingly, change from the first phase error signal to the second phase error signal is disabled. This procedure is effective in preventing the occurrence of wrong operation of the reproducing apparatus.

When the output signal of the sync detector 84 is "0", that is, when a sync signal does not regularly appear in the recovered data, the inverter 45A outputs a signal of "1" to the AND circuit 45B so that the AND circuit 45B is opened. In this case, the AND circuit 45B passes the output signal of the signal condition detector 45 to the switch 44. Thus, in this case, the switch 44 selects one of the first phase error signal and the second phase error signal in response to the output signal of the signal condition detector 45. Specifically, the switch 44 selects the first phase error signal when the output signal of the signal condition detector 45 represents that the reproduced signal is in a random-wave interval. The switch 44 selects the second phase error signal when the output signal of the signal condition detector 45 represents that the reproduced signal is in a specified-pattern repetition interval. Accordingly, change from the first phase error signal to the second phase error signal is enabled.

Figure 45:
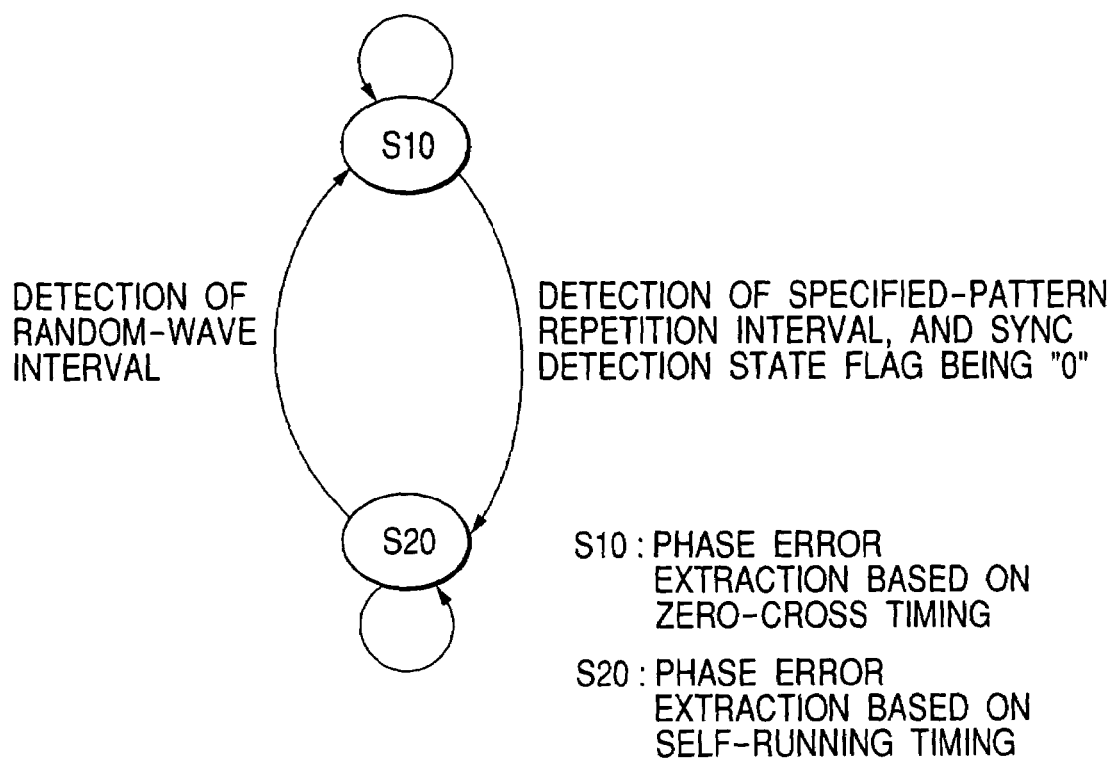
FIG. 45 is a diagram of transitions between different operation states of the reproducing apparatus in FIG. 43.

FIG. 45 shows transitions between the operation states S10 and S20 of the reproducing apparatus of FIG. 43. When the reproducing apparatus is in the operation state S10, the method of extracting a phase error is based on a zero-cross timing. When the reproducing apparatus is in the operation state S20, the method of extracting a phase error is based on a self-running timing. The output signal of the sync detector 84 is defined as a sync detection state flag. The sync detection state flag being "1" indicates that a sync signal is regularly detected without being skipped. The sync detection state flag being "0" indicates that a sync signal fails to be regularly detected. In the case where the sync detection state flag is "0", the reproducing apparatus transitions from the operation state S10 to the operation state S20 when a specified-pattern repetition interval is detected. On the other hand, in the case where the sync detection state flag is "1", the reproducing apparatus remains in the operation state S10 even when a specified-pattern repetition interval is detected. The reproducing apparatus changes to or remains in the operation state S10 when a random-wave interval is detected.

Seventeenth Embodiment

Figure 46:
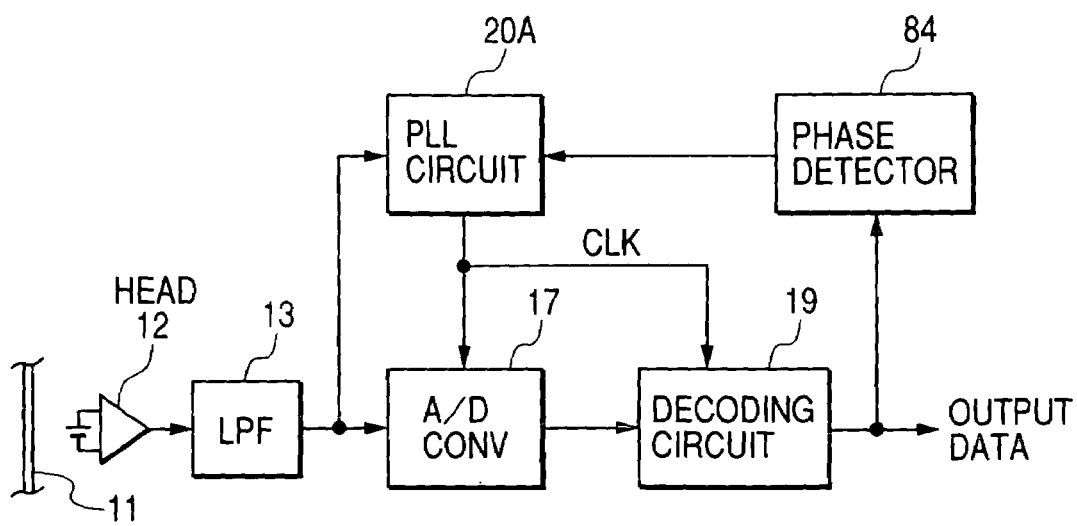
FIG. 46 is a block diagram of a reproducing apparatus according to a seventeenth embodiment of this invention.

FIG. 46 shows a reproducing apparatus according to a seventeenth embodiment of this invention. The reproducing apparatus of FIG. 46 is similar to that of FIG. 34 except for design changes mentioned hereafter. The reproducing apparatus of FIG. 46 includes a PLL circuit 20A instead of the PLL circuit 20 (see FIG. 34). The reproducing apparatus of FIG. 46 includes a sync detector 84 similar to that in FIG. 43.

The PLL circuit 20A is basically similar in structure to the PLL circuit 18A of FIGS. 43 and 44. The PLL circuit 20A responds to the output signal of the sync detector 84 as the PLL circuit 18A does.

Advantages Provided by the Invention

When a continuous-wave interval is detected, the re-sampling DPLL section 15 transitions to a state where frequency and phase locking action is performed in response to a second phase error generated on the basis of a self-running timing. Therefore, the re-sampling DPLL section 15 can quickly lock on a correct frequency and a correct phase during the reproduction of a continuous-wave-corresponding signal.

When a specified-pattern repetition interval is detected, the PLL circuit 18 or 20 transitions to a state where frequency and phase locking action is performed in response to a second phase error generated on the basis of a self-running timing. Therefore, the PLL circuit 18 or 20 can reliably lock on a correct frequency and a correct phase during the reproduction of a specified-pattern-repetition-corresponding signal. The reliable lock makes it possible to accurately recover original user data.

What is claimed is:

1. A reproducing apparatus comprising:

first means for reproducing a signal representative of digital information from a recording medium;

second means for sampling the signal reproduced by the first means in response to a clock signal to generate a sampling-resultant signal;

third means for subjecting the sampling-resultant signal to a re-sampling process and an interpolation process responsive to timing information to generate a re-sampling-resultant signal;

fourth means for deciding whether the re-sampling-resultant signal is in a continuous-wave interval where an inversion period of the re-sampling-resultant signal remains constant or in a random-wave interval where the inversion period of the re-sampling-resultant signal varies at random;

fifth means for extracting a first value of the re-sampling-resultant signal at a time point corresponding to every zero-cross timing, for controlling a polarity of the extracted first value in response to whether the re-sampling-resultant signal is rising or falling in value to generate a polarity-control-resultant value, and for generating a first phase error in response to the polarity-control-resultant value;

sixth means for repetitively extracting a second value of the re-sampling-resultant signal at a constant period corresponding to a normal inversion period occurring during the continuous-wave interval, for alternately changing a polarity of the extracted second value between positive and negative to generate a polarity-change-resultant value, and for generating a second phase error in response to the polarity-change-resultant value;

seventh means for selecting the first phase error generated by the fifth means when the fourth means decides that the re-sampling-resultant signal is in a random-wave interval, and for selecting the second phase error generated by the sixth means when the fourth means decides that the re-sampling-resultant signal is in a continuous-wave interval;

a loop filter for integrating the phase error selected by the seventh means to generate a phase-error integration result; and eighth means for generating the timing information in response to the phase-error integration result generated by the loop filter.

2. A reproducing apparatus as recited in claim 1, wherein the fourth means comprises:

means for deciding whether or not a latest inversion period Y of the re-sampling-resultant signal satisfies one of relations as follows:

$X-1 \leq Y \leq X+1$ $X-2 \leq Y \leq X$ $X \leq Y \leq X+2$ where X denotes the normal inversion period occurring in the continuous-wave interval;

means for deciding whether or not the latest inversion period Y consecutively satisfies one of the relations a prescribed number of times; and means for deciding that the re-sampling-resultant signal is in a continuous-wave interval when the latest inversion period Y consecutively satisfies one of the relations the prescribed number of times.

3. A reproducing apparatus as recited in claim 1, wherein the fourth means comprises:

means for detecting a latest period Z for which the re-sampling-resultant signal either rises or falls;

means for deciding whether or not the latest period Z satisfies one of relations as follows:

$2X-1 \leq Z \leq 2X+1$ $2X-2 \leq Z \leq 2X$ $2X \leq Z \leq 2X+2$ where X denotes the normal inversion period occurring in the continuous-wave interval;

means for deciding whether or not the latest period Z consecutively satisfies one of the relations a prescribed number of times; and means for deciding that the re-sampling-resultant signal is in a continuous-wave interval when the latest period Z consecutively satisfies one of the relations the prescribed number of times.

4. A reproducing apparatus as recited in claim 1, wherein the fourth means comprises:

means for deciding whether or not a latest inversion period of the re-sampling-resultant signal exceeds a preset period; and means for controlling the seventh means to select the first phase error when it is decided that the latest inversion period of the re-sampling-resultant signal exceeds the preset period.

5. A reproducing apparatus as redited in claim 1, wherein the third means, the fifth means, the sixth means, the seventh means, the loop filter, and the eighth means compose a feedback loop, and further comprising means for changing a loop gain of the feedback loop in response to which of the first phase error and the second phase error is selected by the seventh means.

6. A reproducing apparatus as redited in claim 1, wherein the seventh means comprises:

means for measuring a time interval for which the second phase error remains selected; and means for selecting the first phase error instead of the second phase error when the measured time interval reaches a predetermined time value.

7. A reproducing apparatus as recited in claim 1, further comprising:

ninth means for recovering the digital information from the re-sampling-resultant signal;

tenth means for deciding whether or not a sync signal regularly appears in the recovered digital information; and eleventh means for forcing the seventh means to select the first phase error when the tenth means decides that a sync signal regularly appears in the recovered digital information.

* * * * *